United States Patent
Imamura et al.

(10) Patent No.: US 8,693,592 B2
(45) Date of Patent: Apr. 8, 2014

(54) RECEIVING DEVICE AND RECEIVING METHOD

(75) Inventors: Koji Imamura, Eindhoven (NL); Naganori Shirakata, Osaka (JP); Shuya Hosokawa, Osaka (JP); Kenji Miyanaga, Osaka (JP)

(73) Assignee: Panasonic Corporation, Osaka (JP)

( * ) Notice: Subject to any disclaimer, the term of this patent is extended or adjusted under 35 U.S.C. 154(b) by 613 days.

(21) Appl. No.: 12/597,571

(22) PCT Filed: Mar. 10, 2008

(86) PCT No.: PCT/JP2008/000516
§ 371 (c)(1),
(2), (4) Date: Oct. 26, 2009

(87) PCT Pub. No.: WO2008/139672
PCT Pub. Date: Nov. 20, 2008

(65) Prior Publication Data
US 2010/0128826 A1    May 27, 2010

(30) Foreign Application Priority Data

Apr. 27, 2007  (JP) ................................ 2007-118668
Apr. 27, 2007  (JP) ................................ 2007-118669

(51) Int. Cl.
*H04L 27/06*    (2006.01)

(52) U.S. Cl.
USPC ....................................................... 375/345

(58) Field of Classification Search
USPC .......... 370/343; 375/260, 299, 316, 343, 344, 375/345, 346, 347, 354, 222; 455/127.2, 455/234.1
See application file for complete search history.

(56) References Cited

U.S. PATENT DOCUMENTS

| | | | |
|---|---|---|---|
| 6,363,127 B1 * | 3/2002 | Heinonen et al. ............ | 375/345 |
| 6,748,200 B1 | 6/2004 | Webster et al. | |
| 7,508,782 B2 | 3/2009 | Morimoto | |

(Continued)

FOREIGN PATENT DOCUMENTS

| | | |
|---|---|---|
| CN | 1762115 A | 4/2006 |
| EP | 1 548 958 | 6/2005 |

(Continued)

OTHER PUBLICATIONS

Supplementary European Search Report issued Dec. 29, 2011 in European Patent Application No. EP 08 72 0402.

(Continued)

*Primary Examiner* — Sam K Ahn
*Assistant Examiner* — Shawkat M Ali
(74) *Attorney, Agent, or Firm* — Wenderoth, Lind & Ponack, L.L.P.

(57) ABSTRACT

An AGC unit starts a gain control of the variable gain amplifying unit when a bit saturation occurs in the digital baseband signal output from the A/D converting unit, and starts a gain control of the variable gain amplifying unit when a detection of STS from the digital baseband signal output from the A/D converting unit is started. The AGC unit performs the gain control of the variable gain amplifying unit once when the detection of STS is started, and performs the gain control of the variable gain amplifying unit twice when the bit saturation occurs, namely a larger number of times than when the detection of STS is started.

14 Claims, 42 Drawing Sheets

(56) References Cited

U.S. PATENT DOCUMENTS

| | | |
|---|---|---|
| 2004/0037378 A1 | 2/2004 | Komori et al. |
| 2004/0235439 A1* | 11/2004 | Husted et al. ............... 455/136 |
| 2005/0163081 A1* | 7/2005 | Aoki et al. .................. 370/334 |
| 2005/0190711 A1 | 9/2005 | Morimoto |
| 2006/0052070 A1* | 3/2006 | Jin et al. ................... 455/127.2 |
| 2006/0056530 A1 | 3/2006 | Nakao |

FOREIGN PATENT DOCUMENTS

| | | |
|---|---|---|
| JP | 7-38358 | 2/1995 |
| JP | 2002-314356 | 10/2002 |
| JP | 2003-8676 | 1/2003 |
| JP | 2004-104277 | 4/2004 |
| JP | 3599001 | 9/2004 |
| JP | 2005-244604 | 9/2005 |
| JP | 3754441 | 12/2005 |
| WO | 03/094345 | 11/2003 |
| WO | 2004/077847 | 9/2004 |

OTHER PUBLICATIONS

International Search Report issued Jun. 17, 2008 in International (PCT) Application No. PCT/JP2008/000516.

* cited by examiner

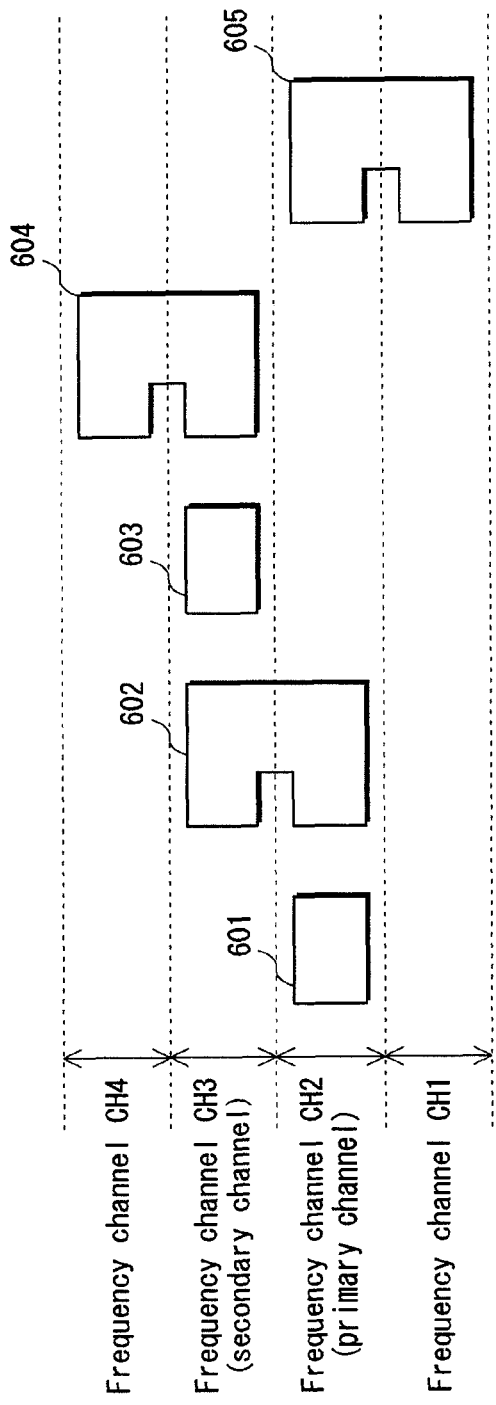

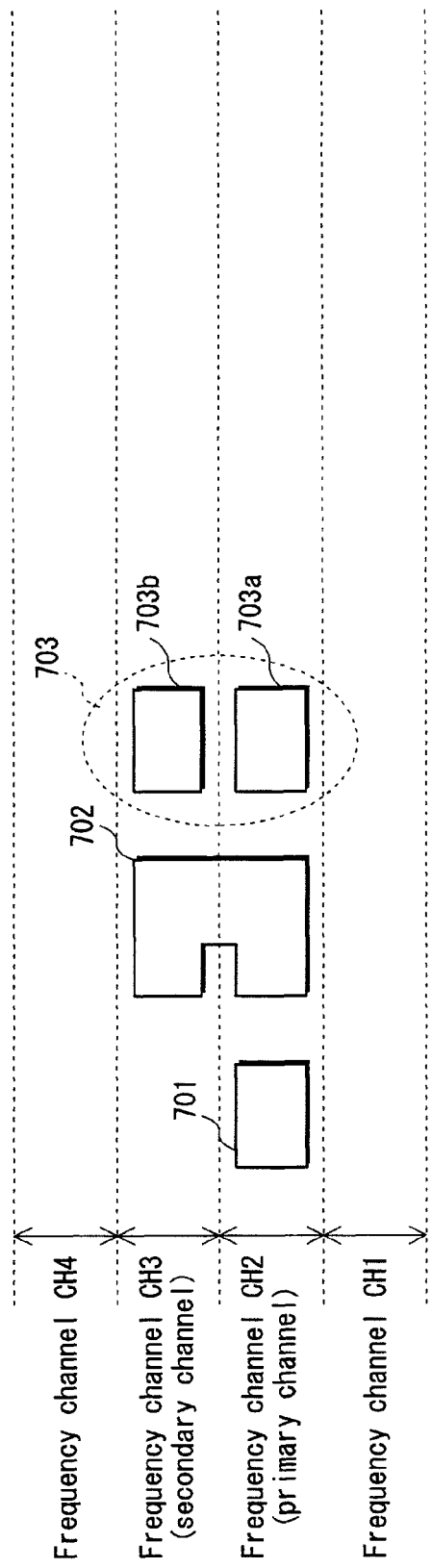

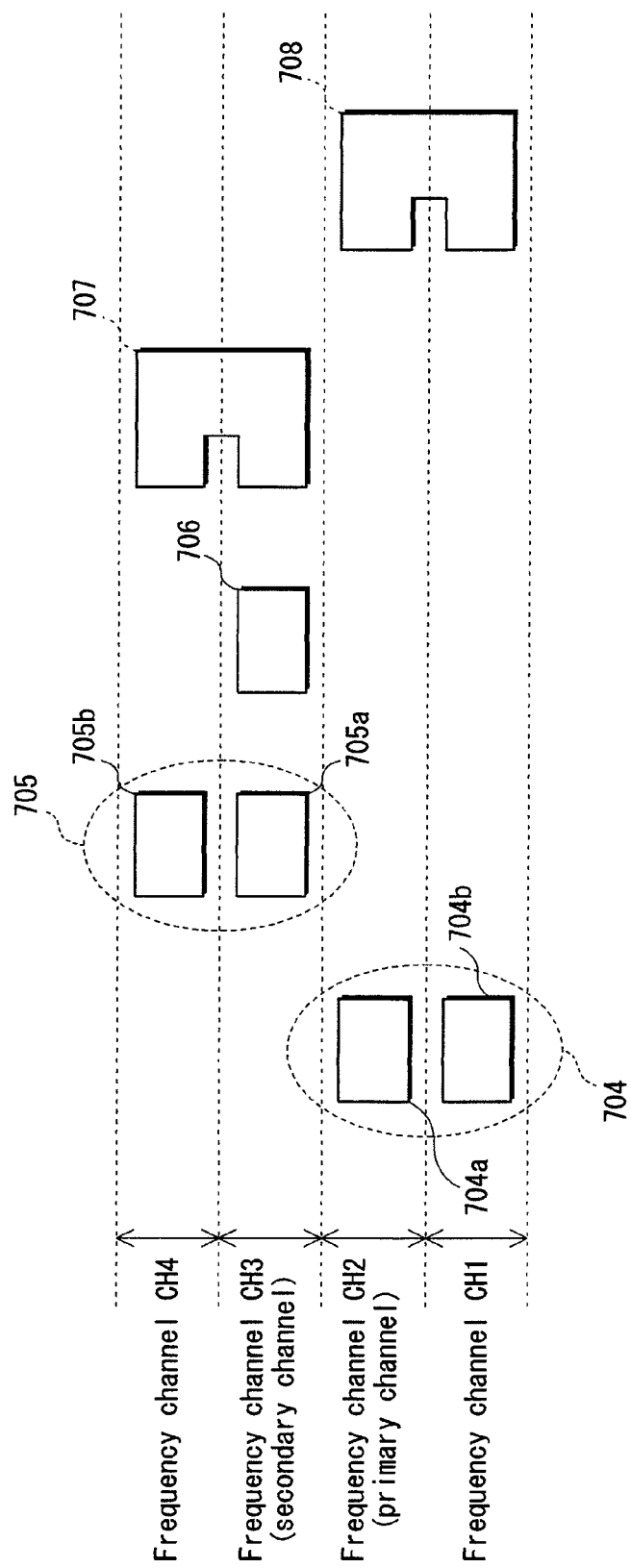

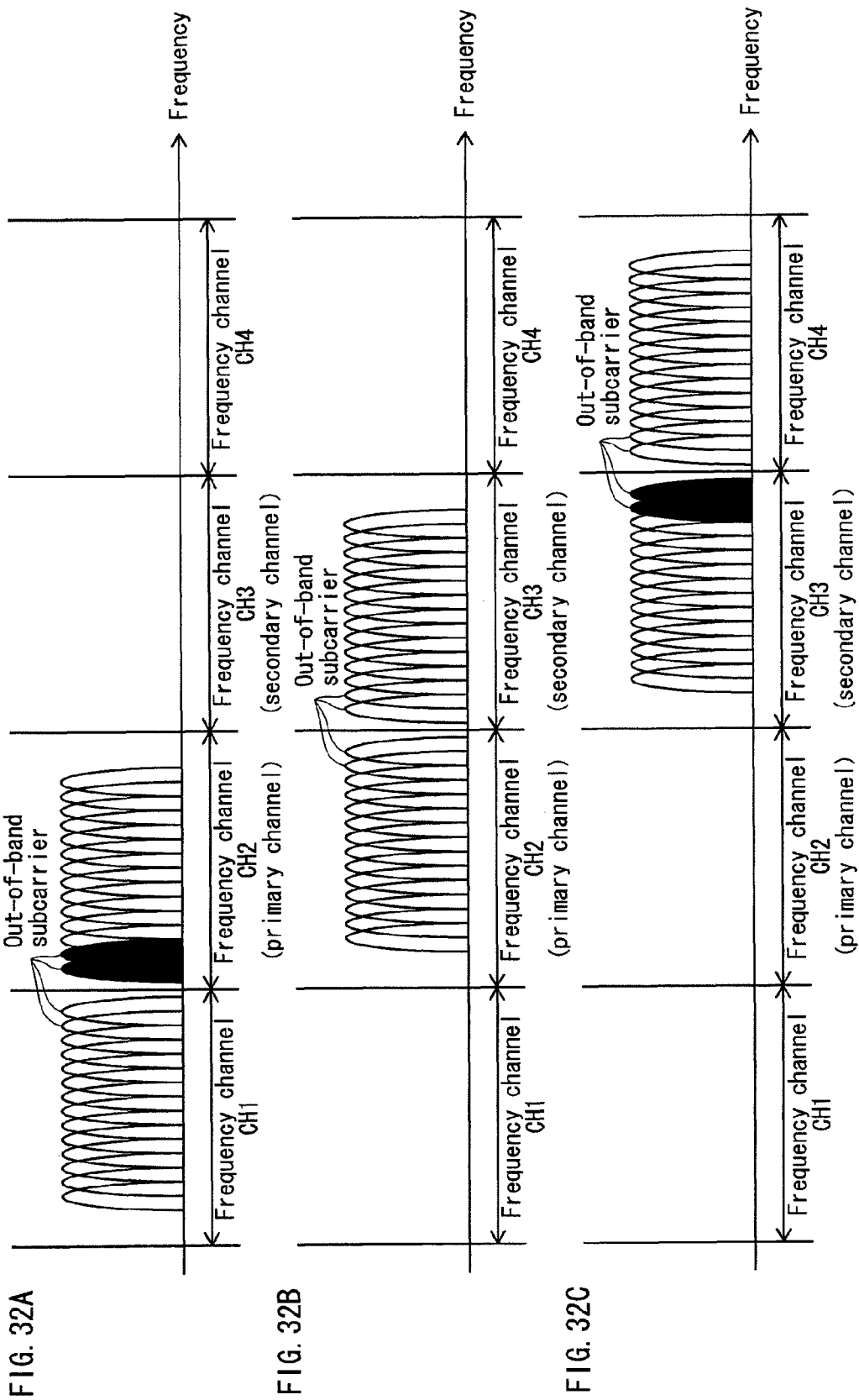

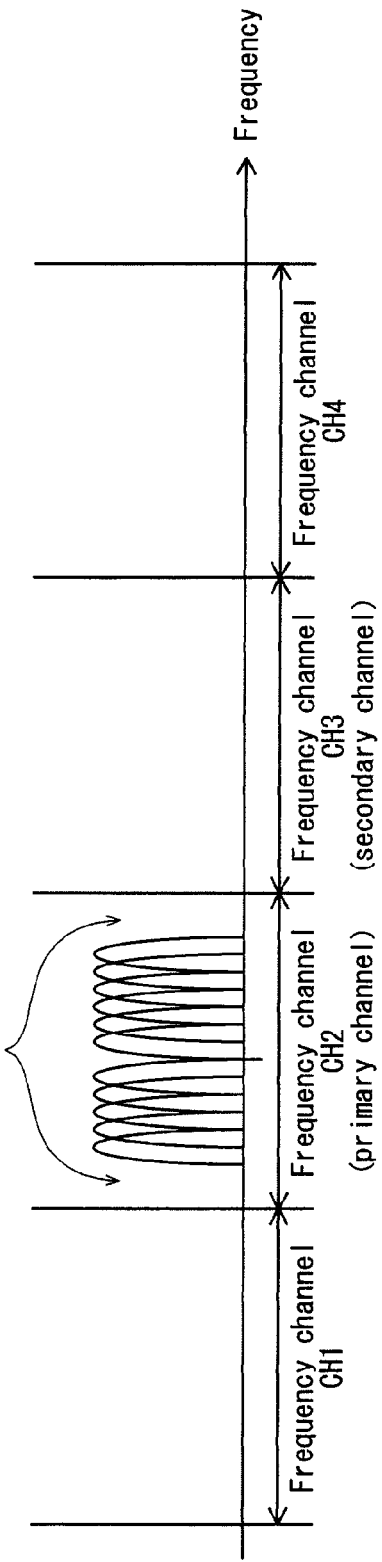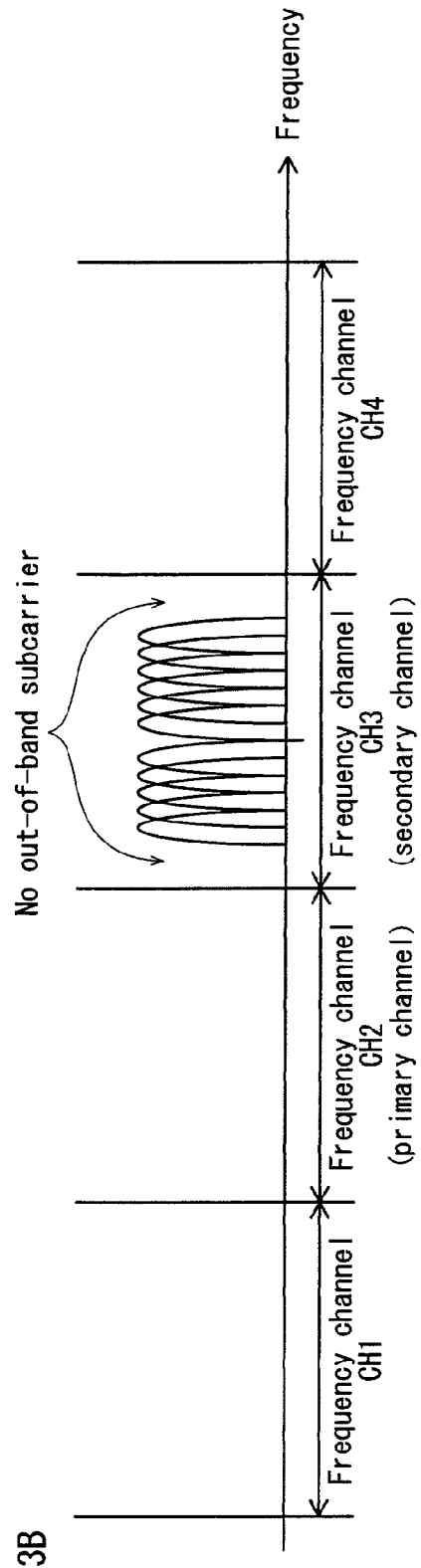
FIG. 33A
FIG. 33B

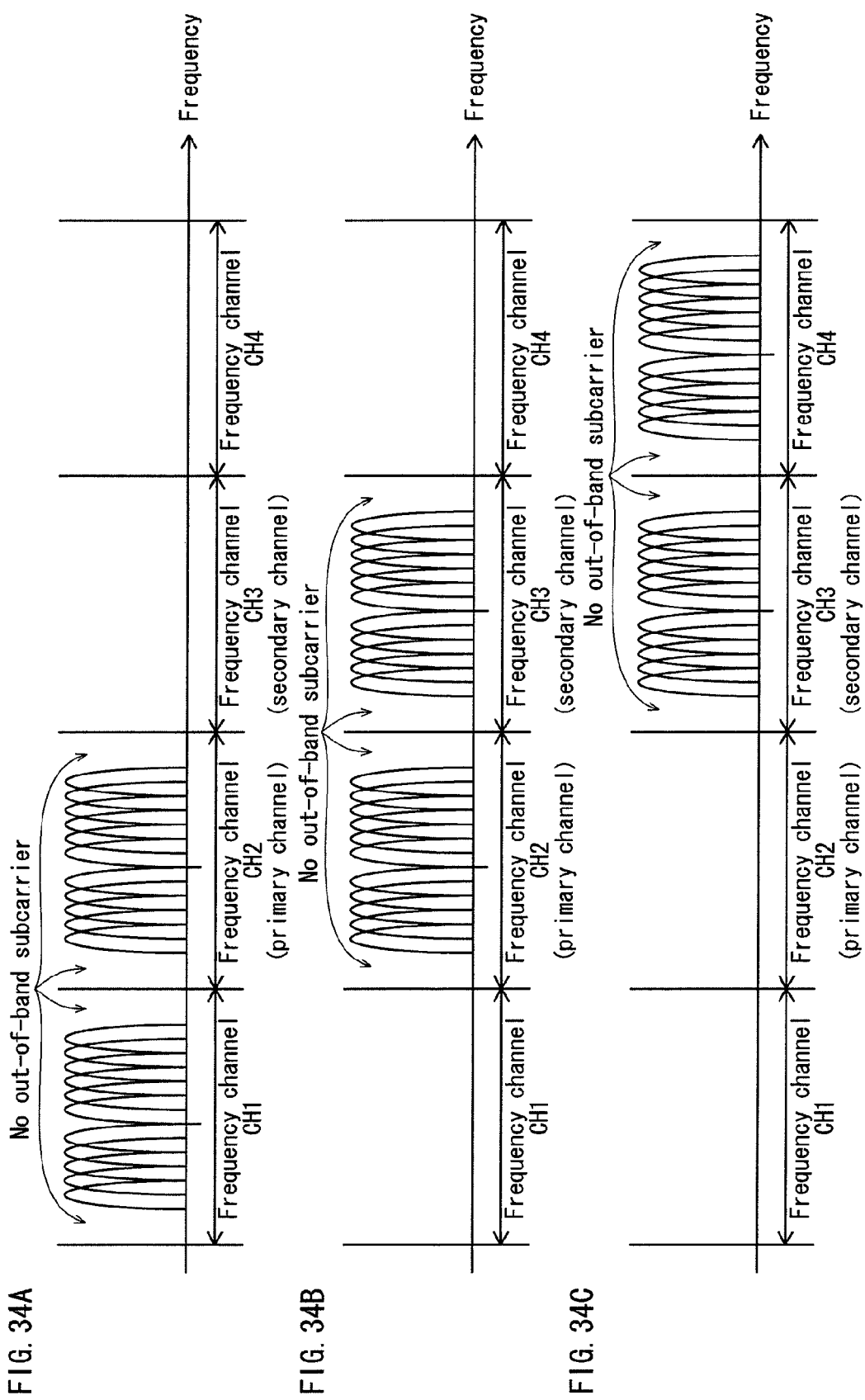

RECEIVING DEVICE AND RECEIVING METHOD

TECHNICAL FIELD

The present invention relates to a technology of receiving wireless signals in a wireless communication system such as a wireless LAN (Local Area Network).

BACKGROUND ART

In a digital wireless communication system, a wireless communication device is provided with, for example, an A/D converter (Analog-to-Digital converter) for converting received analog signals, namely wireless packet signals, into digital signals. And since the dynamic range of the input of the A/D converter is finite, the wireless communication device is provided with an automatic gain control device for making an adjustment so that the signal levels of the analog signals to be input into the A/D converter are within the dynamic range.

As a conventional wireless communication device provided with the automatic gain control device and the A/D converter, there is a wireless communication device conforming to the IEEE (Institute of Electrical and Electronics Engineers) 802.11a standard (for example, see Patent Document 1 identified below).

In a conventional wireless communication device 1000 shown in FIG. 42, an AGC (Auto Gain Control) unit 1009 first sets a predetermined gain value in a variable gain amplifying unit 1002.

An analog signal received by an antenna 1001 is amplified by the variable gain amplifying unit 1002, converted in frequency by a frequency converting unit 1003, and converted into a digital signal by an A/D converting unit 1004 (which corresponds to the A/D converter).

Also, a value of power of the analog signal received by the antenna 1001 is detected by an analog signal power detecting unit 1005, and an analog signal indicating the detected value of power is converted into a digital signal by an A/D converting unit 1006.

After an STS detecting unit 1007 detects a short training symbol from the digital signal output from the A/D converting unit 1004, the AGC unit 1009 calculates a gain value to be set in the variable gain amplifying unit 1002 based on the value of power indicated by the digital signal input from the A/D converting unit 1006, and sets the calculated gain value in the variable gain amplifying unit 1002.

After an LTS detecting unit 1008 detects a long training symbol from the digital signal output from the A/D converting unit 1004, the AGC unit 1009 fixes the gain value being set in the variable gain amplifying unit 1002 until a demodulation unit 1010 completes a demodulation of the wireless packet signal.

As described above, the AGC unit 1009 controls the gain of the variable gain amplifying unit 1002 based on the value of power of the analog signal received by the antenna 1001 only when the short training symbol is detected.

Patent Document 1: Japanese Patent Application Publication No. 2003-8676.

DISCLOSURE OF THE INVENTION

The Problems the Invention is Going to Solve

However, when the digital signal output from the A/D converting unit 1004 is outside the predetermined range, the digital signal does not represent the change in amplitude of the analog signal received by the antenna 1001. This, for example, causes the STS detecting unit 1007 to fail to detect a short training symbol even if a digital signal corresponding to the short training symbol is output from the A/D converting unit 1004.

For this reason, it is necessary for the AGC unit 1009 to control the gain of the variable gain amplifying unit 1002 so that the digital signal output from the A/D converting unit 1004 is within a desired range even if the digital signal output from the A/D converting unit 1004 is outside the predetermined range.

In view of this, it is an object of the present invention to provide a receiving device and a receiving method for optimally controlling the gain of the variable gain amplifying unit provided in the own device in the case where a digital signal output from the A/D converter provided in the own device is outside a predetermined range, and in the case where a preamble signal such as a short training symbol is detected.

Means to Solve the Problems

The above-described object is fulfilled by a receiving device comprising: a variable gain amplifying unit varying its gain depending on a gain control value and operable to amplify an input analog signal; an analog-to-digital converting unit operable to convert an amplified analog signal output from the variable gain amplifying unit, into a digital signal; a digital signal judging unit operable to judge whether or not the digital signal output from the analog-to-digital converting unit is outside a predetermined range; a preamble start detecting unit operable to detect, from the digital signal output from the analog-to-digital converting unit, a start of a section as a preamble signal which is attached to a head of a wireless packet signal; and a gain control unit operable to control a gain of the variable gain amplifying unit in accordance with the digital signal output from the analog-to-digital converting unit, wherein the gain control unit controls the gain of the variable gain amplifying unit by performing a first gain control process when the digital signal judging unit judges that the digital signal output from the analog-to-digital converting unit is outside the predetermined range and the gain control unit should control the gain of the variable gain amplifying unit, and controls the gain of the variable gain amplifying unit by performing a second gain control process, which is different from the first gain control process, when the preamble start detecting unit detects the start of the section as the preamble signal and the gain control unit should control the gain of the variable gain amplifying unit.

The above-described object is also fulfilled by a receiving method for use in a receiving device that includes a variable gain amplifying unit varying its gain depending on a gain control value and operable to amplify an input analog signal, an analog-to-digital converting unit operable to convert an amplified analog signal output from the variable gain amplifying unit, into a digital signal, and a gain control unit operable to control a gain of the variable gain amplifying unit in accordance with the digital signal output from the analog-to-digital converting unit, the receiving method comprising the steps of: judging whether or not the digital signal output from the analog-to-digital converting unit is outside a predetermined range; detecting, from the digital signal output from the analog-to-digital converting unit, a start of a section as a preamble signal which is attached to a head of a wireless packet signal; causing the gain control unit to control the gain of the variable gain amplifying unit by performing a first gain control process when it is judged that the digital signal output from the analog-to-digital converting unit is outside the predetermined range and the gain control unit should control the gain of the variable gain amplifying unit; and causing the gain control unit to control the gain of the variable gain amplifying unit by performing a second gain control process, which is different from the first gain control process, when the preamble start detecting step detects the start of the section as the preamble signal and the gain control unit should control the gain of the variable gain amplifying unit.

Effects of the Invention

According to the above-described receiving device and receiving method, the gain control unit controls the gain of the variable gain amplifying unit not only when the start of the section as the preamble signal, which is attached to the head of the wireless packet signal, is detected, but also when it is found that the digital signal output from the analog-to-digital converting unit is outside the predetermined range. This structure prevents a continuation of a state where the preamble signal cannot be detected because the digital signal output from the analog-to-digital converting unit is outside the predetermined range.

Also, the gain control unit performs the gain control process in different manners respectively when the digital signal output from the analog-to-digital converting unit is outside the predetermined range, and when the start of the section as the preamble signal is detected. This makes it possible to cause the gain control unit to perform the gain control process in the manners suited for the respective cases.

In the above-stated receiving device, the gain control unit controls the gain of the variable gain amplifying unit by calculating a gain value to be set in the variable gain amplifying unit and setting the calculated gain value in the variable gain amplifying unit, and in the second gain control process, the gain control unit performs the calculation of the gain value to be set and the setting of the calculated gain value M times, M being an integer of 1 or more, and in the first gain control process, the gain control unit performs the calculation of the gain value to be set and the setting of the calculated gain value N times, N being an integer larger than M.

It is considered that the number of times the gain control unit performs the gain control of the variable gain amplifying unit when the digital signal output from the analog-to-digital converting unit is outside the predetermined range needs to be larger than the number of times the gain control unit performs the gain control when the output digital signal is within the predetermined range.

For this reason, in the above-described receiving device, the gain control unit performs the gain control of the variable gain amplifying unit a larger number of times when the digital signal output from the analog-to-digital converting unit is outside the predetermined range, than when the start of the section as the preamble signal is detected.

In the above-described receiving device, therefore, the gain control unit performs the gain control of the variable gain amplifying unit in the manners suited for the case where the digital signal output from the analog-to-digital converting unit is outside the predetermined range, and also for the case where the start of the section as the preamble signal is detected.

The above-stated receiving device may further comprise a preamble detecting unit operable to detect, from the digital signal output from the analog-to-digital converting unit, a first preamble signal which is attached to the wireless packet signal at a position after the preamble signal, wherein the gain control unit controls the gain of the variable gain amplifying unit again when, during an interval after performing either the first gain control process or the second gain control process before the preamble detecting unit detects the first preamble signal, (i) the digital signal judging unit judges that the digital signal output from the analog-to-digital converting unit is outside the predetermined range, or (ii) the preamble start detecting unit detects the start of the section as the preamble signal.

With the above-described structure, the gain control unit controls the gain of the variable gain amplifying unit again when the start of the section as the preamble signal is detected, and controls the gain of the variable gain amplifying unit again when the digital signal output from the analog-to-digital converting unit becomes outside the predetermined range. This makes it possible to operate the variable gain amplifying unit with the gain value that is suited for state of wireless communication.

The above-stated receiving device may further comprise a preamble detecting unit operable to detect, from the digital signal output from the analog-to-digital converting unit, a first preamble signal which is attached to the wireless packet signal at a position after the preamble signal, wherein the gain control unit sets a predetermined gain value in the variable gain amplifying unit when the preamble detecting unit has not detected the first preamble signal during a predetermined time period after the gain control unit performed the first gain control process or the second gain control process.

With the above-described structure, the gain control unit sets a predetermined gain value in the variable gain amplifying unit when the preamble detecting unit has not detected the first preamble signal during a predetermined time period. This makes it possible to operate the variable gain amplifying unit with the gain value that is suited for state of wireless communication The above-stated receiving device may further comprise a first variable gain amplifying unit varying its gain depending on a gain control value and operable to amplify an input first analog signal, and output the amplified first analog signal as the analog signal to the variable gain amplifying unit, wherein the gain control unit controls the gain of the first variable gain amplifying unit in accordance with the first analog signal.

With the above-described structure, it is possible to increase the total gain width.

The above-stated receiving device may further comprise: a strong input judging unit operable to judge whether or not the input first analog signal is a strong input whose value of power exceeds a predetermined power value, wherein when the strong input judging unit has judged that the input first analog signal is the strong input, the gain control unit controls a gain of the first variable gain amplifying unit so that the gain value of the first variable gain amplifying unit becomes smaller.

With the above-described structure, it is possible to realize a suitable gain control of the first variable gain amplifying unit.

In the above-stated receiving device, the gain control unit may control the gain of the variable gain amplifying unit by performing a third gain control process, which is different from the second gain control process, when the strong input judging unit judges that the input first analog signal is the strong input and the gain control unit should control the gain of the variable gain amplifying unit.

With the above-described structure, the gain control unit performs the gain control process in different manners respectively when the first analog signal is the strong input, and when the start of the section as the preamble signal is detected. This makes it possible to cause the gain control unit to perform the gain control process in the manners suited for the respective cases.

In the above-stated receiving device, the gain control unit may control the gain of the variable gain amplifying unit by calculating a gain value to be set in the variable gain amplifying unit, in accordance with the digital signal output from the analog-to-digital converting unit, and setting the calculated gain value in the variable gain amplifying unit, and in the second gain control process, the gain control unit performs the calculation of the gain value to be set and the setting of the calculated gain value P times, P being an integer of 1 or more, in the first gain control process, the gain control unit performs the calculation of the gain value to be set and the setting of the calculated gain value Q times, Q being an integer larger than P, and in the third gain control process, the gain control unit performs the calculation of the gain value to be set and the setting of the calculated gain value R times, R being an integer larger than P.

When the first analog signal is the strong input, there is a possibility that the digital signal output from the analog-to-digital converting unit is outside the predetermined range. It is considered also that the number of times the gain control unit performs the gain control of the variable gain amplifying unit when the digital signal output from the analog-to-digital converting unit is outside the predetermined range needs to be larger than the number of times the gain control unit performs the gain control when the output digital signal is within the predetermined range.

For this reason, in the above-described receiving device, the gain control unit performs the gain control of the variable gain amplifying unit a larger number of times when the digital signal output from the analog-to-digital converting unit is outside the predetermined range or when the first analog signal is the strong input, than when the start of the section as the preamble signal is detected.

In the above-described receiving device, therefore, the gain control unit performs the gain control of the variable gain amplifying unit in the manners suited for the case where the digital signal output from the analog-to-digital converting unit is outside the predetermined range, for the case where the first analog signal is the strong input, and for the case where the start of the section as the preamble signal is detected.

The above-stated receiving device may further comprise a preamble detecting unit operable to detect, from the digital signal output from the analog-to-digital converting unit, a first preamble signal which is attached to the wireless packet signal at a position after the preamble signal, wherein the gain control unit controls the gain of the variable gain amplifying unit again when, during an interval after performing any of the first gain control process, the second gain control process, and the third gain control process before the preamble detecting unit detects the first preamble signal, (i) the digital signal judging unit judges that the digital signal output from the analog-to-digital converting unit is outside the predetermined range, (ii) the preamble start detecting unit detects the start of the section as the preamble signal, or (iii) the strong input judging unit judges that the input first analog signal is the strong input.

With the above-described structure, the gain control unit controls the gain of the variable gain amplifying unit again when the start of the section as the preamble signal is detected, controls the gain of the variable gain amplifying unit again when the digital signal output from the analog-to-digital converting unit becomes outside the predetermined range, and controls the gain of the variable gain amplifying unit again when the input first analog signal is the strong input.

This makes it possible to operate the variable gain amplifying unit with the gain value that is suited for state of wireless communication.

The above-stated receiving device may further comprise a preamble detecting unit operable to detect, from the digital signal output from the analog-to-digital converting unit, a first preamble signal which is attached to the wireless packet signal at a position after the preamble signal, wherein the gain control unit sets a predetermined gain value in the variable gain amplifying unit when the preamble detecting unit has not detected the first preamble signal during a predetermined time period after the gain control unit performed any of the first gain control process, the second gain control process, and the third gain control process.

With the above-described structure, the gain control unit sets a predetermined gain value in the variable gain amplifying unit when the preamble detecting unit has not detected the first preamble signal during a predetermined time period. This makes it possible to operate the variable gain amplifying unit with the gain value that is suited for state of wireless communication.

The above-stated receiving device may further comprise a filter unit operable to be switched by the gain control unit between: (i) a first operation mode in which the filter unit removes a low-frequency component including a direct current component from the amplified first analog signal output from the first variable gain amplifying unit to obtain a first analog signal after the removal, and outputs the first analog signal after the removal as the analog signal to the variable gain amplifying unit; and (ii) a second operation mode in which the filter unit outputs the amplified first analog signal output from the first variable gain amplifying unit as the analog signal to the variable gain amplifying unit, wherein the gain control unit sets operation mode of the filter unit to the first operation mode, and after the gain control unit performs any of the first gain control process, the second gain control process, and the third gain control process, switches the operation mode of the filter unit from the first operation mode to the second operation mode.

With the above-described structure, it is possible to perform the gain control of the variable gain amplifying unit accurately.

In the above-stated receiving device, the gain control unit may control the gain of the variable gain amplifying unit by calculating a gain value to be set in the variable gain amplifying unit in accordance with the digital signal output from the analog-to-digital converting unit and setting the calculated gain value in the variable gain amplifying unit, in the second gain control process, the gain control unit repeatedly performs the calculation of the gain value to be set and the setting of the calculated gain value, during a first predetermined period, and in the first gain control process, the gain control unit repeatedly performs the calculation of the gain value to be set and the setting of the calculated gain value, during a second predetermined period which is longer than the first predetermined period.

It is considered that the number of times the gain control unit performs the gain control of the variable gain amplifying unit when the digital signal output from the analog-to-digital converting unit is outside the predetermined range needs to be larger than the number of times the gain control unit performs the gain control when the output digital signal is within the predetermined range.

For this reason, in the above-described receiving device, the gain control unit performs the gain control of the variable gain amplifying unit for a longer time period when the digital signal output from the analog-to-digital converting unit is outside the predetermined range, than when the start of the section as the preamble signal is detected.

In the above-described receiving device, therefore, the gain control unit performs the gain control of the variable gain amplifying unit in the manners suited for the case where the digital signal output from the analog-to-digital converting unit is outside the predetermined range, and also for the case where the start of the section as the preamble signal is detected.

The above-stated receiving device may further comprise: a first preamble detecting unit operable to detect, in a first frequency channel among a plurality of frequency channels, from the digital signal output from the analog-to-digital converting unit, a first preamble signal which is attached to the wireless packet signal at a position after the preamble signal; a second preamble detecting unit operable to detect, in a second frequency channel which is one of two frequency channels adjacent to the first frequency channel, the first preamble signal from the digital signal output from the analog-to-digital converting unit; an adjacent power value detecting unit operable to detect a power value of a signal component in a third frequency channel which is the other of the two frequency channels adjacent to the first frequency channel, in accordance with the digital signal output from the analog-to-digital converting unit; and a judging unit operable to judge whether or not the digital signal output from the analog-to-digital converting unit is a digital signal of an interference signal, in accordance with a detection result of the first preamble detecting unit, a detection result of the second preamble detecting unit, and a detection result of the adjacent power value detecting unit.

With the above-described structure, it is possible to judge quickly whether or not the wireless packet signal being received is an interference signal.

In the above-stated receiving device, the gain control unit may fix a gain value of the variable gain amplifying unit when the judging unit judges that the digital signal output from the analog-to-digital converting unit is not a digital signal of an interference signal.

With the above-described structure, the gain control unit can fix the gain value of the variable gain amplifying unit at an appropriate timing.

The above-stated receiving device may further comprise a destination information extracting unit operable to extract destination information indicating a destination, from the digital signal output from the analog-to-digital converting unit, wherein the judging unit further judges whether or not the digital signal output from the analog-to-digital converting unit is a digital signal of an interference signal, in accordance with the destination information extracted by the destination information extracting unit.

With the above-described structure, it is possible to judge in more detail whether or not the wireless packet signal being received is an interference signal.

In the above-stated receiving device, the adjacent power value detecting unit may further detect a power value of a signal component in a fourth frequency channel which is one of two frequency channels adjacent to the second frequency channel and is not the first frequency channel, in accordance with the digital signal output from the analog-to-digital converting unit, and the receiving device further comprises an out-of-band subcarrier detecting unit operable to detect, in accordance with the digital signal output from the analog-to-digital converting unit, whether or not a subcarrier is present in a guard band of the first frequency channel, and whether or not a subcarrier is present in a guard band of the second frequency channel, and the judging unit makes the judgment on whether or not the digital signal output from the analog-to-digital converting unit is a digital signal of an interference signal, in accordance with a detection result of the first preamble detecting unit, a detection result of the second preamble detecting unit, a detection result of the adjacent power value detecting unit, and a detection result of the out-of-band subcarrier detecting unit.

With the above-described structure, it is possible to judge quickly whether or not the wireless packet signal being received is an interference signal.

BRIEF DESCRIPTION OF THE DRAWING

FIG. 27 shows in schematic form the relationships between the frequency channels and the wireless packet signals being an object of the judgment performed by the wireless communication device in Embodiment 6.

FIG. 30 shows in schematic form the relationships between the frequency channels and the wireless packet signals being an object of the judgment performed by the wireless communication device in the Embodiment 6.

FIG. 31 shows in schematic form the relationships between the frequency channels and the wireless packet signals being an object of the judgment performed by the wireless communication device in the Embodiment 6.

FIGS. 32A to 32C show in schematic form the power spectrum of the wireless packet signals shown in FIGS. 30 and 31.

FIGS. 33A and 33B show in schematic form the power spectrum of the wireless packet signals shown in FIGS. 30 and 31.

FIGS. 34A to 34C show in schematic form the power spectrum of the wireless packet signals shown in FIGS. 30 and 31.

Figure 1:
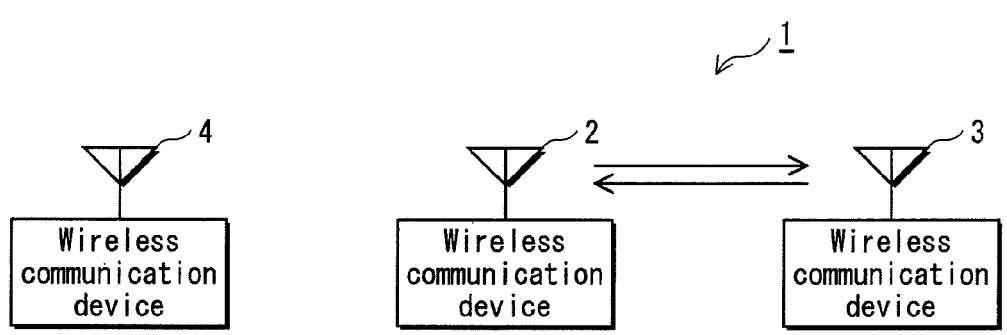
FIG. 1 shows a system structure of the wireless communication system in Embodiment 1.

DESCRIPTION OF CHARACTERS 100 wireless communication device
101 antenna
102 variable gain amplifying unit
103 frequency converting unit
104 A/D converting unit
105 digital signal power detecting unit
106 bit saturation detecting unit
107 STS detecting unit
108 STS start detecting unit
109 LTS detecting unit
110 demodulation unit
111 AGC unit

BEST MODE FOR CARRYING OUT THE INVENTION

<<Embodiment 1>>

The following describes Embodiment 1, the first embodiment of the present invention, with reference to the attached drawings.

<Structure of Wireless Communication System>

FIG. 1 shows a system structure of the wireless communication system in the present embodiment. It is presumed that the wireless communication system shown in FIG. 1 is a wireless LAN system conforming to the IEEE 802.11a standard.

A wireless communication system 1 includes a plurality of wireless communication devices such as wireless communication devices 2, 3 and 4. In the wireless communication system 1, wireless packet signals being analog signals are transferred among the plurality of wireless communication devices.

For example, the wireless communication device 2 transmits a wireless packet signal to the wireless communication device 3, and the wireless communication device 3 receives the wireless packet signal from the wireless communication device 2. Also, the wireless communication device 3 transmits a wireless packet signal to the wireless communication device 2, and the wireless communication device 2 receives the wireless packet signal from the wireless communication device 3. Note that a wireless communication may be performed between the wireless communication device 2 and the wireless communication device 4, and a wireless communication may be performed between the wireless communication device 3 and the wireless communication device 4.

<Frame Format of Wireless Packet Signal>

Figure 2:
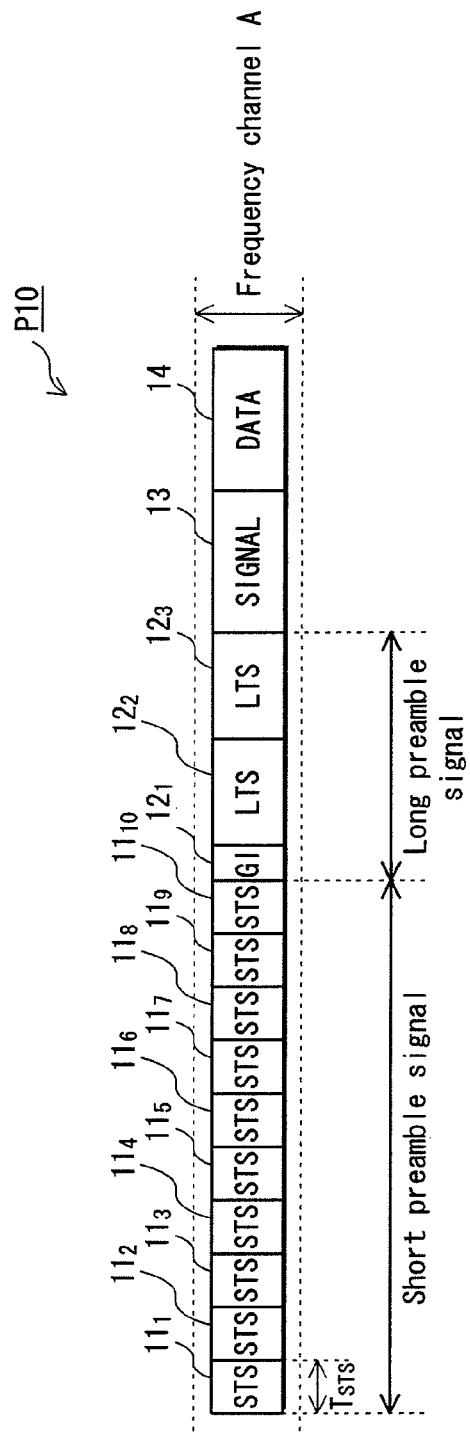
FIG. 2 shows the frame format of the wireless packet signals transferred in the wireless communication system shown in FIG. 1.

Before the structure and operation of the wireless communication devices 2 to 4 shown in FIG. 1 are explained, the frame format of the wireless packet signals transmitted/received in the wireless communication system 1 is explained with reference to FIG. 2. FIG. 2 shows the frame format of the wireless packet signals transmitted/received in the wireless communication system 1, the wireless packet signals being defined as usable in the IEEE 802.11a standard. Note that when the IEEE 802.11a standard is adopted, the bandwidth of the frequency channel A should be 20 MHz.

The head of a wireless packet signal P10 is attached with 10 short training symbols (hereinafter referred to as "STS"s) $11_1$ to $11_{10}$. The STS is a symbol having a predetermined waveform pattern that is known to both the transmission side and the reception side and is determined by the wireless communication system 1 (hereinafter, the predetermined waveform pattern is referred to as "first waveform pattern"). The STSs $11_1$ to $11_{10}$ are used for detection of a wireless packet signal, automatic gain control, coarse adjustment of carrier frequency error, detection of symbol timing and the like. In the following description, the signal part composed of the STSs $11_1$ to $11_{10}$ is referred to as "short preamble signal", and the symbol time of the STS is represented as $T_{STS}$.

In the wireless packet signal P10, the short preamble signal is followed by a guard interval (hereinafter referred to as "GI") $12_1$ and two long training symbols (hereinafter referred to as "LTS"s) $12_2$ and $12_3$, where the GI is a copy of a part of an LTS. The LTS is a symbol having a predetermined waveform pattern that is known to both the transmission side and the reception side and is determined by the wireless communication system 1 (hereinafter, the predetermined waveform pattern is referred to as "second waveform pattern"). The LTSs $12_2$ and $12_3$ are used for fine adjustment of carrier frequency error, channel estimation (estimation of reference amplitude and reference phase) and the like. In the following description, the signal part including the GI $12_1$ and the LTSs $12_2$ and $12_3$ is referred to as "long preamble signal".

In the wireless packet signal P10, the long preamble signal is followed by a control symbol (hereinafter referred to as "SIGNAL symbol") 13 which has control information such as the date length and transfer speed. The SIGNAL symbol 13 is followed by a symbol (hereinafter referred to as "DATA symbol") 14 which has information concerning the transmission data. Note that the DATA symbol 14 represents a set of one or more DATA symbols, and the destination information and the source information are transferred by the DATA symbols. Although not illustrated, the SIGNAL symbol 13 is preceded by a guard interval which is a copy of a part of the SIGNAL symbol 13, and the DATA symbol (s) 14 is preceded by a guard interval which is a copy of a part of the DATA symbols) 14.

<Structure of Wireless Communication Device>

Figure 3:
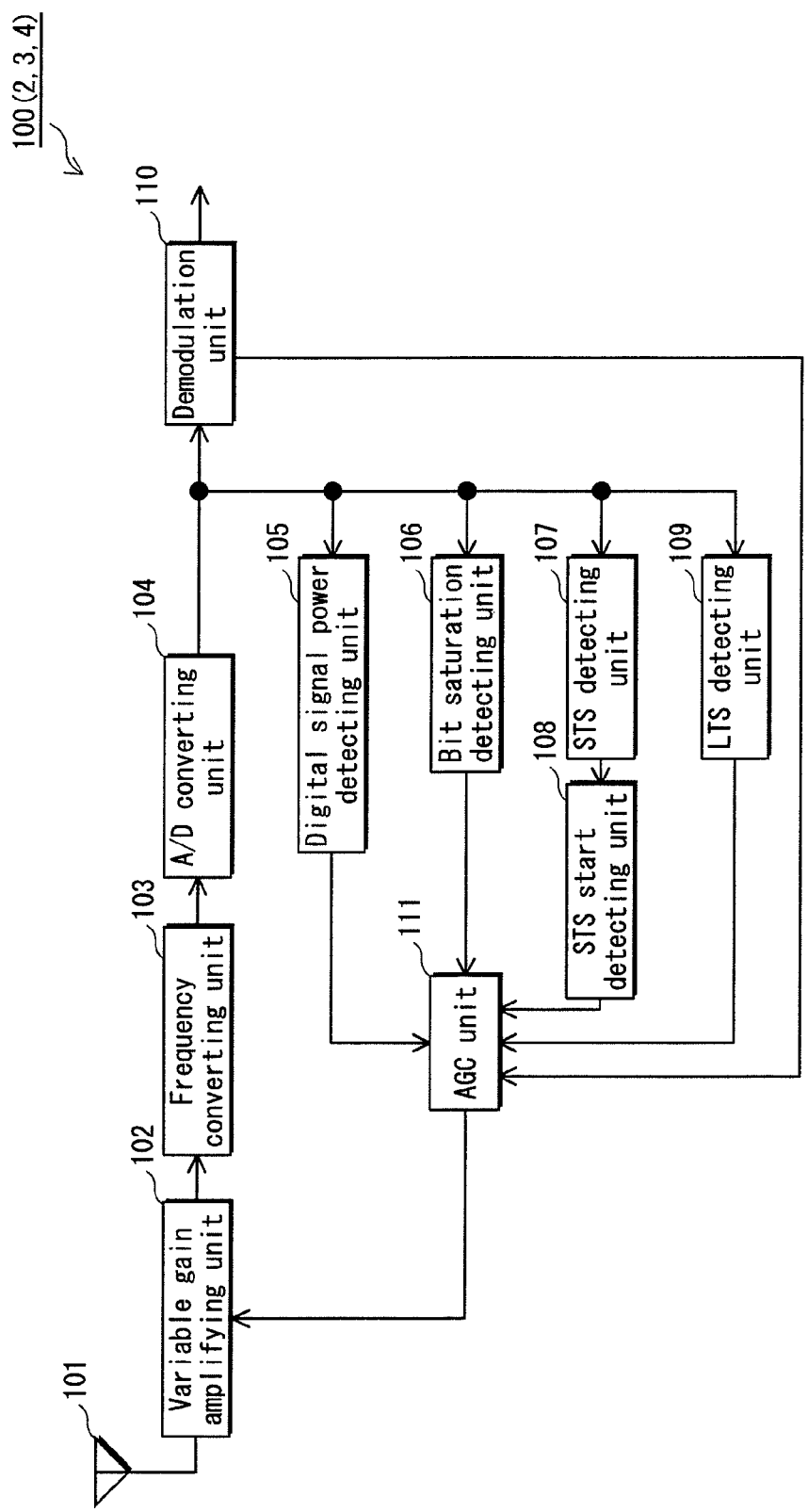
FIG. 3 shows the structure of the wireless communication device shown in FIG. 1.

The following explains the structure of a wireless communication device 100, which is, for example, the wireless communication device 2, 3, or 4 shown in FIG. 1, with reference to FIG. 3. FIG. 3 shows the structure of the wireless communication device 100 which may be used as the wireless communication devices 2 to 4 shown in FIG. 1.

The wireless communication device 100 includes an antenna 101, a variable gain amplifying unit 102, a frequency converting unit 103, an A/D converting unit 104, a digital signal power detecting unit 105, a bit saturation detecting unit 106, an STS detecting unit 107, an STS start detecting unit 108, an LTS detecting unit 109, a demodulation unit 110, and an AGC unit 111.

[Variable Gain Amplifying Unit 102]

The variable gain amplifying unit 102 varies its gain depending on a gain control and amplifies an analog signal in the RF (Radio Frequency) band received by the antenna 101 (hereinafter, the analog signal is referred to as "received analog signal"). The variable gain amplifying unit 102 outputs the analog signal in the RF band after the amplification to the frequency converting unit 103. Note that the gain of the variable gain amplifying unit 102 is controlled by the AGC unit 111.

[Frequency Converting Unit 103]

The frequency converting unit 103 converts the analog signal in the RF band after the amplification received from the variable gain amplifying unit 102, into an analog signal in the baseband (hereinafter referred to as "analog baseband signal"), and outputs the analog baseband signal to the A/D converting unit 104.

[A/D Converting Unit 104]

The A/D converting unit 104 has a dynamic range for input, and converts the analog baseband signal, which is input from the frequency converting unit 103, into a digital signal of a predetermined number of bits by a predetermined sampling frequency (hereinafter, the digital signal is referred to as "digital baseband signal"). The A/D converting unit 104 outputs the digital baseband signal to the digital signal power detecting unit 105, the bit saturation detecting unit 106, the STS detecting unit 107, the LTS detecting unit 109, and the demodulation unit 110.

[Digital Signal Power Detecting Unit 105]

The digital signal power detecting unit 105 detects a value of power of the digital baseband signal that is input from the A/D converting unit 104, and outputs a digital power value signal indicating the detected value of power to the AGC unit 111.

[Bit Saturation Detecting Unit 106]

The bit saturation detecting unit 106 detects a bit saturation of the digital baseband signal of the predetermined number of bits that is input from the A/D converting unit 104. The bit saturation detecting unit 106 keeps on outputting a high-level bit-saturation detection signal to the AGC unit 111 while the digital baseband signal is bit-saturated, and keeps on outputting a low-level bit-saturation detection signal to the AGC unit 111 while the digital baseband signal is not bit-saturated. Note that the bit saturation detecting unit 106 performs the process of detecting a bit saturation of the digital baseband signal, based on whether or not the signal value indicated by the digital baseband signal is outside a predetermined range.

Note that the predetermined range may be determined based on whether or not the digital baseband signal is bit-saturated, or, for example, may be determined based on whether or not the STS can be detected from a change in the digital baseband signal.

[STS Detecting Unit 107]

The STS detecting unit 107 performs a cross-correlation calculation between the digital baseband signal input from the A/D converting unit 104 and the reference signal based on the STS having the above-mentioned first waveform pattern. The STS detecting unit 107 detects the STS from the digital baseband signal by finding a peak of a correlation value that is obtained as a result of the cross-correlation calculation, while observing the correlation value.

The STS detecting unit 107, after detecting the STS from the digital baseband signal, keeps on outputting a high-level STS detection signal to the STS start detecting unit 108 for a predetermined pulse period, and keeps on outputting a low-level STS detection signal to the STS start detecting unit 108 for the periods other than the predetermined pulse period.

[STS Start Detecting Unit 108]

The STS start detecting unit 108 detects the start of a section (hereinafter referred to as "STS detection section") in which the STS is detected continuously at an interval of symbol time $T_{STS}$ based on the STS detection signal output from the STS detecting unit 107. The STS start detecting unit 108, after detecting the start of the STS detection section, keeps on outputting a high-level STS detection section start signal to the AGC unit 111 for the pulse period, and keeps on outputting a low-level STS detection section start signal to the AGC unit 111 for the periods other than the pulse period. Note that the timing at which the STS detection section starts is the timing at which the second STS is detected, among the STSs that are detected continuously in sequence at the interval of symbol time $T_{STS}$.

(Structure of STS Start Detecting Unit 108)

Figure 4:
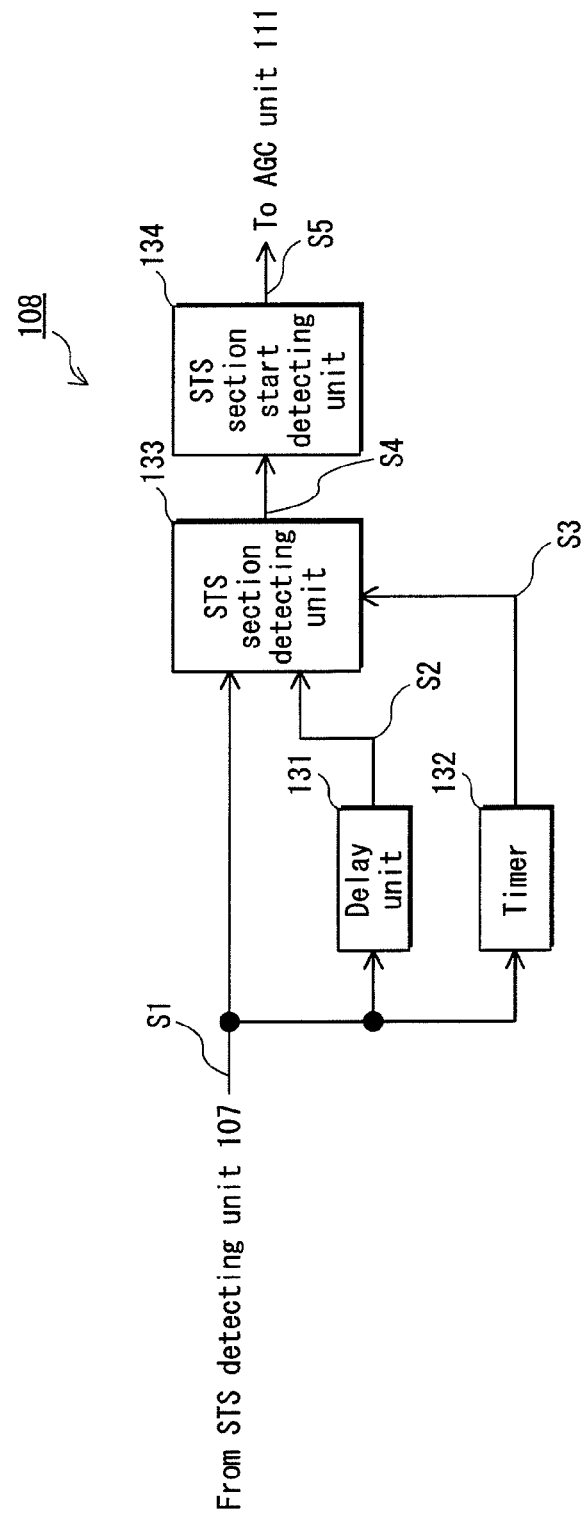
FIG. 4 shows the structure of the STS start detecting unit shown in FIG. 3.

The STS start detecting unit 108 is structured as shown in FIG. 4, and includes a delay unit 131, a timer 132, an STS section detecting unit 133, and an STS section start detecting unit 134.

[Delay Unit 131]

The delay unit 131 delays an STS detection signal S1 input from the STS detecting unit 107, by the symbol time $T_{STS}$, and outputs a delay signal (hereinafter referred to as "STS detection delay signal") S2 to the STS section detecting unit 133.

[Timer 132]

The timer 132 sets the count value of the time-measuring counter to "0" at the timing when the STS detection signal S1 input from the STS detecting unit 107 rises, sets the time-out time to the symbol time $T_{STS}$, and causes the time-measuring counter to start counting. When the count value of the time-measuring counter reaches a time-out time $T_{STS}$, the timer 132 outputs a timing signal S3 to the STS section detecting unit 133. Note that, since STSs of the same wireless packet signal are detected continuously in sequence at the interval of symbol time $T_{STS}$ the symbol time $T_{STS}$ is used as the time-out time.

[STS Section Detecting Unit 133]

The STS section detecting unit 133 calculates a logical multiplication between the STS detection signal S1 input from the STS detecting unit 107 and the STS detection delay signal S2 input from the delay unit 131, at the timing when the timing signal S3 is input from the timer 132. When the calculated logical multiplication is "1", the STS section detecting unit 133 keeps on outputting a high-level STS section signal S4 to the STS section start detecting unit 134 during a period from the input of the timing signal S3 to the next input of the timing signal S3. On the other hand, when the calculated logical multiplication is "0", the STS section detecting unit 133 keeps on outputting a low-level STS section signal S4 to the STS section start detecting unit 134 during a period from the input of the timing signal S3 to the next input of the timing signal S3.

[STS Section Start Detecting Unit 134]

The STS section start detecting unit 134 observes the STS section signal S4 input from the STS section detecting unit 133 and detects a rise of the STS section signal S4. The STS section start detecting unit 134, after detecting a rise of the STS section signal S4, keeps on outputting a high-level STS detection section start signal S5 to the AGC unit 111 for the pulse period, and keeps on outputting a low-level STS detection section start signal 55 to the AGC unit 111 for the periods other than the pulse period.

This causes a pulse signal to occur at the timing of the start of the section (STS detection section) in which the STSs are detected continuously in sequence at the interval of symbol time $T_{STS}$. Also, only one pulse signal occurs during the section (STS detection section) in which the STSs are detected continuously in sequence at the interval of symbol time $T_{STS}$.

(Operation of STS Start Detecting Unit 108)

Figure 5:
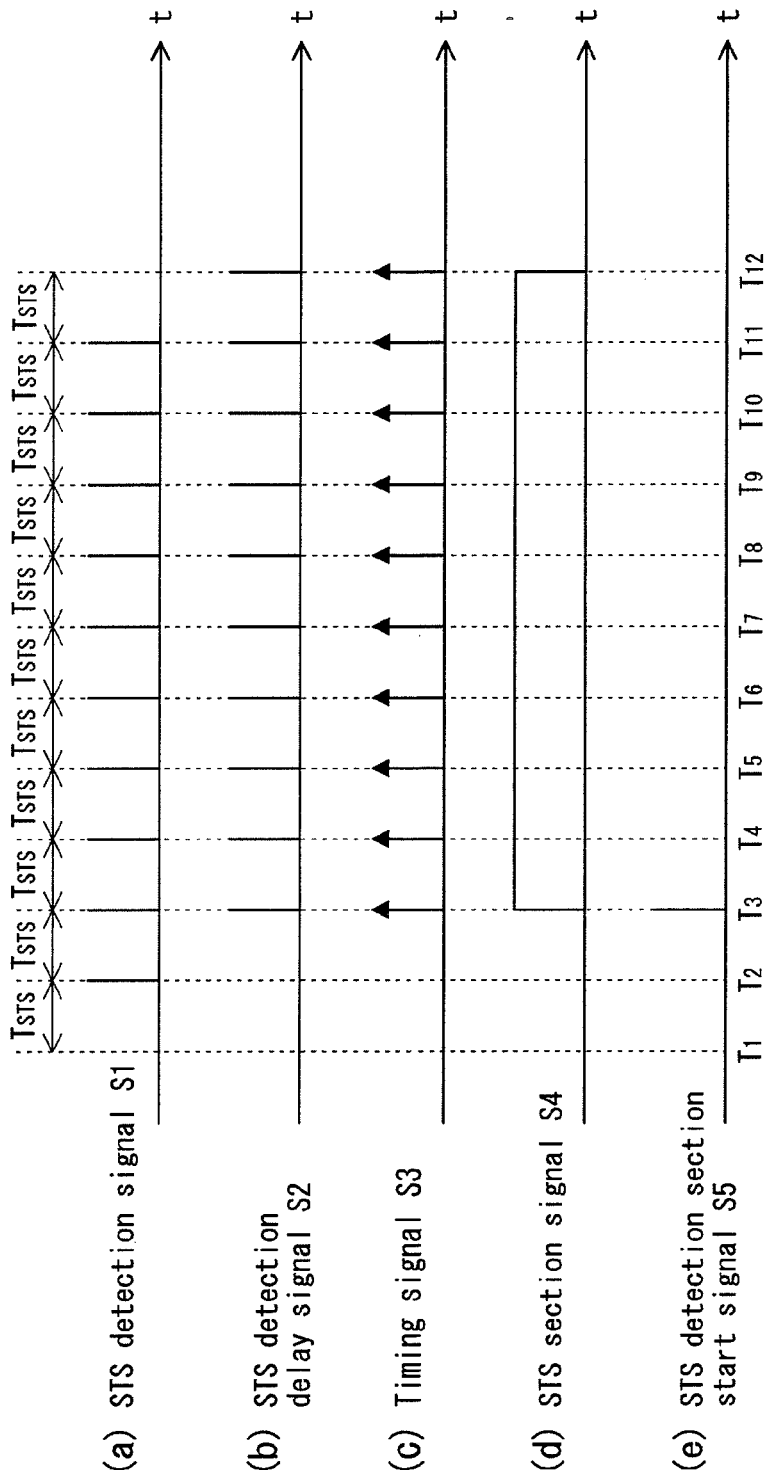
FIG. 5 is a timing chart showing one example of the operation of the STS start detecting unit shown in FIG. 4.

FIG. 5 shows one example of the operation of the STS start detecting unit 108 whose structure is shown in FIG. 4.

The STS detecting unit 107 outputs the STS detection signal S1 as shown in the part (a) of FIG. 5, and the STS detection signal S1 is input into the delay unit 131, the timer 132, and the STS section detecting unit 133.

The STS detection signal 51 is delayed by the delay unit 131 by the symbol time $T_{STS}$, and the STS detection delay signal S2 is input into the STS section detecting unit 133 as shown in the part (b) of FIG. 5.

The timer 132 does not operate at time $T_1$ because the STS detection signal S1 is at a low level at the time.

The STS detection signal S1 changes from a low level to a high level at time $T_2$. Due to this change, the timer 132 sets the count value of the time-measuring counter to "0", and sets the time-out time to "$T_{STS}$", and then causes the time-measuring counter to start counting. When the count value of the time-measuring counter reaches to the time-out time $T_{STS}$ (time $T_3$), the timer 132 outputs the timing signal S3 to the STS section detecting unit 133.

Upon receiving the timing signal S3 from the timer 132, the STS section detecting unit 133 calculates a logical multiplication between the STS detection signal S1 and the STS detection delay signal S2. In this example case, since both the STS detection signal S1 and the STS detection delay signal S2 are at a high level, the result of the logical multiplication is "1", and the STS section detecting unit 133 changes the STS section signal S4 from a low level to a high level. After the STS section signal S4 changes from a low level to a high level, the STS section start detecting unit 134 keeps on outputting a high-level STS detection section start signal S5 to the AGC unit 111 for the pulse period.

At time $T_3$, the STS detection signal S1 changes from a low level to a high level. Upon this happening, the timer 132 sets the count value of the time-measuring counter to "0", sets the time-out time to "$T_{STS}$", and then causes the time-measuring counter to start counting. When the count value of the time-measuring counter reaches the time-out time $T_{STS}$, the timer 132 outputs a timing signal S3 to the STS section detecting unit 133.

The STS section detecting unit 133, upon receiving the timing signal S3 from the timer 132, calculates a logical multiplication between the STS detection signal S1 and the STS detection delay signal S2. In this example case, since both the STS detection signal S1 and the STS detection delay signal S2 are at a high level, the result of the logical multiplication is "1", and the STS section detecting unit 133 maintains the STS section signal S4 to be at a high level. Since the STS section signal S4 remains to be at a high level, the STS section start detecting unit 134 maintains the STS detection section start signal S5 to be at a low level.

At times $T_4$ to $T_{10}$, the STS detection signal S1 changes from a low level to a high level, and the STS start detecting unit 108 performs the same operation as the operation performed at time $T_3$.

At time $T_{11}$, the STS detection signal S1 changes from a low level to a high level. Upon this happening, the timer 132 sets the count value of the time-measuring counter to "0", sets the time-out time to "$T_{STS}$", and then causes the time-measuring counter to start counting. After this, when the count value of the time-measuring counter reaches the time-out time $T_{STS}$ (time $T_{12}$), the timer 132 outputs a timing signal S3 to the STS section detecting unit 133.

The STS section detecting unit 133, upon receiving the timing signal S3 from the timer 132, calculates a logical multiplication between the STS detection signal S1 and the STS detection delay signal S2. In this example case, since the STS detection signal S1 is at a low level and the STS detection delay signal S2 is at a high level, the result of the logical multiplication is "0", and the STS section detecting unit 133 changes the STS section signal S4 from a high level to a low level. Since the STS section signal S4 has not changed from a low level to a high level, the STS section start detecting unit 134 maintains the STS detection section start signal S5 to be at a low level.

[LTS Detecting Unit 109]

The LTS detecting unit 109 performs a cross-correlation calculation between the digital baseband signal input from the A/D converting unit 104 and the reference signal based on the LTS having the above-mentioned second waveform pattern. The LTS detecting unit 109 detects the LTS from the digital baseband signal by finding a peak of a correlation value that is obtained as a result of the cross-correlation calculation, while observing the correlation value. The LTS detecting unit 109, after detecting the LTS from the digital baseband signal, keeps on outputting a high-level LTS detection signal to the AGC unit 111 for the pulse period, and keeps on outputting a low-level LTS detection signal to the AGC unit 111 for the periods other than the predetermined pulse period.

[Demodulation Unit 110]

The demodulation unit 110 demodulates the digital baseband signal input from the A/D converting unit 104, and outputs a digital signal, which is obtained by the modulation, to one of units that should execute processes after the demodulation unit 110 (for example, a unit for performing the error correction process).

The demodulation unit 110 judges whether or not the demodulation of the wireless packet signal is completed, based on information for a data length indicated by the SIGNAL symbol. When it judges that the demodulation of the wireless packet signal is completed, the demodulation unit 110 keeps on outputting a high-level demodulation completion signal to the AGC unit 111 for the pulse period, and keeps on outputting a low-level demodulation completion signal to the AGC unit 111 for the periods other than the pulse period.

[AGC Unit 111]

The AGC unit 111 sets a predetermined gain value (hereinafter referred to as "initial gain value") in the variable gain amplifying unit 102, and performs the gain control of the variable gain amplifying unit 102 based on the digital power value signal input from the digital signal power detecting unit 105. The AGC unit 111 judges whether or not to start the gain control of the variable gain amplifying unit 102, based on the bit saturation detection signal input from the bit saturation detecting unit 106, the STS detection section start signal input from the STS start detecting unit 108, the LTS detection signal input from the LTS detecting unit 109, and the demodulation completion signal input from the demodulation unit 110 (see FIGS. 6 to 8).

The AGC unit 111 may start performing the gain control of the variable gain amplifying unit 102 when the bit saturation detection signal is at a high level (when the digital baseband signal is bit-saturated). In this case, the AGC unit 111 performs the calculation of a gain value to be set in the variable gain amplifying unit 102 and the setting of the calculated gain value in the variable gain amplifying unit 102, respectively twice (see FIG. 7).

On the other hand, the AGC unit 111 may start performing the gain control of the variable gain amplifying unit 102 when the STS detection section start signal changes from a low level to a high level (when the STS detection section is started). In this case, the AGC unit 111 performs the calculation of a gain value to be set in the variable gain amplifying unit 102 and the setting of the calculated gain value in the variable gain amplifying unit 102, once (see FIG. 8).

As described above, there are different numbers of times (hereinafter referred to as "gain control times number") in which the calculation of a gain value to be set in the variable gain amplifying unit 102 and the setting of the calculated gain value in the variable gain amplifying unit 102 are performed.

The reason for this is as follows.

When the digital baseband signal output from the A/D converting unit 104 has not been bit-saturated, it is recognized, from the digital baseband signal output from the A/D converting unit 104, how high the level of the amplitude of the analog baseband signal input into the A/D converting unit 104 is. As a result, it is understood from the digital baseband signal output from the A/D converting unit 104 to what extent the amplitude of the analog baseband signal input into the A/D converting unit 104 should be changed in order to cause the digital baseband signal output from the A/D converting unit 104 to be within a desired range. In other words, by using the digital baseband signal output from the A/D converting unit 104, it is possible to obtain the value of gain of the variable gain amplifying unit 102 that is required to cause the digital baseband signal output from the A/D converting unit 104 to be within a desired range.

On the other hand, when the digital baseband signal output from the A/D converting unit 104 has been bit-saturated, the digital baseband signal output from the A/D converting unit 104 can only indicate that the amplitude of the analog baseband signal input into the A/D converting unit 104 is outside a certain range. Therefore, it is not understood from the digital baseband signal output from the A/D converting unit 104 to what extent the amplitude of the analog baseband signal input into the A/D converting unit 104 should be changed in order to cause the digital baseband signal output from the A/D converting unit 104 to be within a desired range. In other words, by using the digital baseband signal that has been bit-saturated and output from the A/D converting unit 104, it is not possible to obtain the value of gain of the variable gain amplifying unit 102 that is required to cause the digital baseband signal output from the A/D converting unit 104 to be within a desired range.

It is accordingly considered that, to cause the digital baseband signal output from the A/D converting unit 104 to be within a desired range, the gain control times number of the variable gain amplifying unit 102 when the digital baseband signal has been bit-saturated needs to be larger than the gain control times number of the variable gain amplifying unit 102 when the digital baseband signal has not been bit-saturated.

It is based on this fact that the gain control times number for gain controls triggered by the bit saturation detection signal being at a high level is larger than the gain control times number for gain controls triggered by the change of the STS detection section start signal from a low level to a high level.

(Operation of AGC Unit 111)

Figure 6:
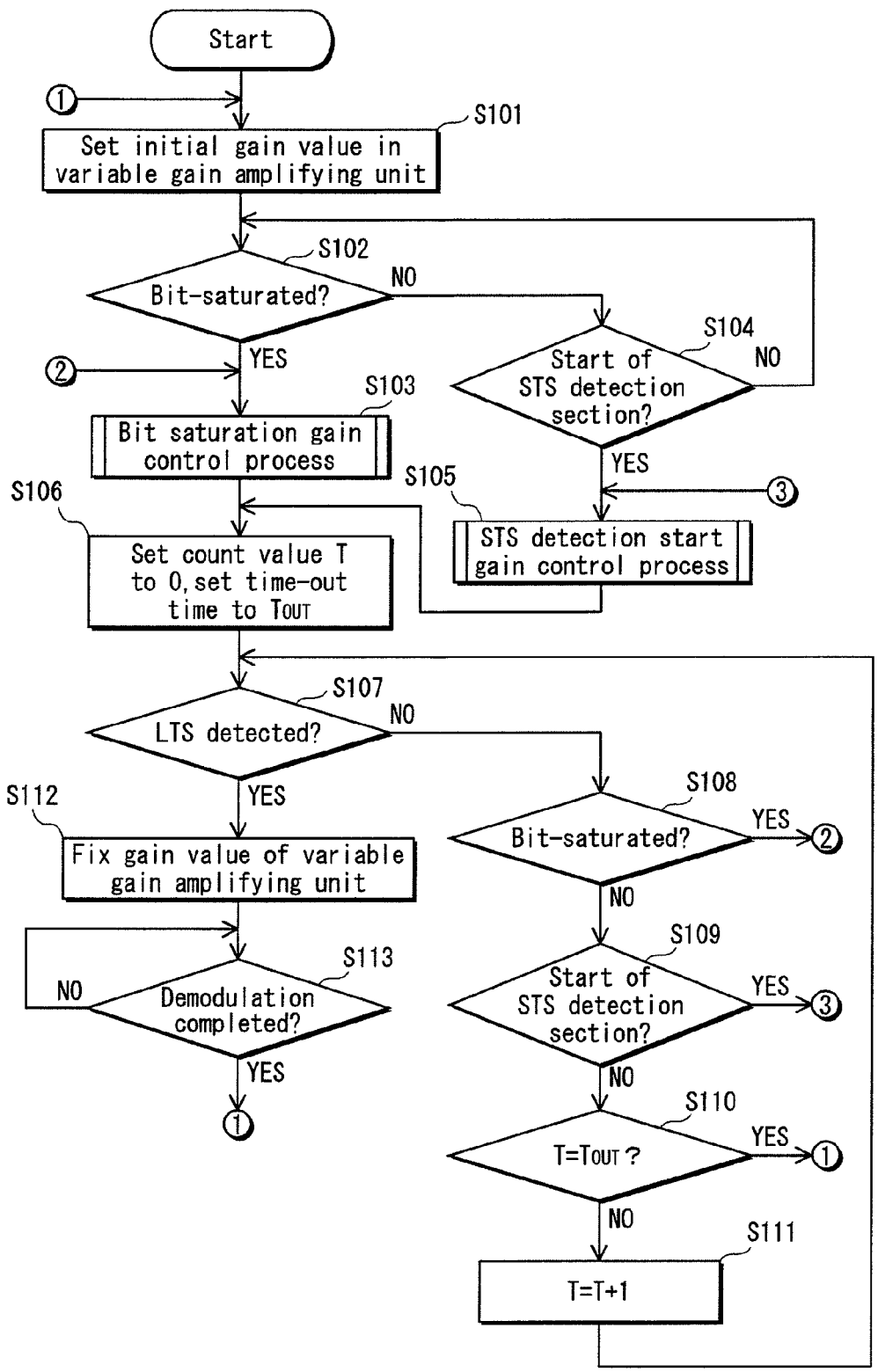
FIG. 6 is a flowchart showing the procedure for the gain control process of the variable gain amplifying unit performed by the AGC unit shown in FIG. 3.

The following describes the gain control process of the variable gain amplifying unit 102 performed by the AGC unit 111 shown in FIG. 3, with reference to FIG. 6. FIG. 6 is a flowchart showing the procedure for the gain control process of the variable gain amplifying unit 102 performed by the AGC unit 111 shown in FIG. 3.

The AGC unit 111 sets a predetermined gain value (initial gain value) in the variable gain amplifying unit 102 (step S101).

Note that an analog signal in the RF band received by the antenna 101 (a received analog signal) is performed with the processes by the variable gain amplifying unit 102, the frequency converting unit 103, and the A/D converting unit 104, and a digital baseband signal is output from the A/D converting unit 104.

The bit saturation detecting unit 106 performs a detection process for detecting a bit saturation of the digital baseband signal output from the A/D converting unit 104, and outputs a bit saturation detection signal reflecting the detection result to the AGC unit 111.

The STS detecting unit 107 performs a detection process for detecting an STS from the digital baseband signal output from the A/D converting unit 104. The STS start detecting unit 108 performs a detection process for detecting the start of the STS detection section based on the STS detection signal output from the STS detecting unit 107, and outputs an STS detection section start signal reflecting the detection result to the AGC unit 111.

The AGC unit 111 judges based on the bit saturation detection signal whether or not the digital baseband signal output from the A/D converting unit 104 has been bit-saturated (step S102). Note that when the bit saturation detection signal is at a high level, the AGC unit 111 judges that the digital baseband signal has been bit-saturated; and when the bit saturation detection signal is at a low level, the AGC unit 111 judges that the digital baseband signal has not been bit-saturated.

Figure 7:
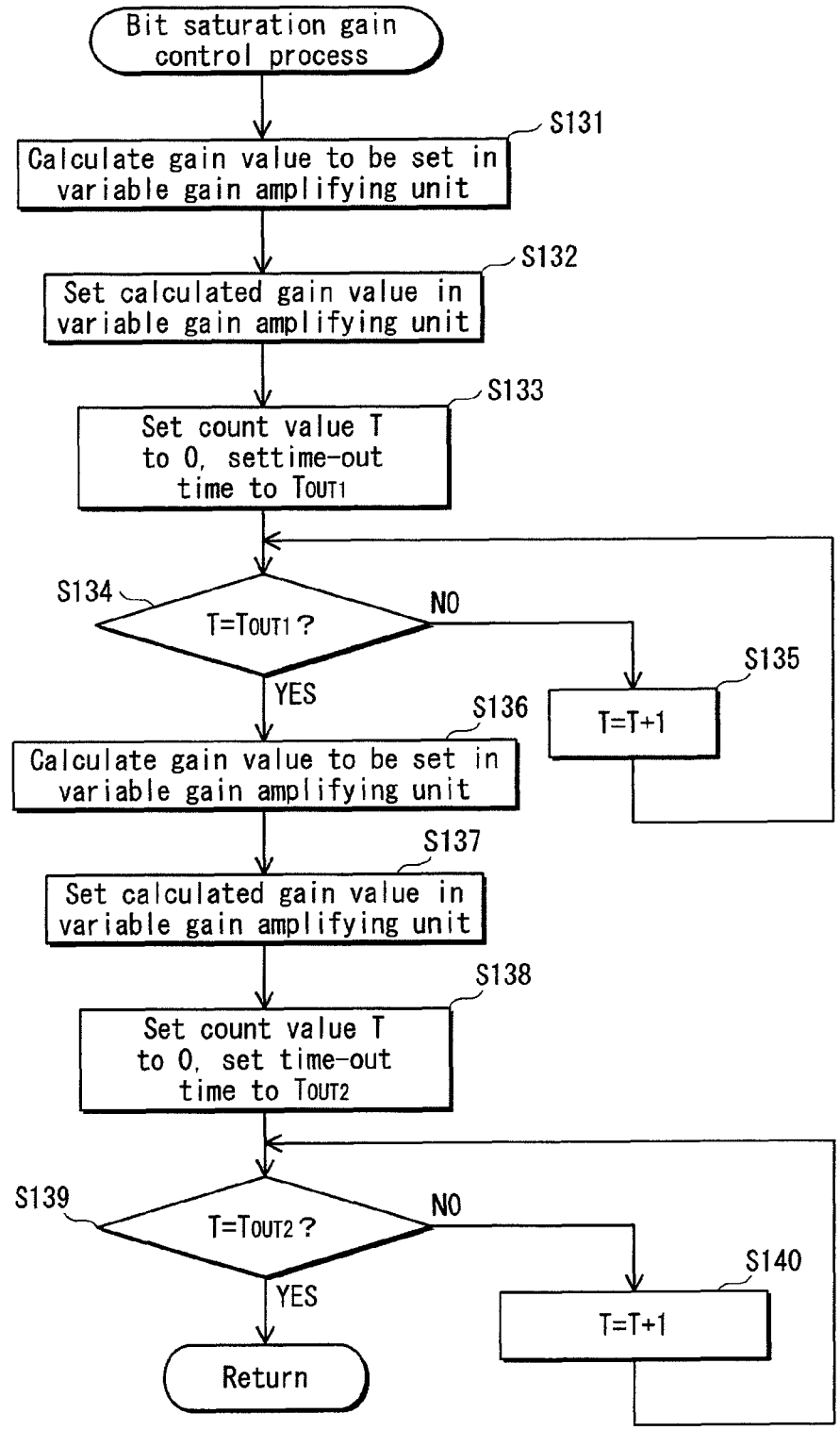
FIG. 7 is a flowchart showing the procedure of the bit saturation gain control process shown in FIG. 6.

When it judges that the digital baseband signal has been bit-saturated (step S102: YES), the AGC unit 111 performs the bit saturation gain control process whose procedures are shown in FIG. 7 in which it performs twice a set of (i) a calculation of a gain value to be set in the variable gain amplifying unit 102 and (ii) setting of the calculated gain value in the variable gain amplifying unit 102 (step S103). After step S103, the control goes to step S106. Note that since the STS detecting unit 107 performs the STS detection process even during and after the execution of the bit saturation gain control process, the STS detecting unit 107 may detect the STS during or after the execution of the bit saturation gain control process.

When it judges that the digital baseband signal has not been bit-saturated (step S102: NO), the AGC unit 111 judges based on the STS detection section start signal whether or not the start of the STS detection section has been detected (step S104). Note that when the STS detection section start signal has changed from a low level to a high level, the AGC unit 111 judges that the start of the STS detection section has been detected.

When it is judged that the start of the STS detection section has not been detected (step S104: NO), the control goes to step S102.

Figure 8:
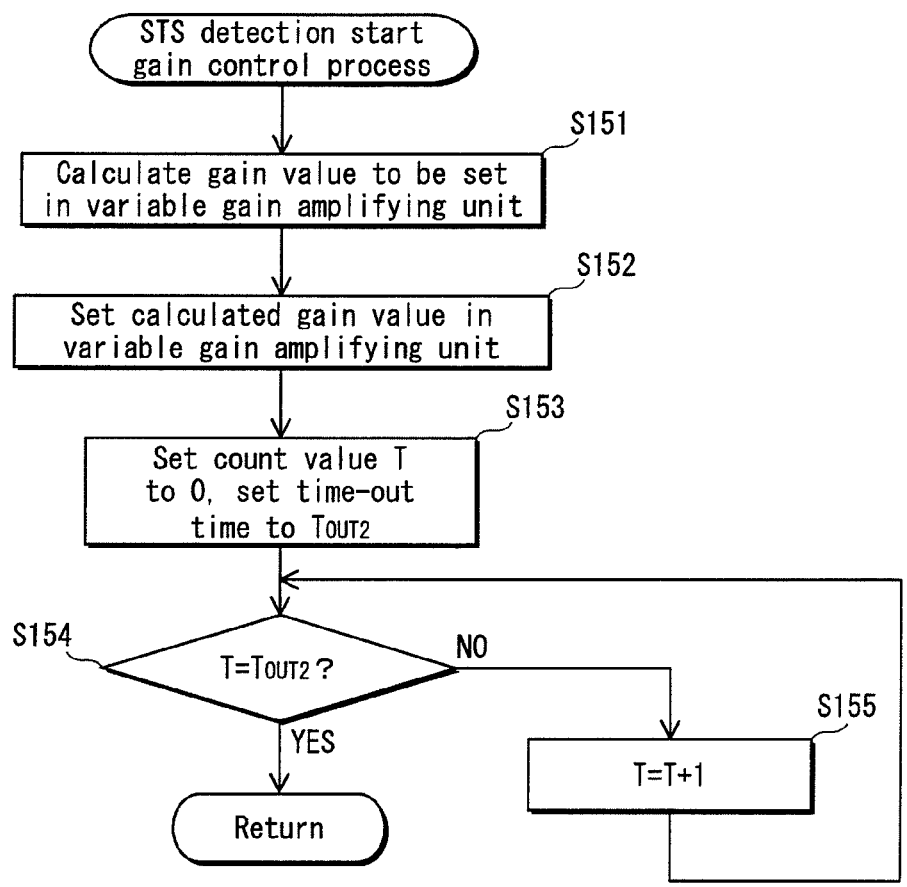
FIG. 8 is a flowchart showing the procedure of the STS detection start gain control process shown in FIG. 6.

When it judges that the start of the STS detection section has been detected (step S104: YES), the AGC unit 111 performs the STS detection start gain control process whose procedures are shown in FIG. 8 in which it performs once the set of (i) a calculation of a gain value to be set in the variable gain amplifying unit 102 and (ii) setting of the calculated gain value in the variable gain amplifying unit 102 (step S105). After step S105, the control goes to step S106. Note that since the STS detecting unit 107 performs the STS detection process even after the execution of the STS detection start gain control process, the STS detecting unit 107 may detect the STS after the execution of the STS detection start gain control process.

The LTS detecting unit 109 performs a detection process for detecting an LTS from the digital baseband signal output from the A/D converting unit 104, and outputs an LTS detection signal reflecting the detection result to the AGC unit 111.

The AGC unit 111 sets a count value T of the time-measuring counter to "0", and sets the time-out time to $T_{OUT}$ (step S106). The time-out time $T_{OUT}$ is set to, for example, a time period that is longer than a time period from a time when a bit saturation attributed to a wireless packet signal destined to the wireless communication device itself (hereinafter, the wireless packet signal destined to the wireless communication device itself is referred to as a "desired packet signal") is detected, or from a time when the start of an STS detection section attributed to a wireless packet signal destined to the wireless communication device itself is detected, to a time when an LTS included in a desired packet signal is detected.

The AGC unit 111 judges based on the LTS detection signal whether or not an LTS has been detected from the digital baseband signal output from the A/D converting unit 104 (step S107). Note that when the LTS detection signal has changed from a low level to a high level, the AGC unit 111 judges that an LTS has been detected.

When it judges that an LTS has not been detected (step S107: NO), the AGC unit 111 judges based on the bit saturation detection signal whether or not the digital baseband signal output from the A/D converting unit 104 has been bit-saturated (step S108). When it is judged that the digital baseband signal has been bit-saturated (step S108: YES), the control goes to step S103.

When it judges that the digital baseband signal has not been bit-saturated (step S108: NO), the AGC unit 111 judges based on the STS detection section start signal whether or not the start of the STS detection section has been detected (step S109). When it is judged that the start of the STS detection section has been detected (step S109: YES), the control goes to step S105.

When it judges that the start of the STS detection section has not been detected (step S109: NO), the AGC unit 111 judges whether or not the count value T of the time-measuring counter has reached the time-out time $T_{OUT}$ (step S110). When it judges that the count value T has not reached the time-out time $T_{OUT}$ (step S110: NO), the AGC unit 111 counts up the count value T of the time-measuring counter by "1" (step S111), and goes to step S107. On the other hand, when the AGC unit 111 judges that the count value T has reached the time-out time $T_{OUT}$ (step S110: YES), the control goes to step S101.

When it judges that an LTS has been detected from the digital baseband signal (step S107: YES), the AGC unit 111 fixes the gain value of the variable gain amplifying unit 102 (step S112).

Note that the demodulation unit 110 demodulates the digital baseband signal output from the A/D converting unit 104, and outputs a demodulation completion signal to the AGC unit 111.

The AGC unit 111 judges based on the demodulation completion signal whether or not the demodulation of the wireless packet signal is completed (step S113). Note that when the demodulation completion signal has changed from a low level to a high level, the AGC unit 111 judges that the demodulation of the wireless packet signal is completed.

The AGC unit 111 continues to perform the process of step S113 while it judges that the demodulation of the wireless packet signal is not completed (step S113: NO). On the other hand, when it judges that the demodulation of the wireless packet signal is completed (step S113: YES), the AGC unit 111 goes to step S101. Note that the AGC unit 111 may go to step S101 after a predetermined time period has passed since completion of demodulation of the wireless packet.

In the above-described judgment processes in steps S102 and S108, the judgment may be in the affirmative due to, for example, a bit saturation attributed to a signal that is not relevant to the wireless communication performed by the wireless communication device itself. Also, in the above-described judgment processes in steps S104 and S109, the judgment may be in the affirmative due to, for example, an erroneous detection of an STS by the wireless communication device 100.

In such a case, when the digital baseband signal is bit-saturated (step S108: YES), the bit saturation gain control process is executed and the gain of the variable gain amplifying unit 102 is readjusted (step S103). This prevents the digital baseband signal output from the A/D converting unit 104 from continuing to be bit-saturated, increasing the ability to detect an STS.

Also, in, for example, the above-described case, when the start of the STS detection section is detected (step S109: YES), an STS detection start gain control process is executed and the gain of the variable gain amplifying unit 102 is readjusted (step S105). This makes it possible to execute processes corresponding to the LTS, SIGNAL symbol, and DATA symbol, based on an output of the variable gain amplifying unit 102 after a gain adjustment based on the STS which is included in the same wireless packet signal that includes the LTS, SIGNAL symbol, and DATA symbol.

Furthermore, in, for example, the above-described case, if no LTS is detected during a time period from the execution of the bit saturation gain control process or from the execution of the STS detection start gain control process until the time-out time $T_{OUT}$ passes (step S110: YES), the initial gain value is set in the variable gain amplifying unit 102 again (step S101). This prevents the gain value from continuing to be set in the variable gain amplifying unit 102 due to a signal that is not relevant to the wireless communication performed by the wireless communication device itself, increasing the ability to detect an STS.

[Bit Saturation Gain Control Process]

FIG. 7 shows the procedure of the bit saturation gain control process (step S103) shown in FIG. 6. It is presumed here that the digital signal power detecting unit 105 detects a value of power of the digital baseband signal output from the A/D converting unit 104, and outputs a digital power value signal indicating the detected value of power to the AGC unit 111.

The AGC unit 111 calculates a gain value to be set in the variable gain amplifying unit 102, based on the value of power of the digital baseband signal indicated by the digital power value signal, and a predetermined reference value of power of the digital baseband signal (hereinafter referred to as "reference digital power value) (step S131), and sets the calculated gain value in the variable gain amplifying unit 102 (step S132).

The AGC unit 111 sets the count value T of the time-measuring counter to "0", and sets the time-out time to "$T_{OUT1}$" (step S133). Note that the time-out time $T_{OUT1}$ and the time-out time $T_{OUT2}$, which will be described later, are set by taking into consideration (i) the time required for the variable gain amplifying unit 102 to start to operate stably by the gain value set by the AGC unit 111 and (ii) the time required for an output signal of the variable gain amplifying unit 102 to be output from the A/D converting unit 104 after being performed with the processes by the frequency converting unit 103 and the A/D converting unit 104.

The AGC unit 111 judges whether or not the count value T of the time-measuring counter has reached the time-out time $T_{OUT1}$ (step S134). When it judges that the count value T of the time-measuring counter has not reached the time-out time $T_{OUT1}$ (step S134: NO), the AGC unit 111 counts up the count value T of the time-measuring counter by "1" (step S135), and goes to step S134. On the other hand, when it judges that the count value T has reached the time-out time $T_{OUT1}$ (step S134: YES), the AGC unit 111 goes to step S136.

When the process of steps S131 through S135 described above is completed, the first round of the gain control of the variable gain amplifying unit 102 performed by the AGC unit 111 is completed.

The AGC unit 111 calculates a gain value to be set in the variable gain amplifying unit 102, based on (i) the value of power of the digital baseband signal indicated by the digital power value signal and (ii) the reference digital power value (step S136), and sets the calculated gain value in the variable gain amplifying unit 102 (step S137).

The AGC unit 111 sets the count value T of the time-measuring counter to "0", and sets the time-out time to "$T_{OUT2}$" (step S138).

The AGC unit 111 judges whether or not the count value T of the time-measuring counter has reached the time-out time $T_{OUT2}$ (step S139). When it judges that the count value T of the time-measuring counter has not reached the time-out time $T_{OUT2}$ (step S139: NO), the AGC unit 111 counts up the count value T of the time-measuring counter by "1" (step S140), and goes to step S139. On the other hand, when it judges that the count value T has reached the time-out time $T_{OUT2}$ (step S139: YES), the AGC unit 111 goes to step S106 shown in FIG. 6.

When the process of steps S136 through S140 described above is completed, the second round of the gain control of the variable gain amplifying unit 102 performed by the AGC unit 111 is completed.

As described above, in the bit saturation gain control process whose procedures are shown in FIG. 7, the AGC unit 111 performs twice a set of (i) a calculation of a gain value to be set in the variable gain amplifying unit 102 and (ii) setting of the calculated gain value in the variable gain amplifying unit 102.

[STS Detection Start Gain Control Process]

FIG. 8 shows the procedure of the STS detection start gain control process (step S105) shown in FIG. 6. It is presumed here that the digital signal power detecting unit 105 detects a value of power of the digital baseband signal output from the A/D converting unit 104, and outputs a digital power value signal indicating the detected value of power to the AGC unit 111.

The AGC unit 111 calculates a gain value to be set in the variable gain amplifying unit 102, based on (1) the value of power of the digital baseband signal indicated by the digital power value signal and (ii) the reference digital power value (step S151), and sets the calculated gain value in the variable gain amplifying unit 102 (step S152).

The AGC unit 111 sets the count value T of the time-measuring counter to "0", and sets the time-out time to "$T_{OUT2}$" (step S153). Note that, although, in this example, the time-out time of the first round of the gain control process in the STS detection start gain control process is equal to the time-out time of the second round of the gain control process in the bit saturation gain control process, the two types of time-out times may not necessarily be the same.

The AGC unit 111 judges whether or not the count value T of the time-measuring counter has reached the time-out time $T_{OUT2}$ (step S154). When it judges that the count value T of the time-measuring counter has not reached the time-out time $T_{OUT2}$ (step S154: NO), the AGC unit 111 counts up the count value T of the time-measuring counter by "1" (step S155), and goes to step S154. On the other hand, when it judges that the count value T has reached the time-out time $T_{OUT2}$ (step S154: YES), the AGC unit 111 goes to step S106 of FIG. 6.

When the process of steps S151 through S155 described above is completed, the first round of the gain control of the variable gain amplifying unit 102 performed by the AGC unit 111 is completed.

As described above, in the STS detection start gain control process whose procedures are shown in FIG. 8, the AGC unit 111 performs once (i) a calculation of a gain value to be set in the variable gain amplifying unit 102 and (ii) setting of the calculated gain value in the variable gain amplifying unit 102.

As understood from FIGS. 7 and 8, the number of times the gain control is performed in the bit saturation gain control process whose procedures are shown in FIG. 7 is larger than the number of times the gain control is performed in the STS detection start gain control process whose procedures are shown in FIG. 8.

<Operation of Wireless Communication Device>

Figure 9:
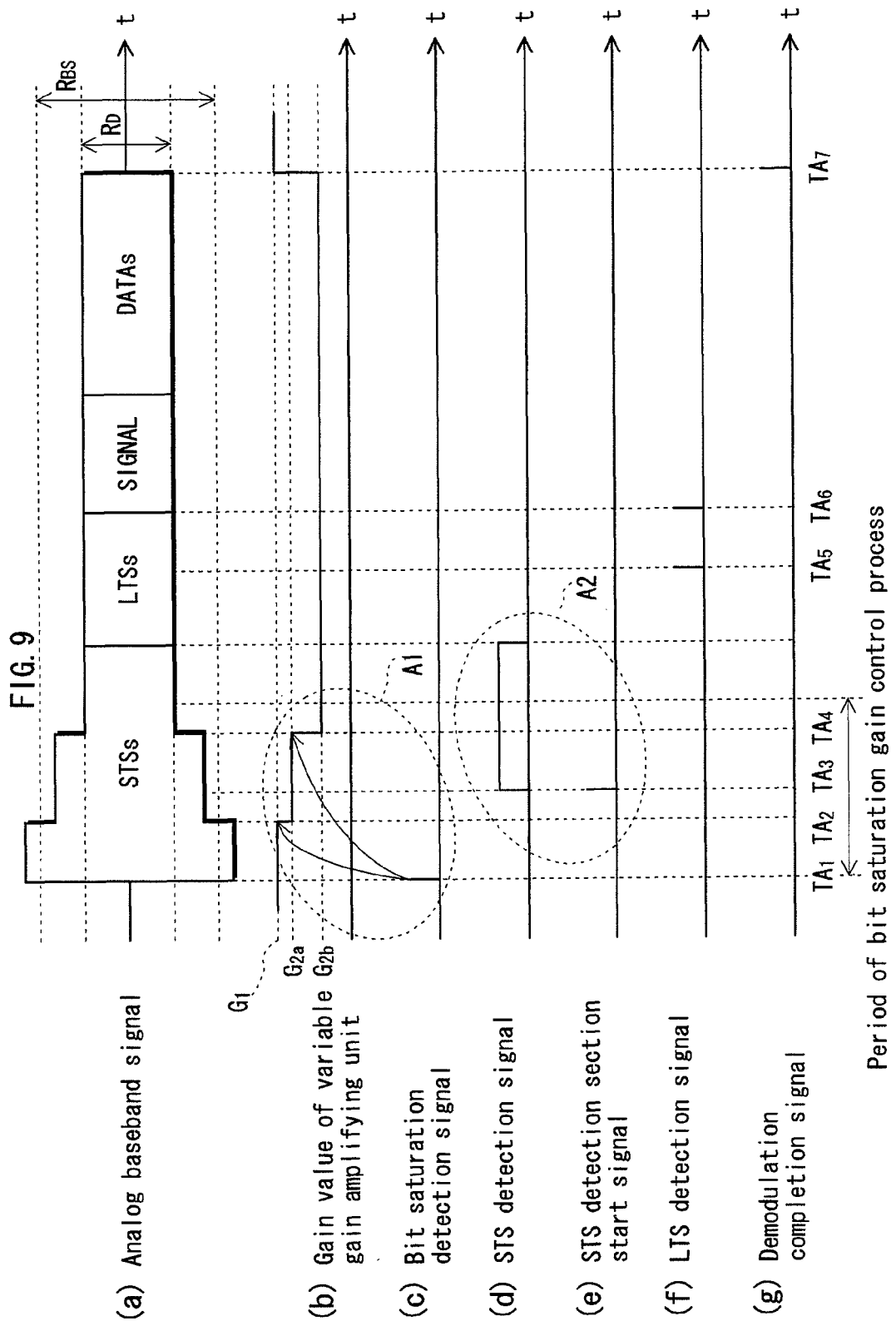
FIG. 9 schematically shows one example of the reception operation performed by the wireless communication device shown in FIG. 3 when a bit saturation occurs.
Figure 10:
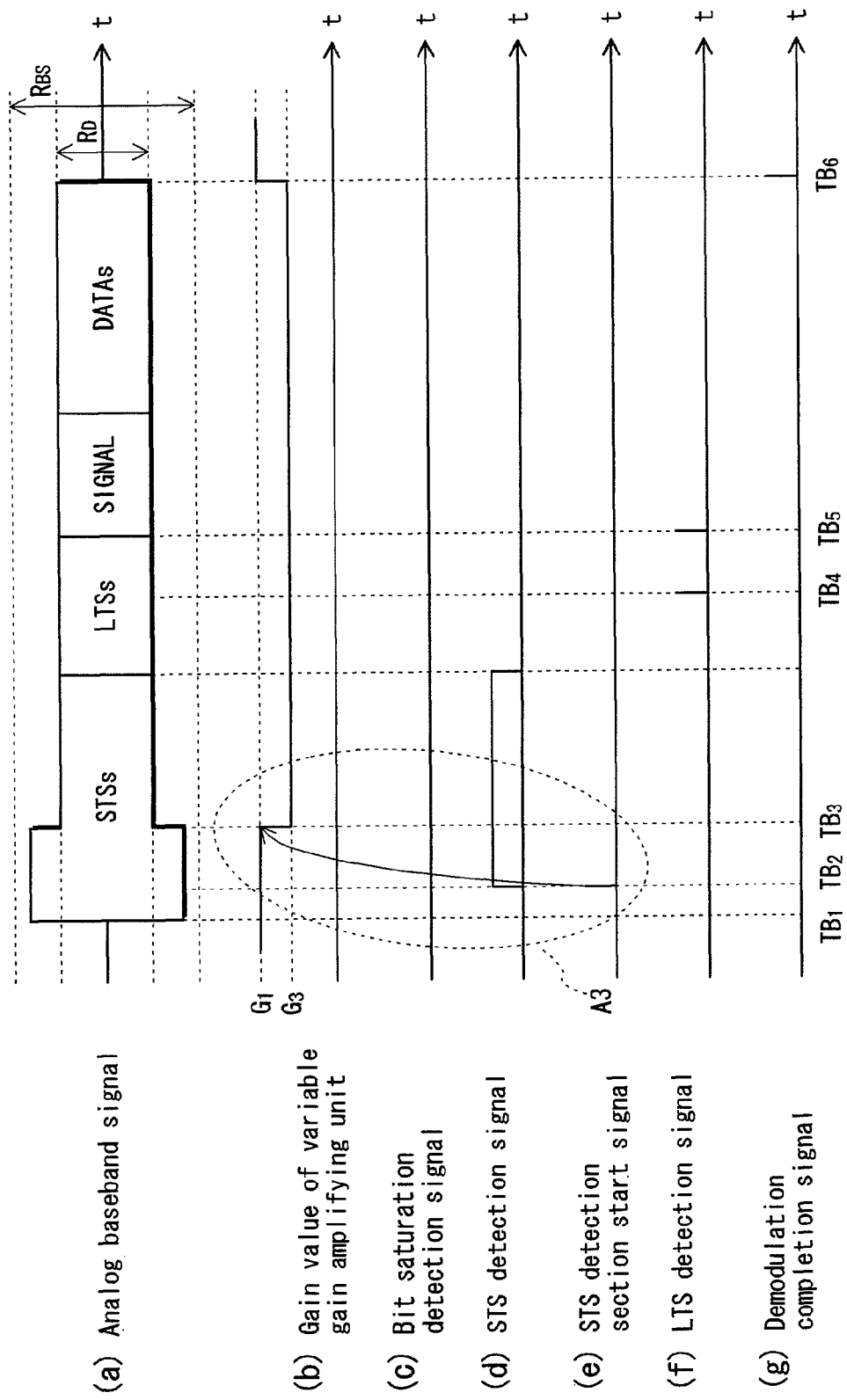
FIG. 10 schematically shows one example of the reception operation performed by the wireless communication device shown in FIG. 3 when it starts the STS detection.

The following describes one example of the reception operation performed by the wireless communication device 100 when a bit saturation occurs, and one example of the reception operation performed by the wireless communication device 100 when the STS detection starts, with reference to FIGS. 9 and 10. Note that, in part (a) of FIGS. 9 and 10, the "STSs" represents the short preamble signal shown in FIG. 2, the "LTSs" represents the long preamble signal shown in FIG. 2, and "DATAs" represents one or more DATA symbols.

Note however that in part (a) of FIGS. 9 and 10, the range $R_{BS}$ indicates the level of the analog baseband signal input into the A/D converting unit 104 by which the digital baseband signal output from the A/D converting unit 104 is not bit-saturated. In other words, when an analog baseband signal that is outside the range $R_{BS}$ is input into the A/D converting unit 104, a digital baseband signal output from the A/D converting unit 104 is bit-saturated.

Also, in part (a) of FIGS. 9 and 10, the both ends of the range $R_D$ indicate the levels of analog baseband signals that are input into the A/D converting unit 104 when the values of power of the digital baseband signals are the reference digital power value.

[Operation when Bit Saturation Occurs]

As shown in part (b) of FIG. 9, the AGC unit 111 sets an initial gain value $G_1$ in the variable gain amplifying unit 102.

An analog signal in the RF band received by the antenna 101 (a received analog signal) is performed with the processes by the variable gain amplifying unit 102, the frequency converting unit 103, and the A/D converting unit 104, and a digital baseband signal is output from the A/D converting unit 104.

The bit saturation detecting unit 106 performs a detection process for detecting a bit saturation of the digital baseband signal output from the A/D converting unit 104, and outputs a bit saturation detection signal reflecting the detection result to the AGC unit 111.

The STS detecting unit 107 performs a detection process for detecting an STS from the digital baseband signal output from the A/D converting unit 104, and outputs an STS detection signal reflecting the detection result to the STS start detecting unit 108. The STS section detecting unit 133 of the STS start detecting unit 108 performs a detection process for detecting an STS detection section based on the STS detection signal input from the STS detecting unit 107. The STS section detecting unit 133 outputs an STS section signal reflecting the detection result to the STS section start detecting unit 134. The STS section start detecting unit 134 performs a detection process for detecting the start of an STS detection section based on the STS section signal, and outputs an STS detection section start signal reflecting the detection result to the AGC unit 111.

Suppose here that, as shown in part (a) of FIG. 9, at time $TA_1$, the analog baseband signal input into the A/D converting unit 104 exceeds the range $R_{BS}$. With this, the digital baseband signal output from the A/D converting unit 104 is bit-saturated, and the bit saturation detecting unit 106 detects a bit saturation of the digital baseband signal, and keeps on outputting a high-level bit-saturation detection signal for the pulse period (refer to a portion encircled by a dotted line A1 in FIG. 9).

The AGC unit 111, upon detecting a change of the bit-saturation detection signal to a high level, starts the bit saturation gain control process whose procedures are shown in FIG. 7, and performs the first round of the gain control by performing the process of steps S131 through S135. After this, at time $TA_2$, the gain value of the variable gain amplifying unit 102 changes from the initial gain value $G_1$ to a gain value $G_{2a}$ (refer to a portion encircled by a dotted line A1 in FIG. 9).

In the example shown in FIG. 9, the analog baseband signal input into the A/D converting unit 104 becomes within the range $R_{BS}$ by the operation in the first round of gain control. The STS detecting unit 107 starts detecting the STS from the digital baseband signal output from the A/D converting unit 104, and keeps on outputting a high-level STS detection signal for the pulse period continuously in sequence at the interval of symbol time $T_{STS}$. Following this, at time $TA_3$, the STS section detecting unit 133 changes the STS section signal from a low level to a high level. After the STS section signal changes from a low level to a high level, the STS section start detecting unit 134 keeps on outputting a high-level STS detection section start signal to the AGC unit 111 for the pulse period. Since the current time is in the bit saturation gain control process, the AGC unit 111 does not perform the gain control of the variable gain amplifying unit 102 triggered by the detection of the start of the STS detection section (refer to a portion encircled by a dotted line A2 in FIG. 9).

The AGC unit 111 performs the second round of the gain control by performing the process of steps S136 through S140 shown in FIG. 7. After this, at time $TA_4$, the gain value of the variable gain amplifying unit 102 changes from the gain value $G_{2a}$ to a gain value $G_{2b}$ (refer to a portion encircled by a dotted line A1 in FIG. 9). Here, since the number of gain controls in the bit saturation gain control process is two, the AGC unit 111 ends the bit saturation gain control process.

Note that, even after the execution of the bit saturation gain control process is ended, the AGC unit 111 judges, based on the bit saturation detection signal input from the bit saturation detecting unit 106, whether or not the digital baseband signal output from the A/D converting unit 104 has been bit-saturated, and judges, based on the STS detection section start signal input from the STS section start detecting unit 134 of the STS start detecting unit 108, whether or not the start of a new STS detection section has been detected (refer to steps S106 to S111 shown in FIG. 6).

The LTS detecting unit 109 performs the process for detecting the LTS from the digital baseband signal input from the A/D converting unit 104, and outputs an LTS detection signal reflecting the detection result to the AGC unit 111. The wireless communication device 100 performs a channel estimation based on (i) the digital baseband signal output from the A/D converting unit 104 in correspondence with the LTS and (ii) the reference signal based on the LTS.

At time $TA_5$, when the LTS detection signal input from the LTS detecting unit 109 has changed from a low level to a high level, the AGC unit 111 fixes the gain value of the variable gain amplifying unit 102 to a gain value $G_{2b}$. Note that since there are two LTSs, even at time $TA_6$, the LTS detection signal is at a high level for the pulse period.

The demodulation unit 110 equalizes digital baseband signals output from the A/D converting unit 104 in correspondence with the SIGNAL symbol and the DATA symbol based on the channel estimation result, and demaps the equalized digital baseband signals. The demodulation unit 110 judges whether or not demodulation of wireless packet signal is completed, based on the data length included in the SIGNAL symbol, and outputs a demodulation completion signal reflecting the judgment result to the AGC unit 111.

At time $TA_7$, the demodulation unit 110 completes the demodulation of the wireless packet signal, and starts outputting a high-level demodulation completion signal to the AGC unit 111 for the pulse period. On recognizing that the demodulation completion signal has changed from a low level to a high level, the AGC unit 111 sets the gain value of the variable gain amplifying unit 102 to the initial gain value $G_1$.

[Operation Example of STS Detection Start]

As shown in part (b) of FIG. 10, the AGC unit 111 sets the initial gain value $G_1$ in the variable gain amplifying unit 102.

The analog signal (received analog signal) in the RF band received by the antenna 101 is performed with the processes performed by the variable gain amplifying unit 102, the frequency converting unit 103 and the A/D converting unit 104, and a digital baseband signal is output from the A/D converting unit 104.

The bit saturation detecting unit 106 performs a detection process for detecting a bit saturation of the digital baseband signal output from the A/D converting unit 104, and outputs a bit saturation detection signal reflecting the detection result to the AGC unit 111.

The STS detecting unit 107 performs a detection process for detecting an STS from the digital baseband signal output from the A/D converting unit 104, and outputs an STS detection signal reflecting the detection result to the STS start detecting unit 108. The STS section detecting unit 133 of the STS start detecting unit 108 performs a detection process for detecting an STS detection section based on the STS detection signal input from the STS detecting unit 107, and outputs an STS section signal reflecting the detection result to the STS section start detecting unit 134. The STS section start detecting unit 134 performs a detection process for detecting the start of an STS detection section based on the STS section signal, and outputs an STS detection section start signal reflecting the detection result to the AGC unit 111.

Suppose here that, as shown in part (a) of FIG. 10, at time $TB_1$, a wireless packet signal is received such that the analog baseband signal input into the A/D converting unit 104 is within the range $R_{BS}$. The STS detecting unit 107 starts detecting an STS from the digital baseband signal output from the A/D converting unit 104, and keeps on outputting a high-level STS detection signal for the pulse period continuously in sequence at the interval of symbol time $T_{STS}$. With this, at time $TB_2$, the STS section detecting unit 133 changes the STS section signal from a low level to a high level. Upon recognizing this, the STS section start detecting unit 134 outputs a high-level STS detection section start signal to the AGC unit 111 for the pulse period (refer to a portion encircled by a dotted line A3 in FIG. 10).

The AGC unit 111, when the STS detection section start signal has changed from a high level to a low level, starts the STS detection start gain control process whose procedures are shown in FIG. 8, and performs the first round of gain control by executing the process of steps S151 through S155. With this, at time $TB_3$, the gain value of the variable gain amplifying unit 102 changes from the initial gain value $G_1$ to a gain value $G_3$ (refer to a portion encircled by a dotted line A3 in FIG. 10). Here, since the number of gain controls in the STS detection start gain control process is one, the AGC unit 111 ends the STS detection start gain control process.

Note that, even after the execution of the STS detection start gain control process is ended, the AGC unit 111 judges, based on the bit saturation detection signal input from the bit saturation detecting unit 106, whether or not the digital baseband signal output from the A/D converting unit 104 has been bit-saturated, and judges, based on the STS detection section start signal input from the STS section start detecting unit 134 of the STS start detecting unit 108, whether or not the start of a new STS detection section has been detected (refer to steps S106 to S111 shown in FIG. 6).

The LTS detecting unit 109 performs the process for detecting the LTS from the digital baseband signal input from the A/D converting unit 104, and outputs an LTS detection signal reflecting the detection result to the AGC unit 111. The wireless communication device 100 performs a channel estimation based on (i) the digital baseband signal output from the A/D converting unit 104 in correspondence with the LTS and (ii) the reference signal based on the LTS.

At time $TB_4$, when the LTS detection signal input from the LTS detecting unit 109 has changed from a low level to a high level, the AGC unit 111 fixes the gain value of the variable gain amplifying unit 102 to again value $G_3$. Note that since there are two LTSs, even at time $TB_5$, the LTS detection signal is at a high level for the pulse period.

The demodulation unit 110 equalizes digital baseband signals output from the A/D converting unit 104 in correspondence with the SIGNAL symbol and the DATA symbol based on the channel estimation result, and demaps the equalized digital baseband signals. The demodulation unit 110 judges whether or not demodulation of wireless packet signal is completed, based on the data length included in the SIGNAL symbol, and outputs a demodulation completion signal reflecting the judgment result to the AGC unit 111.

At time $TB_6$, the demodulation unit 110 judges that the demodulation of the wireless packet signal is completed, and starts to output a high-level demodulation completion signal to the AGC unit 111 for the pulse period. On recognizing that the demodulation completion signal has changed from a low level to a high level, the AGC unit 111 sets the gain value of the variable gain amplifying unit 102 to the initial gain value $G_1$.

<<Embodiment 2>>

The following describes Embodiment 2, the second embodiment of the present invention, with reference to the attached drawings.

The wireless communication device 100 of Embodiment 1 is provided with the variable gain amplifying unit 102 whose gain is controlled based on the power value of the digital baseband signal.

In contrast to this, the wireless communication device of Embodiment 2 is further provided with a variable gain amplifying unit ("low noise amplifying unit" is used in Embodiment 2) whose gain is controlled based on the power value of the received analog signal, as well as the variable gain amplifying unit whose gain is controlled based on the power value of the digital baseband signal.

<Structure of Wireless Communication Device>

Figure 11:
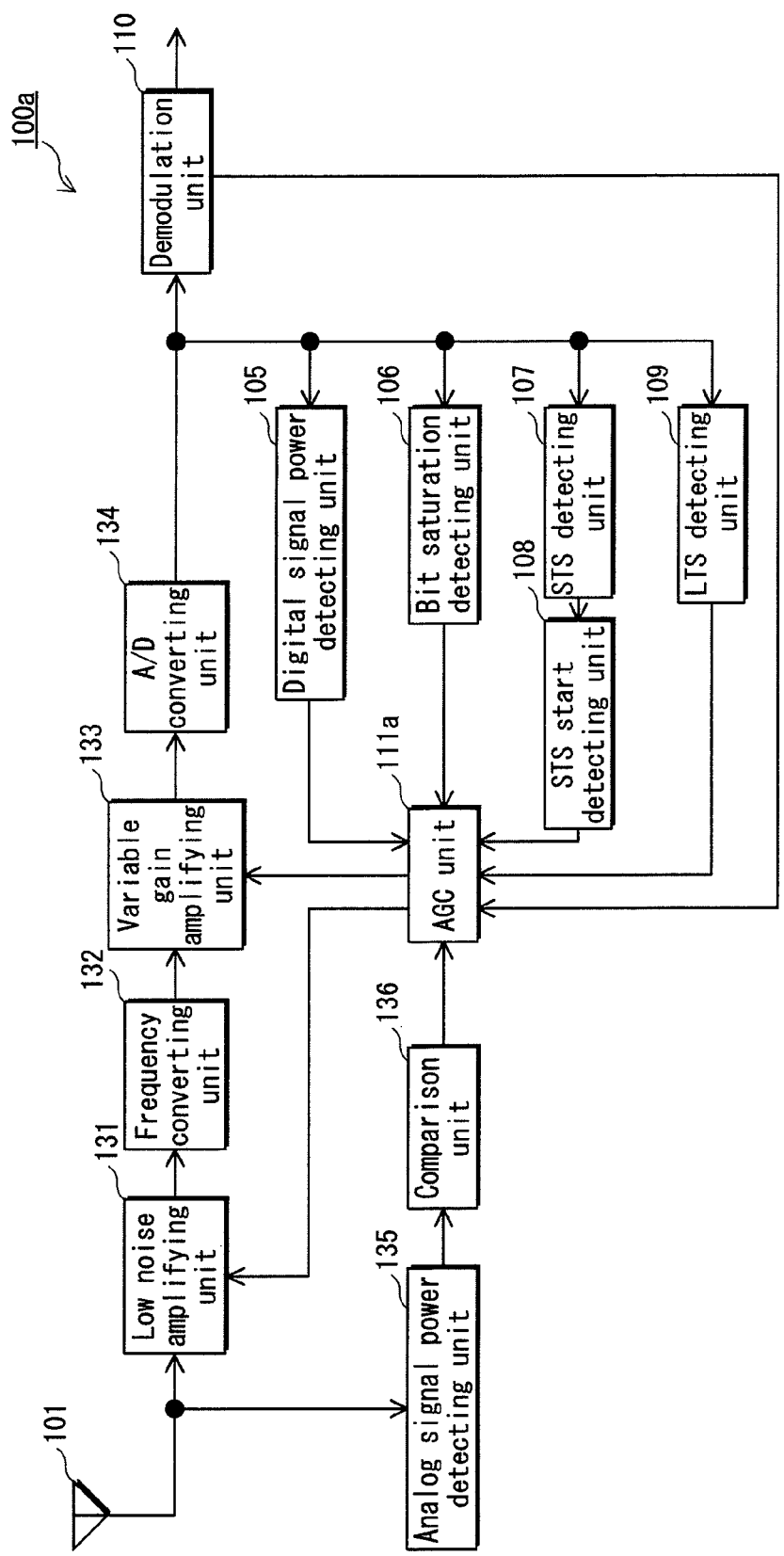
FIG. 11 shows the structure of the wireless communication device in Embodiment 2.

The following explains the structure of a wireless communication device 100a of Embodiment 2 with reference to FIG. 11. FIG. 11 shows the structure of the wireless communication device 100a. Note that the structural elements of Embodiment 2 that are substantially the same as the corresponding ones in Embodiment 1 are assigned the same reference numbers as the corresponding ones in Embodiment 1, and description thereof is omitted since description of the corresponding ones in Embodiment 1 is applicable thereto.

The wireless communication device 100a includes the antenna 101, a low noise amplifying unit 131, a frequency converting unit 132, a variable gain amplifying unit 133, an A/D converting unit 134, the digital signal power detecting unit 105, the bit saturation detecting unit 106, the STS detecting unit 107, the STS start detecting unit 108, the LTS detecting unit 109, an analog signal power detecting unit 135, a comparison unit 136, the demodulation unit 110, and an AGC unit 111a.

[Low Noise Amplifying Unit 131]

The low noise amplifying unit 131 has a variable gain value, amplifies the received analog signal in the RF band received by the antenna 101, and outputs the analog signal in the RF band after the amplification to the frequency converting unit 132. Note that the gain of the low noise amplifying unit 131 is controlled by the AGC unit 111a to either of two gain values. Hereinafter, one of the two gain values having a larger value is referred to as "high gain control value", and the other having a smaller value is referred to as "low gain control value".

[Frequency Converting Unit 132]

The frequency converting unit 132 converts in frequency the analog signal in the RF band after the amplification received from the low noise amplifying unit 131, into an analog baseband signal, and outputs the analog baseband signal to the variable gain amplifying unit 133.

[Variable Gain Amplifying Unit 133]

The variable gain amplifying unit 133 has a variable gain value, amplifies the analog baseband signal input from the frequency converting unit 132, and outputs the analog baseband signal after the amplification to the A/D converting unit 134. Note that the gain of the variable gain amplifying unit 133 is controlled by the AGC unit 111a.

[A/D Converting Unit 134]

The A/D converting unit 134 has a predetermined dynamic range for input, and converts the analog baseband signal after the amplification, which is input from the variable gain amplifying unit 133, into a digital signal of a predetermined number of bits by a predetermined sampling frequency (digital baseband signal). The A/D converting unit 134 outputs the digital baseband signal to the digital signal power detecting unit 105, the bit saturation detecting unit 106, the STS detecting unit 107, the LTS detecting unit 109, and the demodulation unit 110.

[Analog Signal Power Detecting Unit 135]

The analog signal power detecting unit 135 detects a value of power of the received analog signal received by the antenna 101, and outputs an analog power value signal indicating the detected value of power to the comparison unit 136.

[Comparison Unit 136]

In the following description, when the value of power of the received analog signal exceeds a predetermined power value (hereinafter referred to as "power threshold value"), it is represented as "the received analog signal is strong input".

The comparison unit 136 prestores the power threshold value, and compares the power threshold value with the power value of the received analog signal that is indicated by the analog power value signal input from the analog signal power detecting unit 135. When the power value of the received analog signal exceeds the power threshold value, the comparison unit 136 judges that the received analog signal is strong input, and outputs a high-level strong input judgment signal to the AGC unit 111a. On the other hand, when the power value of the received analog signal is equal to or lower than the power threshold value, the comparison unit 136 judges that the received analog signal is not strong input, and outputs a low-level strong input judgment signal to the AGC unit 111a.

[AGC Unit 111a]

Figure 12:
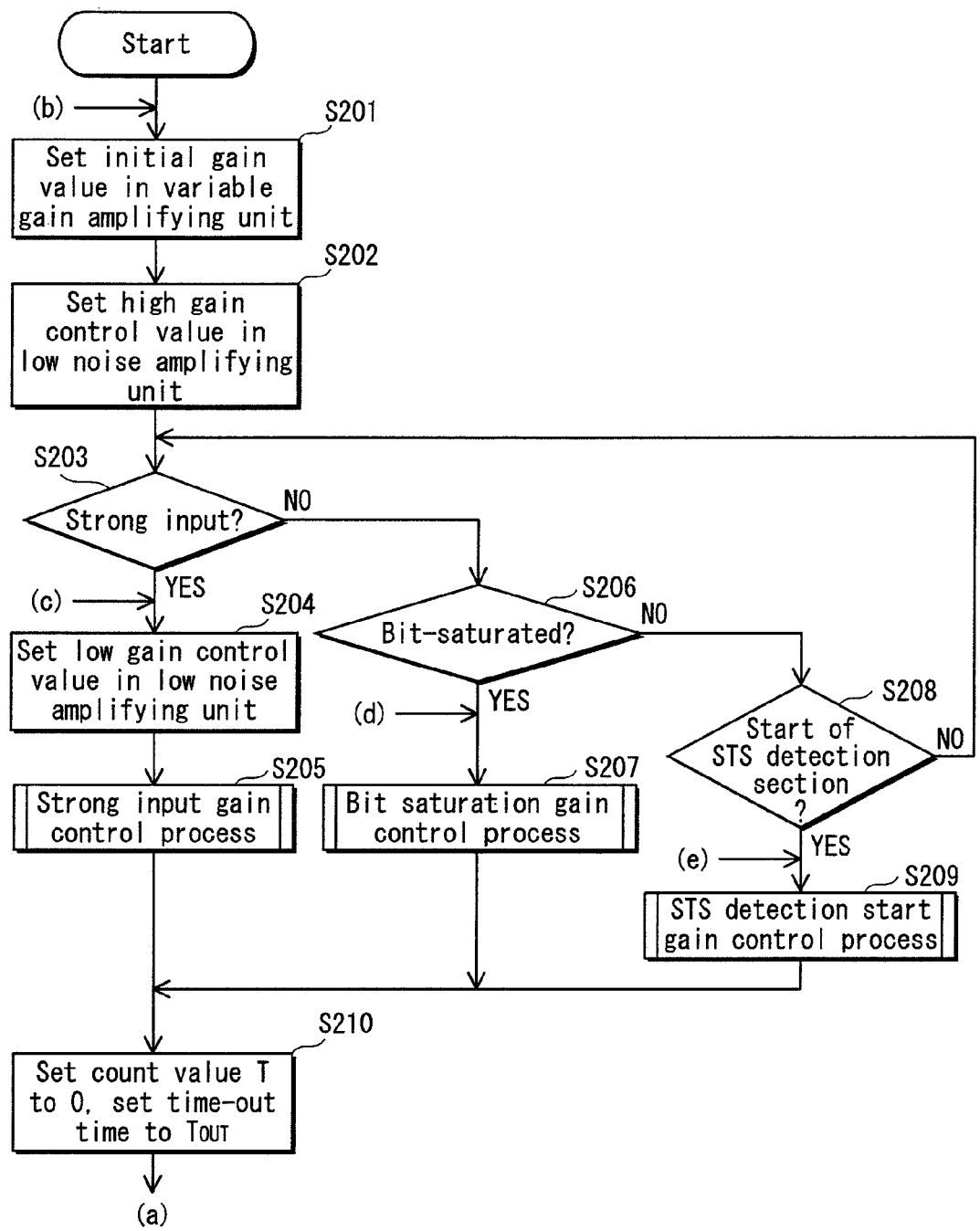
FIG. 12 is a flowchart showing the procedure for the gain control process of the low noise amplifying unit and the variable gain amplifying unit performed by the AGC unit shown in FIG. 11.
Figure 13:
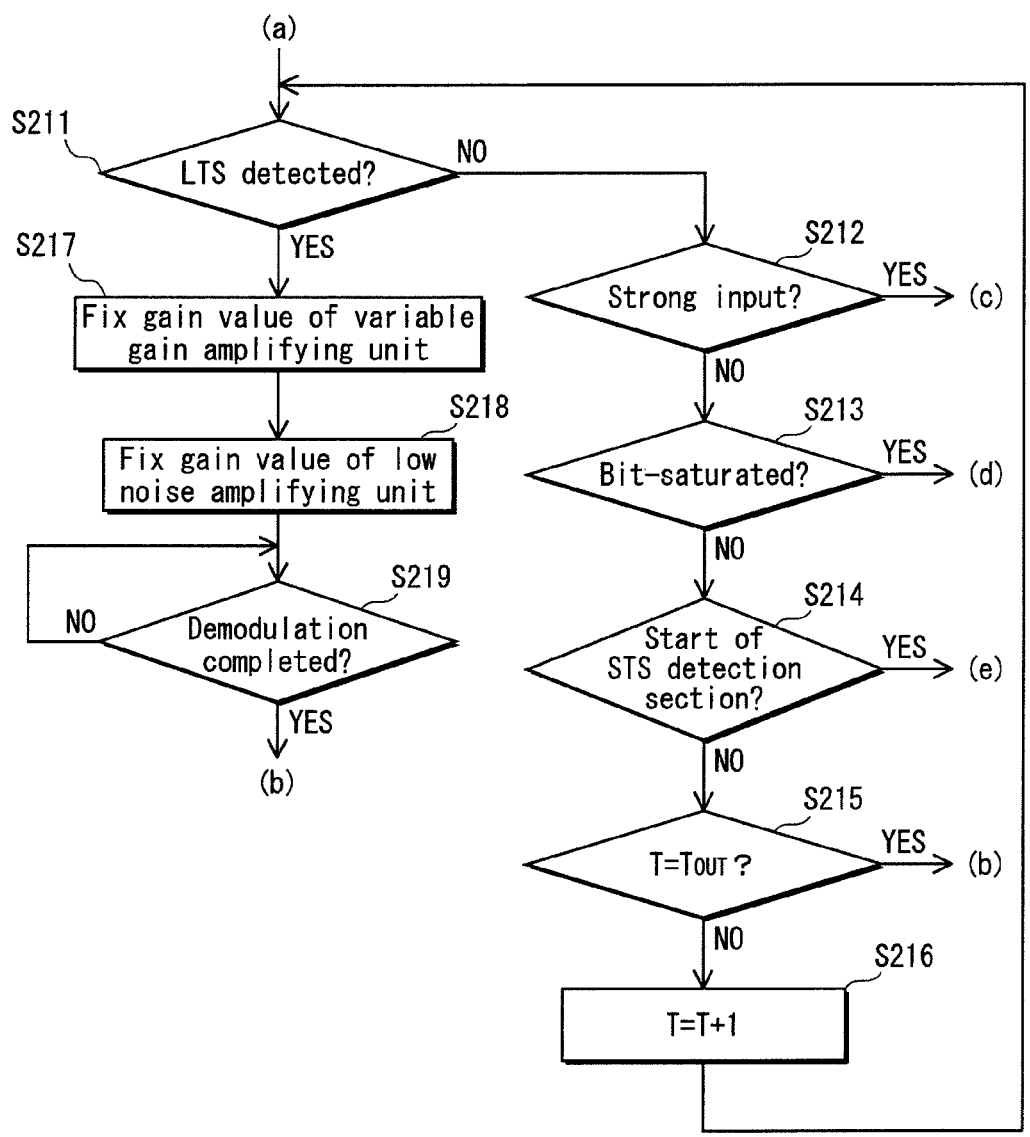
FIG. 13 is a flowchart showing the procedure for the gain control process of the low noise amplifying unit and the variable gain amplifying unit performed by the AGC unit shown in FIG. 11.

The AGC unit 111a sets a high gain control value in the low noise amplifying unit 131 as an initial setting, and performs the gain control of the low noise amplifying unit 131 based on the strong input judgment signal input from the comparison unit 136, and the demodulation completion signal input from the demodulation unit 110 (see FIGS. 12 to 13).

The AGC unit 111a sets a predetermined gain value in the variable gain amplifying unit 133, and performs the gain control of the variable gain amplifying unit 133 based on the digital power value signal input from the digital signal power detecting unit 105. The AGC unit 111a judges whether or not to start the gain control of the variable gain amplifying unit 102, based on the bit saturation detection signal input from the bit saturation detecting unit 106, the STS detection section start signal input from the STS start detecting unit 108, the strong input judgment signal input from the comparison unit 136, the LTS detection signal input from the LTS detecting unit 109, and the demodulation completion signal input from the demodulation unit 110 (see FIGS. 12 to 13, FIGS. 7 to 8 and FIG. 14).

Note however that the AGO unit 111a may start performing the gain control of the variable gain amplifying unit 133 when the bit saturation detection signal is at a high level (when the digital baseband signal is bit-saturated). In this case, the AGC unit 111a performs the calculation of a gain value to be set in the variable gain amplifying unit 133 and the setting of the calculated gain value in the variable gain amplifying unit 133, respectively twice (see FIG. 7).

Similarly, the AGC unit 111a may start performing the gain control of the variable gain amplifying unit 133 when the strong input judgment signal is at a high level (when the received analog signal is strong input). In this case, the AGC unit 111a performs the calculation of a gain value to be set in the variable gain amplifying unit 133 and the setting of the calculated gain value in the variable gain amplifying unit 133, respectively twice (see FIG. 14).

On the other hand, the AGC unit 111a may start performing the gain control of the variable gain amplifying unit 133 when the STS detection section start signal changes from a low level to a high level (when the STS detection section is started). In this case, the AGC unit 111 performs the calculation of a gain value to be set in the variable gain amplifying unit 133 and the setting of the calculated gain value in the variable gain amplifying unit 133, once (see FIG. 8).

When the received analog signal is strong input, there is a possibility that the digital baseband signal output from the A/D converting unit 134 has been bit-saturated even if the gain value of the low noise amplifying unit 131 has been changed from a high gain control value to a low gain control value. In view of this, the gain control times number for gain controls triggered by the strong input judgment signal being at a high level is larger than the gain control times number for gain controls triggered by the change of the STS detection section start signal from a low level to a high level.

(Operation of AGC Unit 111a)

The following describes the gain control process of the low noise amplifying unit 131 and the variable gain amplifying unit 133 performed by the AGC unit 111a shown in FIG. 11, with reference to FIGS. 12 and 13. FIGS. 12 and 13 are flowcharts showing the procedure for the gain control process of the low noise, amplifying unit 131 and the variable gain amplifying unit 133 performed by the AGC unit 111a shown in FIG. 11.

The AGC unit 111a sets a predetermined gain value (initial gain value) in the variable gain amplifying unit 133 (step S201), and sets a high gain control value in the low noise amplifying unit 131 (step S202).

Note that an analog signal in the RF band received by the antenna 101 (a received analog signal) is performed with the processes executed by the low noise amplifying unit 131, the frequency converting unit 132, the variable gain amplifying unit 133, and the A/D converting unit 134, and a digital baseband signal is output from the A/D converting unit 134.

The analog signal power detecting unit 135 detects a value of power of the analog signal in the RF band received by the antenna 101 (received analog signal). The comparison unit 136 compares the power threshold value with the power value of the received analog signal that is indicated by the analog power value signal input from the analog signal power detecting unit 135, and outputs a strong input judgment signal reflecting the comparison result to the AGC unit 111a.

The bit saturation detecting unit 106 performs a detection process for detecting a bit saturation of the digital baseband signal output from the A/D converting unit 134, and outputs a bit saturation detection signal reflecting the detection result to the AGC unit 111a.

The STS detecting unit 107 performs a detection process for detecting an STS from the digital baseband signal output from the A/D converting unit 134. The STS start detecting unit 108 performs a detection process for detecting the start of the STS detection section based on the STS detection signal output from the STS detecting unit 107, and outputs an STS detection section start signal reflecting the detection result to the AGC unit 111a.

The AGC unit 111a judges based on the strong input judgment signal whether or not the received analog signal is strong input (step S203). Note that the AGC unit 111a judges that the received analog signal is strong input when the strong input judgment signal is at a high level, and judges that the received analog signal is not strong input when the strong input judgment signal is at a low level.

Figure 14:
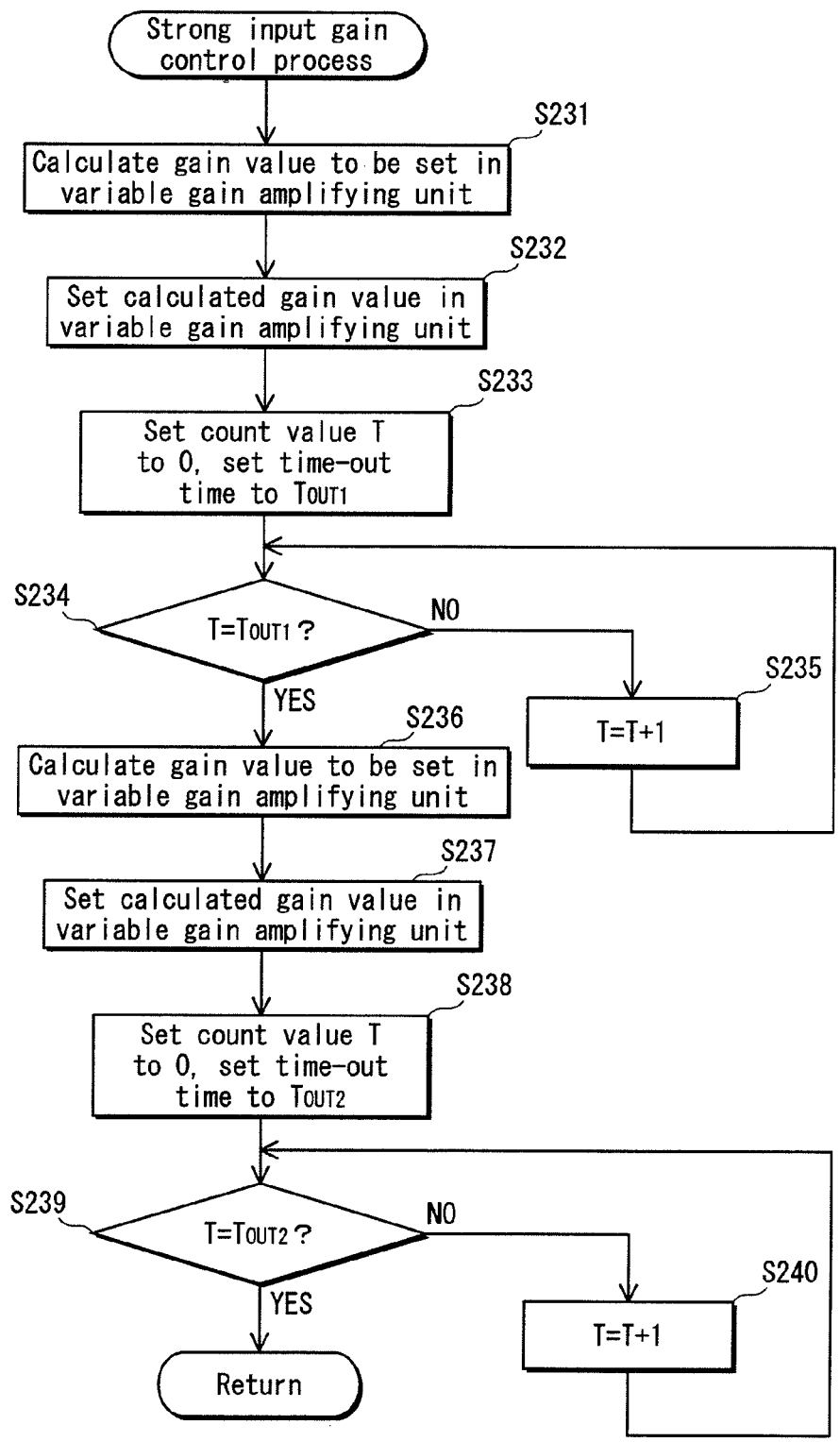
FIG. 14 is a flowchart showing the procedure of the strong input gain control process shown in FIG. 12.

When the AGC unit 111a judges that the received analog signal is strong input (step S203: YES), the AGC unit 111a sets the low gain control value in the low noise amplifying unit 131 (step S204). The AGC unit 111a then performs the strong input gain control process whose procedures are shown in FIG. 14 in which it performs twice the set of (i) the calculation of a gain value to be set in the variable gain amplifying unit 133 and (ii) the setting of the calculated gain value in the variable gain amplifying unit 133 (step S205), and goes to step S210. Note that since the STS detecting unit 107 performs the STS detection process even during and after the execution of the strong input gain control process, the STS detecting unit 107 may detect the STS during or after the execution of the strong input gain control process.

When the AGC unit 111a judges that the received analog signal is not strong input (step S203: NO), the AGC unit 111a judges based on the bit saturation detection signal whether or not the digital baseband signal output from the A/D converting unit 134 has been bit-saturated (step S206).

When it judges that the digital baseband signal has been bit-saturated (step S206: YES), the AGC unit 111a performs the bit saturation gain control process whose procedures are substantially the same as those shown in FIG. 7 in which it performs twice a set of (i) a calculation of a gain value to be set in the variable gain amplifying unit 133 and (ii) setting of the calculated gain value in the variable gain amplifying unit 133 (step S207). After step S207, the control goes to step S210. Note that since the STS detecting unit 107 performs the STS detection process even during and after the execution of the bit saturation gain control process, the STS detecting unit 107 may detect the STS during or after the execution of the bit saturation gain control process.

When it judges that the digital baseband signal has not been bit-saturated (step S206: NO), the AGC unit 111a judges based on the STS detection section start signal whether or not the start of the STS detection section has been detected (step S208). When the AGC unit 111a judges that the start of the STS detection section has not been detected (step S208: NO), the control goes to step S203.

When the AGC unit 111a judges that the start of the STS detection section has been detected (step S208: YES), the AGC unit 111a performs the STS detection start gain control process whose procedures are substantially the same as those shown in FIG. 8 in which it performs once the set of (i) a calculation of a gain value to be set in the variable gain amplifying unit 133 and (ii) setting of the calculated gain value in the variable gain amplifying unit 133 (step S209). After step S209, the control goes to step S210. Note that since the STS detecting unit 107 performs the STS detection process even after the execution of the STS detection start gain control process, the STS detecting unit 107 may detect the STS after the execution of the STS detection start gain control process.

Note that the LTS detecting unit 109 performs a detection process for detecting an LTS from the digital baseband signal output from the A/D converting unit 134, and outputs an LTS detection signal reflecting the detection result to the AGC unit 111a.

The AGC unit 111a sets the count value T of the time-measuring counter to "0", and sets the time-out time to $T_{OUT}$ (step S210). Note that the time-out time $T_{OUT}$ is set to, for example, a time period that is longer than a time period from a time when the received analog signal is judged to be strong input based on a desired packet signal, or from a time when a bit saturation attributed to a desired packet signal is detected, or from a time when the start of an STS detection section attributed to a desired packet signal is detected, to a time when an LTS included in a desired packet signal is detected.

The AGC unit 111a judges based on the LTS detection signal whether or not an LTS has been detected from the digital baseband signal output from the A/D converting unit 134 (step S211).

When it judges that an LTS has not been detected (step S211: NO), the AGC unit 111a judges based on the strong input judgment signal whether or not the received analog signal is strong input (step S212). When the AGC unit 111a judges that the received analog signal is strong input (step S212: YES), the control goes to step S204.

When the AGC unit 111a judges that the received analog signal is not strong input (step S212: NO), the AGC unit 111a judges based on the bit saturation detection signal whether or not the digital baseband signal output from the A/D converting unit 134 has been bit-saturated (step S213). When the AGC unit 111a judges that the digital baseband signal has been bit-saturated (step S213: YES), the control goes to step S207.

When it judges that the digital baseband signal has not been bit-saturated (step S213: NO), the AGC unit 111a judges based on the STS detection section start signal whether or not the start of the STS detection section has been detected (step S214). When the AGC unit 111a judges that the start of the STS detection section has been detected (step S214: YES), the control goes to step S209.

When it judges that the start of the STS detection section has not been detected (step S214: NO), the AGC unit 111a judges whether or not the count value T of the time-measuring counter has reached the time-out time $T_{OUT}$ (step S215). When it judges that the count value T has not reached the time-out time $T_{OUT}$ (step S215: NO), the AGC unit 111a counts up the count value T of the time-measuring counter by "1" (step S216), and goes to step S211. On the other hand, when the AGC unit 111a judges that the count value T has reached the time-out time $T_{OUT}$ (step S215: YES), the control goes to step S201.

When it judges that an LTS has been detected from the digital baseband signal (step S211: YES), the AGC unit 111a fixes the gain value of the variable gain amplifying unit 133 (step S217), and fixes the gain value of the low noise amplifying unit 131 (step S218).

Note that the demodulation unit 110 demodulates the digital baseband signal output from the A/D converting unit 134, and outputs a demodulation completion signal to the AGC unit 111a.

The AGC unit 111a judges based on the demodulation completion signal whether or not the demodulation of the wireless packet signal is completed (step S219). The AGC unit 111a continues to perform the process of step S219 while it judges that the demodulation of the wireless packet signal is not completed (step S219: NO). On the other hand, when the AGC unit 111a judges that the demodulation of the wireless packet signal is completed (step S219: YES), the control goes to step S201. Note that the AGC unit 111a may go to step S201 after a predetermined time period has passed since completion of demodulation of the wireless packet.

In the above-described judgment processes in steps S203 and S212, the judgment may be in the affirmative due to, for example, strong input attributed to a signal that is not relevant to the wireless communication performed by the wireless communication device itself. Also, In the above-described judgment processes in steps S206 and S213, the judgment may be in the affirmative due to, for example, a bit saturation attributed to a signal that is not relevant to the wireless communication performed by the wireless communication device itself. Further, in the above-described judgment processes in steps S208 and S214, the judgment may be in the affirmative due to, for example, an erroneous detection of an STS by the wireless communication device 100a.

In such a case, when the received analog signal is strong input (step S212: YES), the low gain control value is set in the low noise amplifying unit 131, the strong input gain control process is executed and the gain of the variable gain amplifying unit 133 is readjusted (steps S204 and S205). This prevents the digital baseband signal output from the A/D converting unit 134 from becoming bit-saturated, increasing the ability to detect an STS.

In the above-described case, when the digital baseband signal is bit-saturated (step S213: YES), the bit saturation gain control process is executed and the gain of the variable gain amplifying unit 133 is readjusted (step S207). This prevents the digital baseband signal output from the A/D converting unit 134 from continuing to be bit-saturated, increasing the ability to detect an STS.

Also, in, for example, the above-described case, when the start of the STS detection section is detected (step S214: YES), the STS detection start gain control process is executed and the gain of the variable gain amplifying unit 133 is readjusted (step S209). This makes it possible to execute processes corresponding to the LTS, SIGNAL symbol, and DATA symbol, based on an output of the variable gain amplifying unit 133 after a gain adjustment based on the STS which is included in the same wireless packet signal that includes the LTS, SIGNAL symbol, and DATA symbol.

Furthermore, in, for example, the above-described case, if no LTS is detected during a time period from the execution of the strong input gain control process, the bit saturation gain control process, or the STS detection start gain control process until the time-out time $T_{OUT}$ passes (step S215: YES), the initial gain value is set in the variable gain amplifying unit 133 again, and the high gain control value is set in the low noise amplifying unit 131 again (steps S201 and S202). This prevents the gain value from continuing to be set in the variable gain amplifying unit 133 due to a signal that is not relevant to the wireless communication performed by the wireless communication device itself, increasing the ability to detect an STS.

[Strong Input Gain Control Process]

FIG. 14 shows the procedure of the strong input gain control process (step S205) shown in FIG. 12. It is presumed here that the digital signal power detecting unit 105 detects a value of power of the digital baseband signal output from the A/D converting unit 134, and outputs a digital power value signal indicating the detected value of power to the AGC unit 111a.

The AGC unit 111a calculates a gain value to be set in the variable gain amplifying unit 133, based on (i) the value of power of the digital baseband signal indicated by the digital power value signal and (ii) the reference digital power value (step S231), and sets the calculated gain value in the variable gain amplifying unit 133 (step S232).

The AGC unit 111a sets the count value T of the time-measuring counter to "0", and sets the time-out time to "$T_{OUT1}$" (step S233). Note that the time-out time $T_{OUT1}$ and the time-out time $T_{OUT2}$, which will be described later, are set by taking into consideration (i) the time required for the variable gain amplifying unit 133 to start to operate stably by the gain value set by the AGC unit 111a and (ii) a time period between a time when the variable gain amplifying unit 133 outputs the output signal and a time when the output signal of the variable gain amplifying unit 133 is output from the A/D converting unit 134. Note that, although it is described that the time-out time used in the first and second rounds of the gain control process in the strong input gain control process is equivalent to the time-out time used in the first and second rounds of the gain control process in the bit saturation gain control process, different time-out times may be used in the two gain control processes, respectively.

The AGC unit 111a judges whether or not the count value T of the time-measuring counter has reached the time-out time $T_{OUT1}$ (step S234). When it judges that the count value T of the time-measuring counter has not reached the time-out time $T_{OUT1}$ (step S234: NO), the AGC unit 111a counts up the count value T of the time-measuring counter by "1" (step S235), and goes to step S234. On the other hand, when it judges that the count value T has reached the time-out time $T_{OUT2}$ (step S234: YES), the AGC unit 111a goes to step S236.

When the process of steps S231 through S235 described above is completed, the first round of the gain control of the variable gain amplifying unit 133 performed by the AGC unit 111a is completed.

The AGC unit 111a calculates a gain value to be set in the variable gain amplifying unit 133, based on (i) the value of power of the digital baseband signal indicated by the digital power value signal and (ii) the reference digital power value (step S236), and sets the calculated gain value in the variable gain amplifying unit 133 (step S237).

The AGC unit 111a sets the count value T of the time-measuring counter to "0", and sets the time-out time to "$T_{OUT2}$" (step S238).

The AGC unit 111a judges whether or not the count value T of the time-measuring counter has reached the time-out time $T_{OUT2}$ (step S239). When it judges that the count value T of the time-measuring counter has not reached the time-out time $T_{OUT2}$ (step S239: NO), the AGC unit 111a counts up the count value T of the time-measuring counter by "1" (step S240), and goes to step S239. On the other hand, when it judges that the count value T has reached the time-out time $T_{OUT2}$ (step S239: YES), the AGC unit 111a goes to step S210 shown in FIG. 12.

When the process of steps S236 through S240 described above is completed, the second round of the gain control of the variable gain amplifying unit 133 performed by the AGC unit 111a is completed.

As described above, in the strong input gain control process whose procedures are shown in FIG. 14, the AGC unit 111a performs twice the set of (i) the calculation of a gain value to be set in the variable gain amplifying unit 133 and (ii) the setting of the calculated gain value in the variable gain amplifying unit 133.

As understood from FIGS. 8 and 14, the number of times the gain control is performed in the strong input gain control process whose procedures are shown in FIG. 14 is larger than the number of times the gain control is performed in the STS detection start gain control process whose procedures are shown in FIG. 8.

The wireless communication device 100a described above amplifies the received analog signal in two stages, resulting in a larger total gain width than amplification by one amplifier. Also, the wireless communication device 100a realizes a fast-response gain control by the gain control of the low noise amplifying unit 131, and realizes a finer gain control by the gain control of the variable gain amplifying unit 133.

<<Embodiment 3>>

The following describes Embodiment 3, the third embodiment of the present invention, with reference to the attached drawings.

The AGC unit 111a of the wireless communication device 100a in Embodiment 2 performs the strong input judgment, and then the bit saturation judgment, while the AGC unit of the wireless communication device in Embodiment 3 performs the bit saturation judgment, and then the strong input judgment.

<Structure of Wireless Communication Device>

Figure 15:
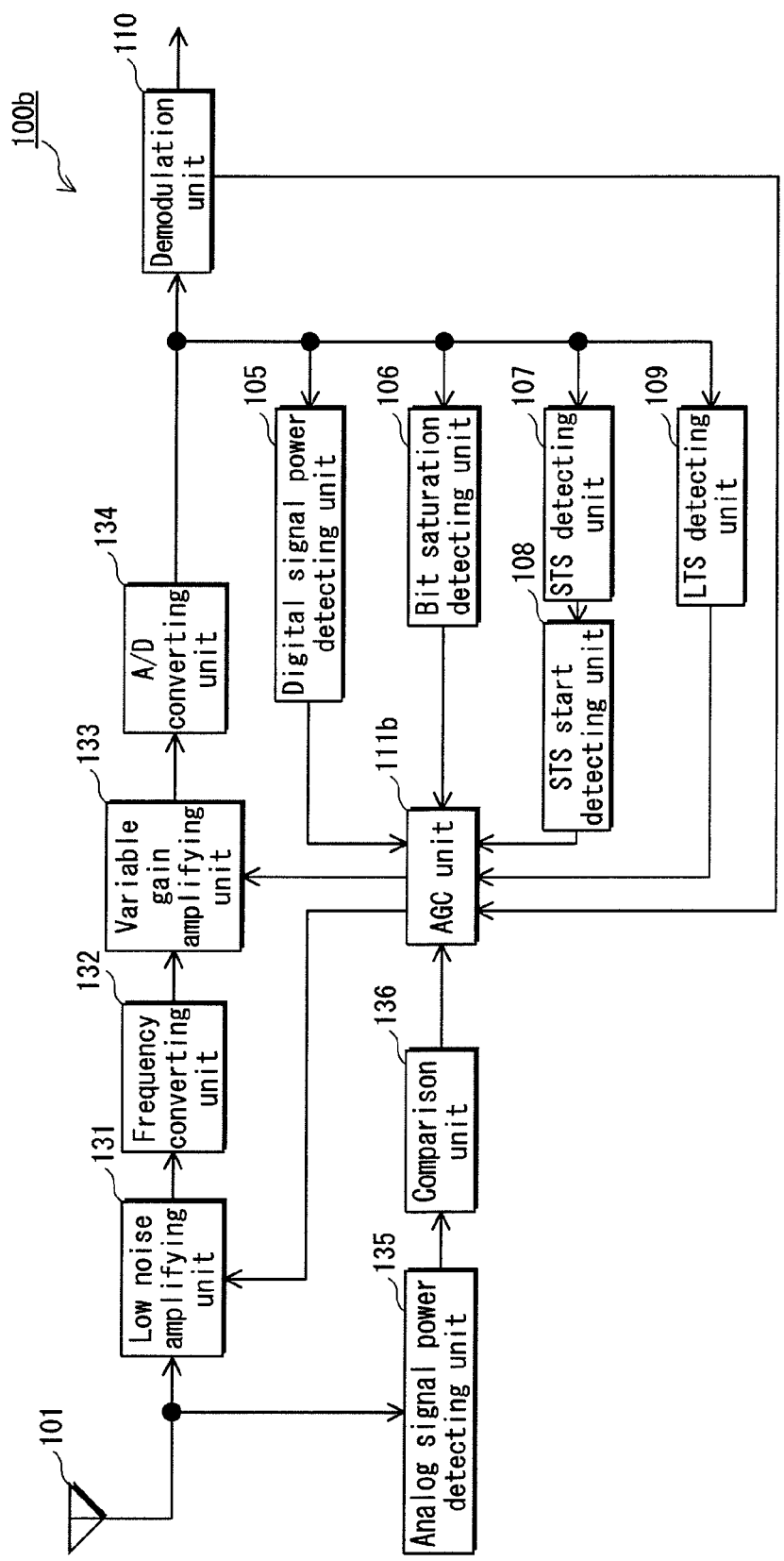
FIG. 15 shows the structure of the wireless communication device in Embodiment 3.

The following explains the structure of a wireless communication device 100b of Embodiment 3 with reference to FIG. 15. FIG. 15 shows the structure of the wireless communication device 100b. Note that the structural elements of Embodiment 3 that are substantially the same as the corresponding ones in Embodiments 1 and 2 are assigned the same reference numbers as the corresponding ones in Embodiments 1 and 2, and description thereof is omitted since description of the corresponding ones in Embodiments 1 and 2 is applicable thereto.

The wireless communication device 100b includes the antenna 101, the low noise amplifying unit 131, the frequency converting unit 132, the variable gain amplifying unit 133, the A/D converting unit 134, the digital signal power detecting unit 105, the bit saturation detecting unit 106, the STS detecting unit 107, the STS start detecting unit 108, the LTS detecting unit 109, the analog signal power detecting unit 135, the comparison unit 136, the demodulation unit 110, and an AGC unit 111b.

[AGC Unit 111b]

The AGC unit 111a judges whether or not the received analog signal is strong input, and then judges whether or not the digital baseband signal output from the A/D converting unit 134 has been bit-saturated. In contrast, the AGC unit 111b judges whether or not the digital baseband signal output from the A/D converting unit 134 has been bit-saturated, and then judges whether or not the received analog signal is strong input (see FIGS. 16 to 17, FIGS. 7 to 8, and FIG. 14).

(Operation of AGC Unit 111b)

Figure 16:
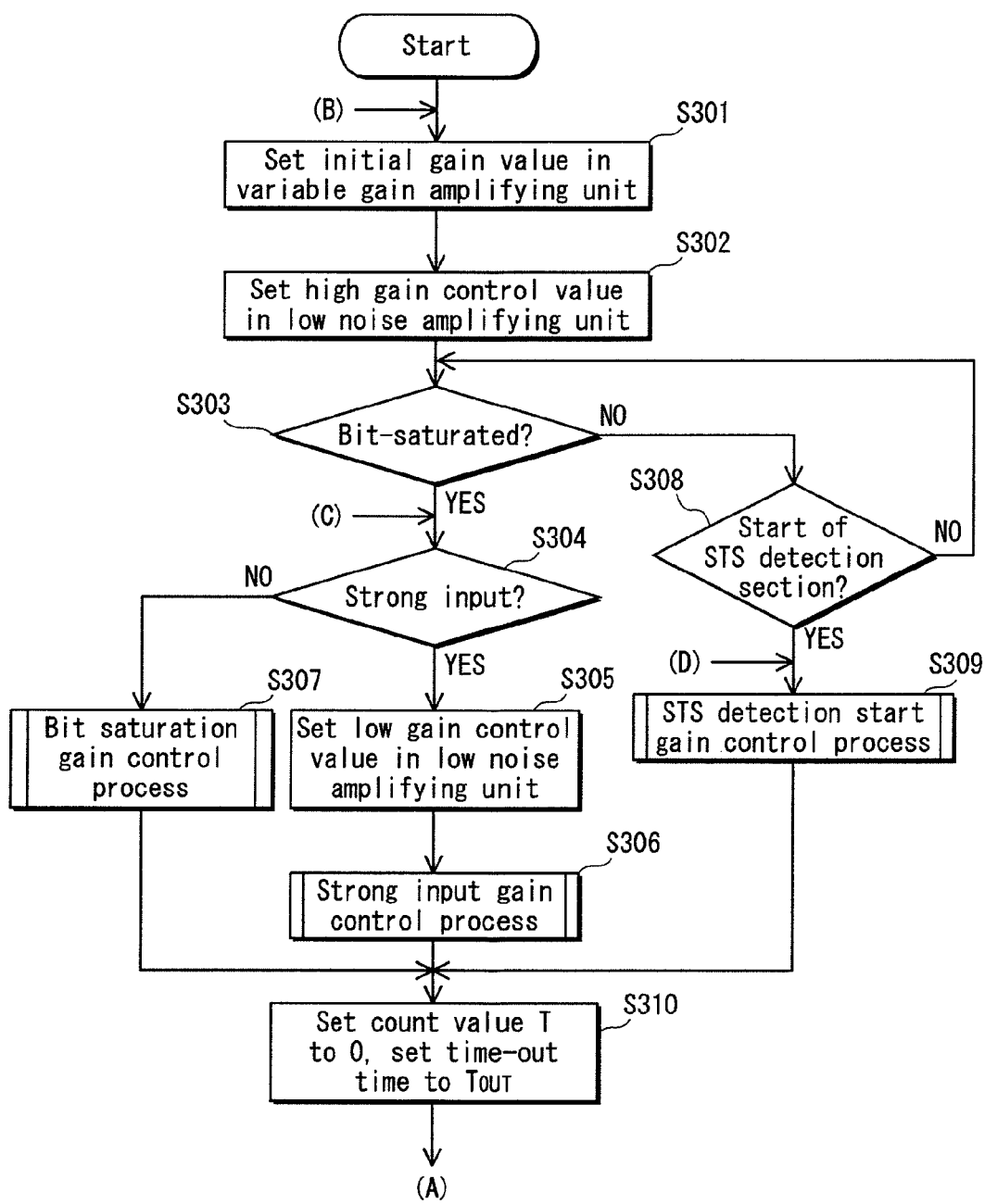
FIG. 16 is a flowchart showing the procedure for the gain control process of the low noise amplifying unit and the variable gain amplifying unit performed by the AGC unit shown in FIG. 15.
Figure 17:
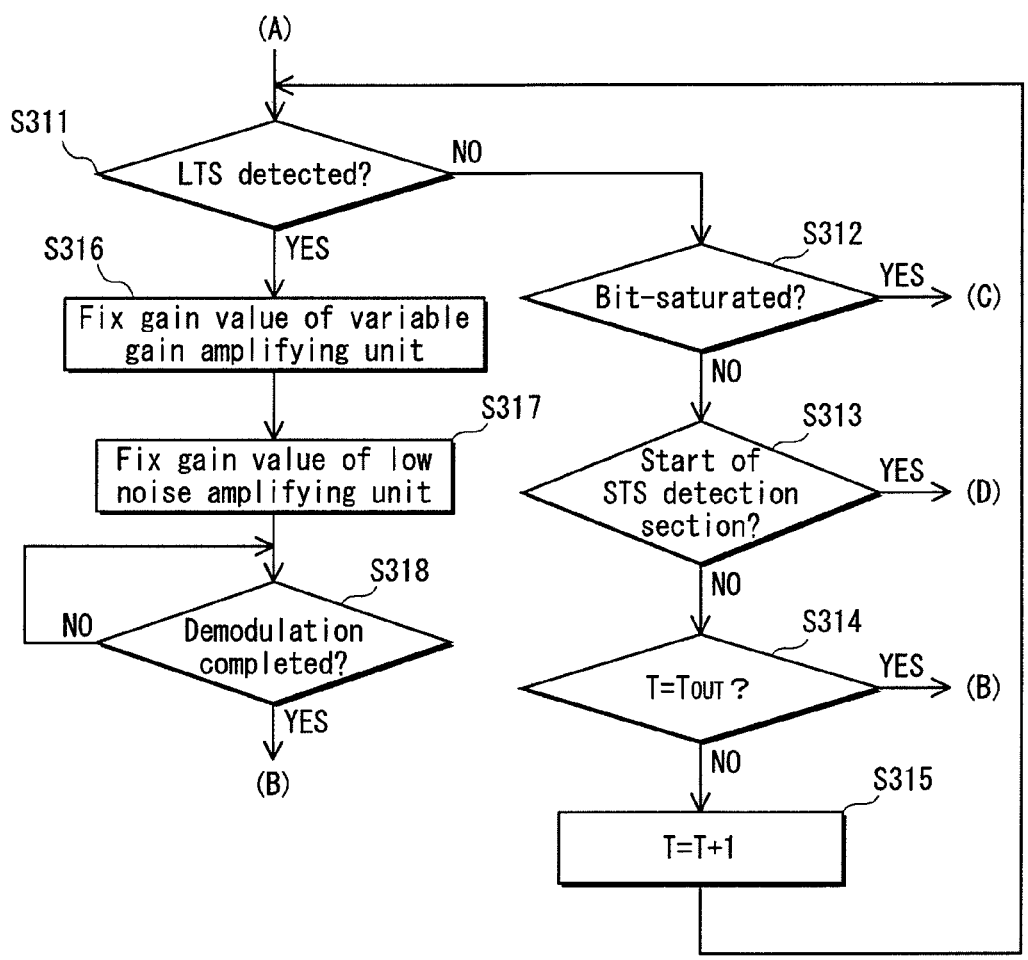
FIG. 17 is a flowchart showing the procedure for the gain control process of the low noise amplifying unit and the variable gain amplifying unit performed by the AGC unit shown in FIG. 15.

The following describes the gain control process of the low noise amplifying unit 131 and the variable gain amplifying unit 133 performed by the AGC unit 111b shown in FIG. 15, with reference to FIGS. 16 and 17. FIGS. 16 and 17 are flowcharts showing the procedure for the gain control process of the low noise amplifying unit 131 and the variable gain amplifying unit 133 performed by the AGC unit 111b shown in FIG. 15. Note that in the following, operations of the AGC unit 111b that are different from the operations of the AGC unit 111a are mainly described.

The AGC unit 111b sets a predetermined gain value (initial gain value) in the variable gain amplifying unit 133 (step S301), and sets a high gain control value in the low noise amplifying unit 131 (step S302).

The AGC unit 111b judges based on the bit saturation detection signal input from the bit saturation detecting unit 106 whether or not the digital baseband signal output from the A/D converting unit 134 has been bit-saturated (step S303).

When it judges that the digital baseband signal has been bit-saturated (step S303: YES), the AGC unit 111b judges based on the strong input judgment signal input from the comparison unit 136 whether or not the received analog signal is strong input (step S304).

When the AGC unit 111b judges that the received analog signal is strong input (step S304: YES), the AGC unit 111b sets the low gain control value in the low noise amplifying unit 131 (step S305). The AGC unit 111b then performs the strong input gain control process whose procedures are substantially the same as the procedures shown in FIG. 14, in which it performs twice the set of (i) the calculation of a gain value to be set in the variable gain amplifying unit 133 and (ii) the setting of the calculated gain value in the variable gain amplifying unit 133 (step S306), and goes to step S310.

When the AGC unit 111b judges that the received analog signal is not strong input (step S304: NO), the AGC unit 111b performs the bit saturation gain control process whose procedures are substantially the same as those shown in FIG. 7 in which it performs twice a set of (i) a calculation of a gain value to be set in the variable gain amplifying unit 133 and (ii) setting of the calculated gain value in the variable gain amplifying unit 133 (step S307), and goes to step S310.

When it judges that the digital baseband signal has not been bit-saturated (step S303: NO), the AGC unit 111b judges based on the STS detection section start signal input from the STS start detecting unit 108 whether or not the start of the STS detection section has been detected (step S308). When the AGC unit 111b judges that the start of the STS detection section has not been detected (step S308: NO), the control goes to step S303.

When the AGC unit 111b judges that the start of the STS detection section has been detected (step S308: YES), the AGC unit 111b performs the STS detection start gain control process whose procedures are substantially the same as those shown in FIG. 8 in which it performs once the set of (i) a calculation of a gain value to be set in the variable gain amplifying unit 133 and (ii) setting of the calculated gain value in the variable gain amplifying unit 133 (step S309). After step S309, the control goes to step S310.

The AGC unit 111b sets the count value T of the time-measuring counter to "0", and sets the time-out time to $T_{OUT}$ (step S310).

The AGC unit 111b judges based on the LTS detection signal input from the LTS detecting unit 109 whether or not an LTS has been detected from the digital baseband signal output from the A/D converting unit 134 (step S311).

When it judges that an LTS has not been detected (step S311: NO), the AGC unit 111b judges based on the bit saturation detection signal input from the bit saturation detecting unit 106 whether or not the digital baseband signal output from the A/D converting unit 134 has been bit-saturated (step S312). When the AGC unit 111b judges that the digital baseband signal has been bit-saturated (step S312: YES), the control goes to step S304.

When the AGC unit 111b judges that the digital baseband signal has not been bit-saturated (step S312: NO), the AGC unit 111b judges based on the STS detection section start signal input from the STS start detecting unit 108 whether or not the start of the STS detection section has been detected (step S313). When the AGC unit 111b judges that the start of the STS detection section has been detected (step S313: YES), the control goes to step S309.

When the AGC unit 111b judges that the start of the STS detection section has not been detected (step S313: NO), the AGC unit 111b judges whether or not the count value T of the time-measuring counter has reached the time-out time $T_{OUT}$ (step S314). When it judges that the count value T has not reached the time-out time $T_{OUT}$ (step S314: NO), the AGC unit 111b counts up the count value T of the time-measuring counter by "1" (step S315), and goes to step S311. On the other hand, when the AGC unit 111b judges that the count value T has reached the time-out time $T_{OUT}$ (step S314: YES), the control goes to step S301.

When it judges that an LTS has been detected from the digital baseband signal (step S311: YES), the AGC unit 111b goes to step S316 and performs the process of steps S316 through S318 which is the substantially the same as the process of steps S217 through S219 shown in FIG. 13.

<<Embodiment 4>>

The following describes Embodiment 4, the fourth embodiment of the present invention, with reference to the attached drawings.

The wireless communication device of Embodiment 4 has the functions of the wireless communication device 100a of Embodiment 2, and further has a function to perform the gain control of the variable gain amplifying unit 133 based on the analog signal from which the low frequency component including the direct current component has been removed.

<Structure of Wireless Communication Device>

Figure 18:
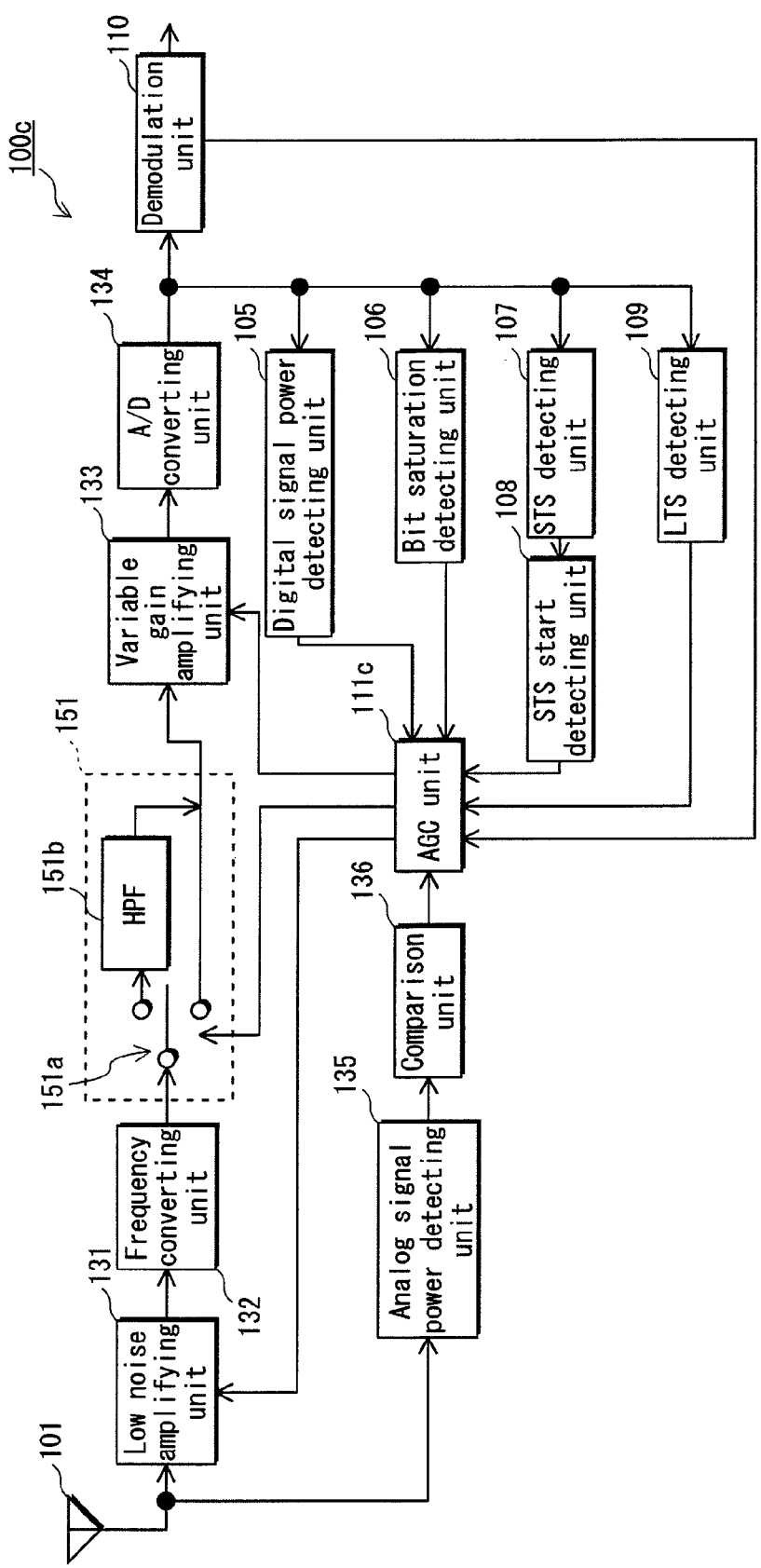
FIG. 18 shows the structure of the wireless communication device in Embodiment 4.

The following explains the structure of a wireless communication device 100c of Embodiment 4 with reference to FIG. 18. FIG. 18 shows the structure of the wireless communication device 100c. Note that the structural elements of Embodiment 4 that are substantially the same as the corresponding ones in Embodiments 1 and 2 are assigned the same reference numbers as the corresponding ones in Embodiments 1 and 2, and description thereof is omitted since description of the corresponding ones in Embodiments 1 and 2 is applicable thereto.

The wireless communication device 100c includes the antenna 101, the low noise amplifying unit 131, the frequency converting unit 132, an HPF function unit 151, the variable gain amplifying unit 133, the A/D converting unit 134, the digital signal power detecting unit 105, the bit saturation detecting unit 106, the STS detecting unit 107, the STS start detecting unit 108, the LTS detecting unit 109, the analog signal power detecting unit 135, the comparison unit 136, the demodulation unit 110, and an AGC unit 111c.

[HPF Function Unit 151]

The HPF function unit 151 operates in either an HPF function valid mode or an HPF function invalid mode. In the HPF function valid mode, an HPF (High Pass Filter) function is valid, the HPF function being used to remove the low-frequency component including the direct current component from the analog baseband signal input from the frequency converting unit 132, and output only the high-frequency component. In the HPF function invalid mode, the HPF function is invalid, and the analog baseband signal input from the frequency converting unit 132 is output as it is. Note that the switching the operation modes of the HPF function unit 151 is controlled by the AGC unit 111c (see FIGS. 19 and 20).

The HPF function unit 151 includes a switch 151a and an HPF (High Pass Filter) 151b.

When the HPF function valid mode is selected as the operation mode, the switch 151a connects the frequency converting unit 132 to the HPF 151b so that the analog baseband signal output from the frequency converting unit 132 passes through the HPF 151b and enters the variable gain amplifying unit 133.

When the HPF function invalid mode is selected as the operation mode, the switch 151a connects the frequency converting unit 132 to the variable gain amplifying unit 133 so that the analog baseband signal output from the frequency converting unit 132 directly enters the variable gain amplifying unit 133.

The HPF 151b is a high-pass filter that removes the low-frequency component including the direct current component from the input analog baseband signal, and outputs only the high-frequency component. Note that the cutoff frequency of the HPF 151b is determined by taking into consideration the frequency of the signal component that should pass through the HPF 151b, or the frequency of the signal component that should be removed.

[AGC Unit 111c]

The AGC unit 111c performs a process that is substantially the same as the process performed by the AGC unit 111a. The AGC unit 111c further performs a process of switching the operation modes of the HPF function unit 151 (see FIGS. 19-20, FIGS. 7-8, and FIG. 14).

(Operation of AGC Unit 111c)

Figure 19:
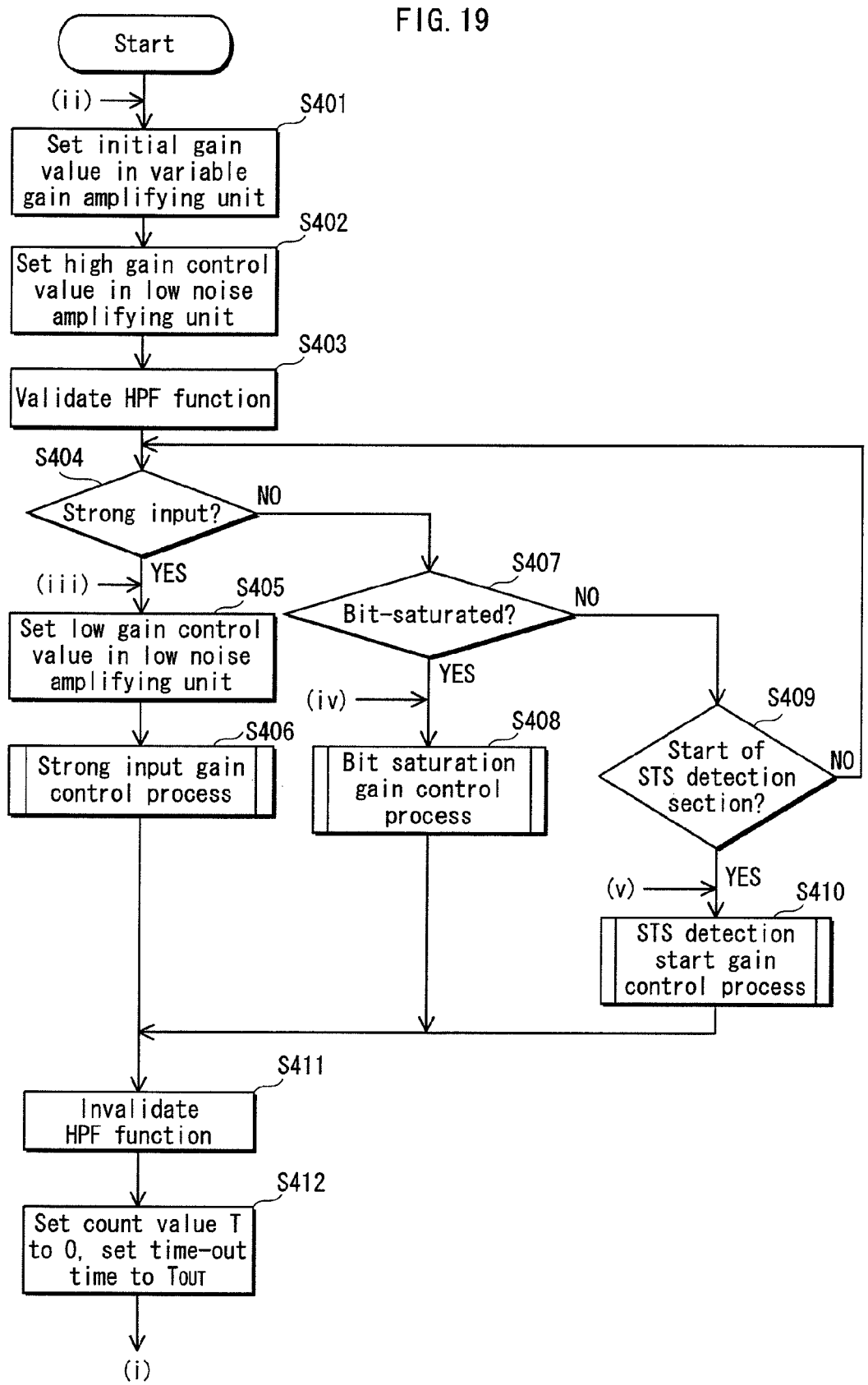
FIG. 19 is a flowchart showing the procedures of the gain control process of the low noise amplifying unit and the variable gain amplifying unit and the process of switching the operation modes of the HPF function unit which are performed by the AGC unit shown in FIG. 18.
Figure 20:
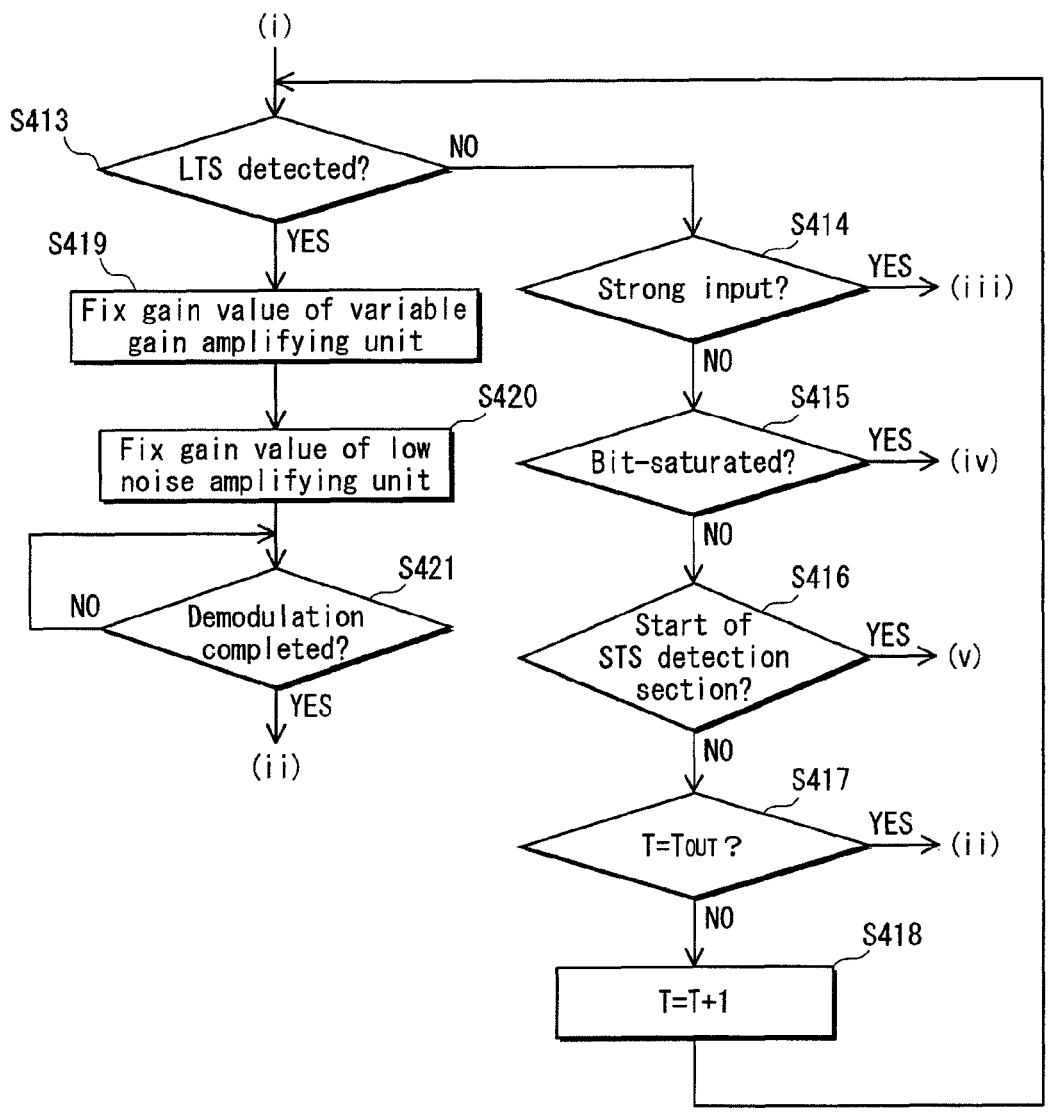
FIG. 20 is a flowchart showing the procedures of the gain control process of the low noise amplifying unit and the variable gain amplifying unit and the process of switching the operation modes of the HPF function unit which are performed by the AGC unit shown in FIG. 18.

The following describes the gain control process of the low noise amplifying unit 131 and the variable gain amplifying unit 133 and the process of switching the operation modes of the HPF function unit 151 which are performed by the AGC unit 111c shown in FIG. 18, with reference to FIGS. 19 and 20. FIGS. 19 and 20 are flowcharts respectively showing the procedures of the gain control process of the low noise amplifying unit 131 and the variable gain amplifying unit 133 and the process of switching the operation modes of the HPF function unit 151 which are performed by the AGC unit 111c shown in FIG. 18. Note that in the following, operations of the AGC unit 111c that are different from the operations of the AGC unit 111a are mainly described.

The AGC unit 111c sets a predetermined gain value (initial gain value) in the variable gain amplifying unit 133 (step S401), sets a high gain control value in the low noise amplifying unit 131 (step S402), and sets the operation mode of the HPF function unit 151 to the HPF function valid mode (step S403).

The HPF 151b of the HPF function unit 151 removes the direct current component generated by the frequency converting unit 132 which uses, for example, the direct conversion method. With this operation, when the HPF function unit 151 operates in the HPF function valid mode, the power value of the digital baseband signal output from the A/D converting unit 104 does not include the offset of the power value of the direct current component generated by the frequency converting unit 132. Therefore, the AGC unit 111c can accurately control the gain of the variable gain amplifying unit 133.

The process of steps S404 through S410 executed by the AGC unit 111c is substantially the same as the process of steps S203 through S209 shown in FIG. 12. The procedure of the strong input gain control process executed in step S406 is substantially the same as the procedure shown in FIG. 14. The procedure of the bit saturation gain control process executed in step S408 is substantially the same as the procedure shown in FIG. 7. The procedure of the STS detection start gain control process executed in step S410 is substantially the same as the procedure shown in FIG. 8.

After performing any of the strong input gain control process, the bit saturation gain control process, and the STS detection start gain control process, the AGC unit 111c switches the operation mode of the HPF function unit 151 from the HPF function valid mode to the HPF function invalid mode (step S411).

When the HPF function unit 151 operates in the HPF function invalid mode, the HPF function unit 151 does not remove any signal component from the analog baseband signal output from the frequency converting unit 132. As a result, no signal component is removed from the analog baseband signal related to the SIGNAL symbol or the DATA symbol. This prevents the demodulation accuracy of the AGC unit 111 from deteriorating even when the HPF function unit 151 is provided.

The process of steps S412 through S421 executed by the AGC unit 111c is substantially the same as the process of steps S210 through S219 shown in FIGS. 12 and 13.

<<Embodiment 5>>

The following describes Embodiment 5, the fifth embodiment of the present invention, with reference to the attached drawings.

The AGC unit provided in the wireless communication device of Embodiment 5 differs from the AGC unit 111 provided in the wireless communication device 100 of Embodiment 1 in that it repeatedly performs (i) the calculation of a gain value to be set in the variable gain amplifying unit and (ii) the setting of the calculated gain value in the variable gain amplifying unit.

<Structure of Wireless Communication Device>

Figure 21:
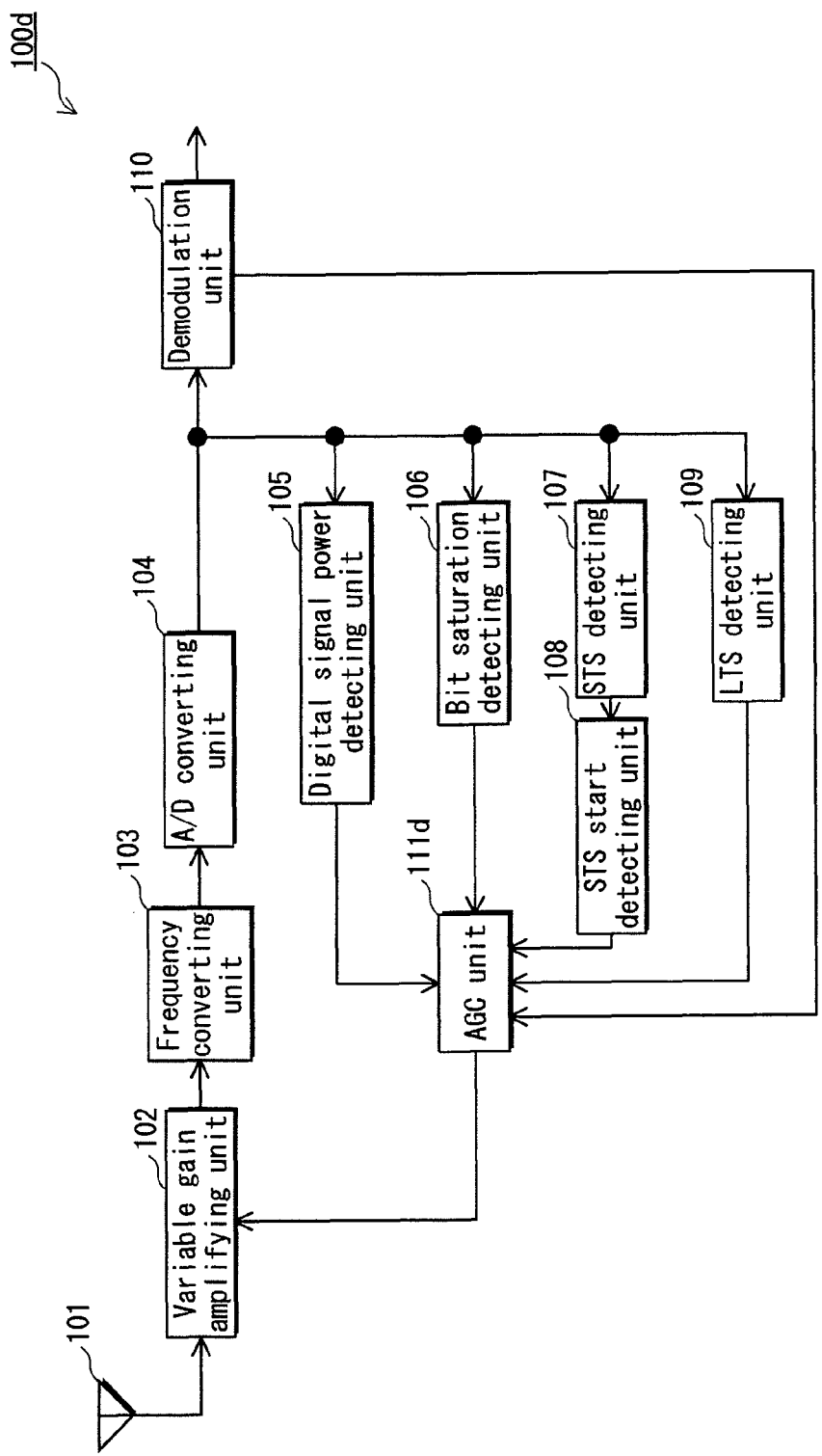
FIG. 21 shows the structure of the wireless communication device in Embodiment 5.

The following explains the structure of a wireless communication device 100d of Embodiment 5 with reference to FIG. 21. FIG. 21 shows the structure of the wireless communication device 100d. Note that the structural elements of Embodiment 5 that are substantially the same as the corresponding ones in Embodiment 1 are assigned the same reference numbers as the corresponding ones in Embodiment 1, and description thereof is omitted since description of the corresponding ones in Embodiment 1 is applicable thereto.

The wireless communication device 100d includes the antenna 101, the variable gain amplifying unit 102, the frequency converting unit 103, the A/D converting unit 104, the digital signal power detecting unit 105, the bit saturation detecting unit 106, the STS detecting unit 107, the STS start detecting unit 108, the LTS detecting unit 109, the demodulation unit 110, and an AGC unit 111d.

[AGC Unit 111d]

Figure 22:
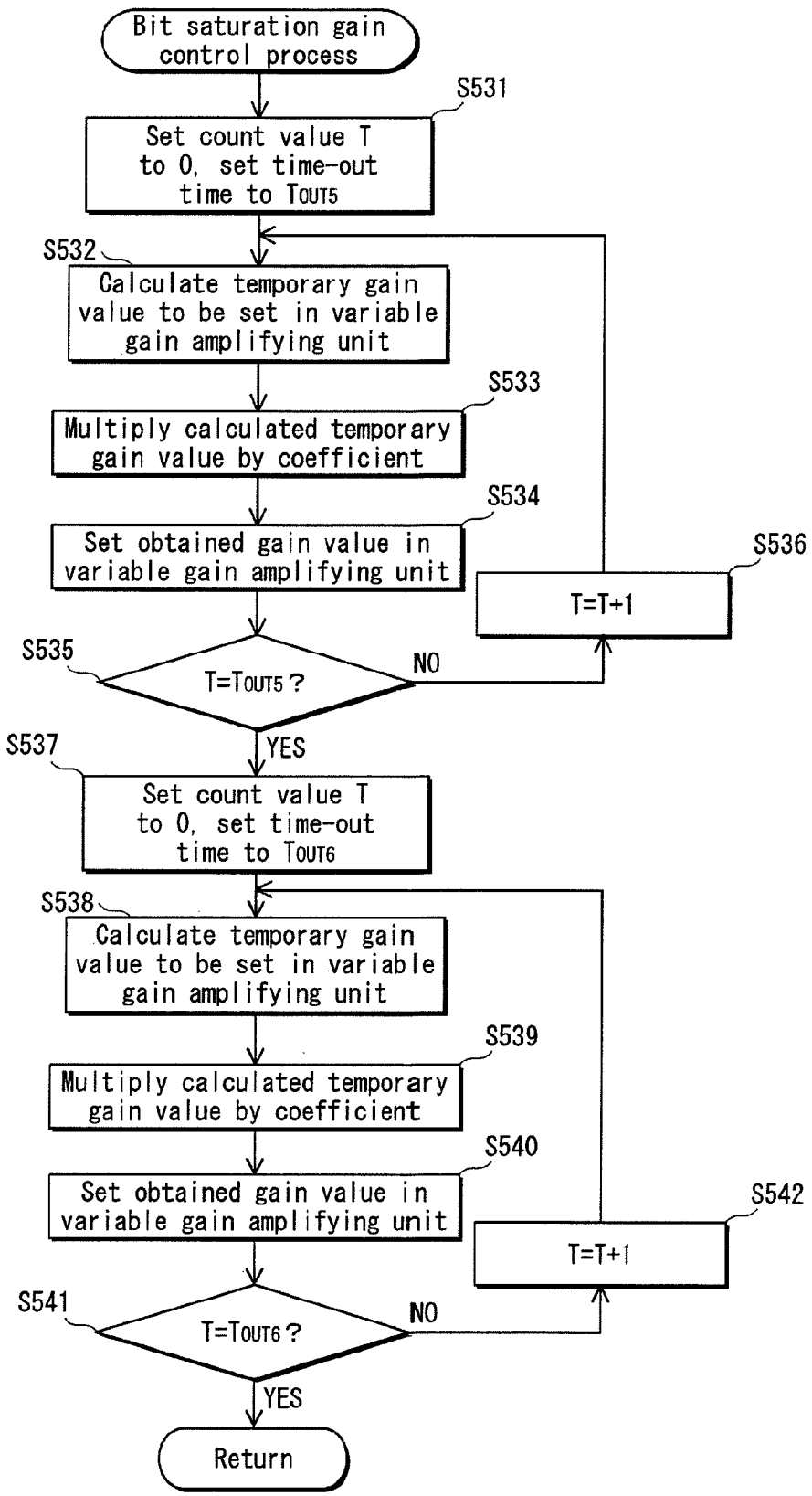
FIG. 22 is a flowchart showing the procedures of the bit saturation gain control process performed by the AGC unit shown in FIG. 21.
Figure 23:
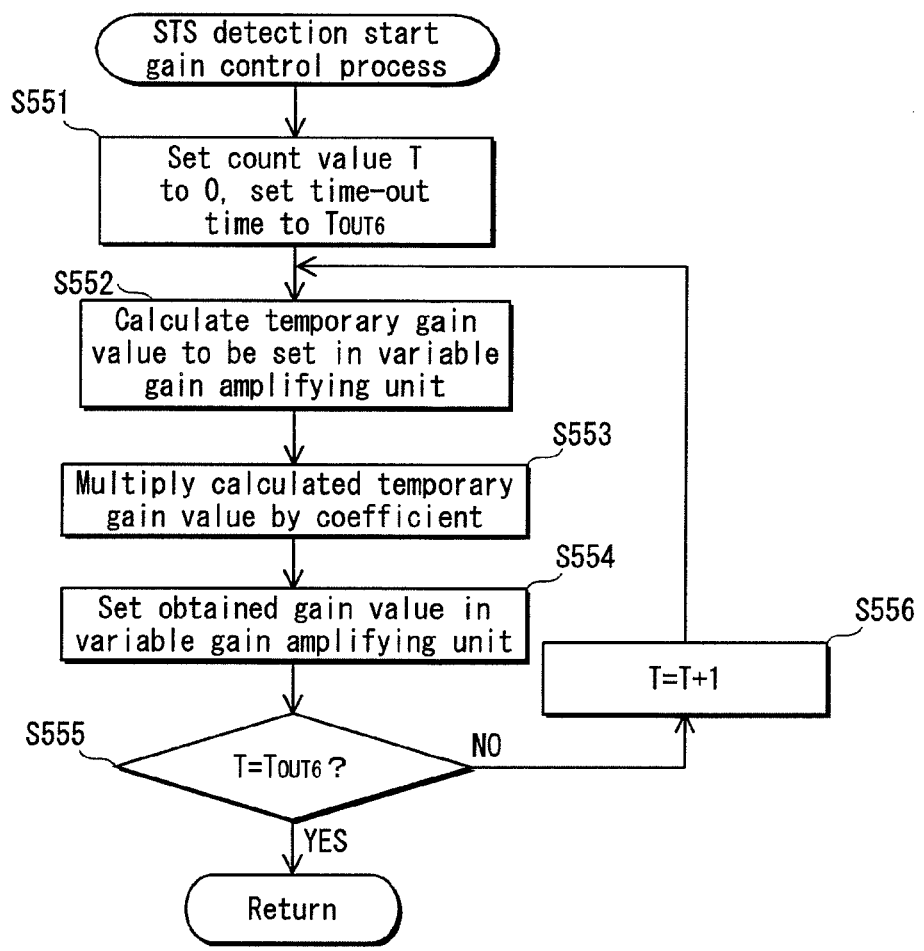
FIG. 23 is a flowchart showing the procedures of the STS detection start gain control process performed by the AGC unit shown in FIG. 21.

The AGC unit 111d receives the same signal as the AGC unit 111, and performs the gain control of the variable gain amplifying unit 102 based on the received signal (see FIGS. 6, 22, and 23).

(Operation of AGC Unit 111d)

The AGC unit 111d performs the gain control of the variable gain amplifying unit 102 based on the process procedure shown in FIG. 6. Note that the bit saturation gain control process (step S103) and the STS detection start gain control process (step S105) executed by the AGC unit 111d are different from those executed by the AGC unit 111.

[Bit Saturation Gain Control Process]

FIG. 22 shows the procedure of the bit saturation gain control process (step S103) executed by the AGC unit 111d. It is presumed here that the digital signal power detecting unit 105 detects a value of power of the digital baseband signal output from the A/D converting unit 104, and outputs a digital power value signal indicating the detected value of power to the AGC unit 111d.

The AGC unit 111d sets the count value T of the time-measuring counter to "0", and sets the time-out time to "$T_{OUT5}$" (step S531).

The AGC unit 111d calculates a temporary gain value to be set in the variable gain amplifying unit 102, based on the reference digital power value and the power value of the digital baseband signal indicated by the digital power value signal (step S532), and multiplies the calculated temporary gain value by a predetermined coefficient "K" to obtain a gain value (step S533). The AGC unit 111d sets the obtained gain value in the variable gain amplifying unit 102 (step S534). Note that a value greater than "0" is set to the coefficient "K".

The AGC unit 111d judges whether or not the count value T of the time-measuring counter has reached the time-out time $T_{OUT5}$ (step S535). When it judges that the count value T of the time-measuring counter has not reached the time-out time $T_{OUT5}$ (step S535: NO), the AGC unit 111d counts up the count value T of the time-measuring counter by "1" (step S536), and goes to step S532. On the other hand, when it judges that the count value T has reached the time-out time $T_{OUT5}$ (step S535: YES), the AGC unit 111d goes to step S537.

The AGC unit 111d sets the count value T of the time-measuring counter to "0", and sets the time-out time to "$T_{OUT6}$" (step S537).

The AGC unit 111d calculates a temporary gain value to be set in the variable gain amplifying unit 102, based on the reference digital power value and the power value of the digital baseband signal indicated by the digital power value signal (step S538), and multiplies the calculated temporary gain value by the predetermined coefficient "K" to obtain a gain value (step S539). The AGC unit 111d sets the obtained gain value in the variable gain amplifying unit 102 (step S540).

The AGC unit 111d judges whether or not the count value T of the time-measuring counter has reached the time-out time $T_{OUT6}$ (step S541). When it judges that the count value T of the time-measuring counter has not reached the time-out time $T_{OUT6}$ (step S541: NO), the AGC unit 111d counts up the count value T of the time-measuring counter by "1" (step S542), and goes to step S538. On the other hand, when it judges that the count value T has reached the time-out time $T_{OUT6}$ (step S541: YES), the AGC unit 111d goes to step S106 shown in FIG. 6.

As described above, in the bit saturation gain control process whose procedure is shown in FIG. 22, the AGC unit 111d performs the gain control of the variable gain amplifying unit 102 repeatedly during a time period which is a sum of the times $T_{OUT5}$ and $T_{OUT6}$ ($=T_{OUT5}+T_{OUT6}$).

[STS Detection Start Gain Control Process]

FIG. 23 shows the procedure of the STS detection start gain control process (step S105) executed by the AGC unit 111d. It is presumed here that the digital signal power detecting unit 105 detects a value of power of the digital baseband signal output from the A/D converting unit 104, and outputs a digital power value signal indicating the detected value of power to the AGC unit 111d.

The AGC unit 111d sets the count value T of the time-measuring counter to "0", and sets the time-out time to "T$_{OUT6}$" (step S551).

The AGC unit 111d calculates a temporary gain value to be set in the variable gain amplifying unit 102, based on the power value of the digital baseband signal indicated by the digital power value signal and the reference digital power value (step S552), and multiplies the calculated temporary gain value by the predetermined coefficient "K" to obtain a gain value (step S553). The AGC unit 111d sets the obtained gain value in the variable gain amplifying unit 102 (step S554).

The AGC unit 111d judges whether or not the count value T of the time-measuring counter has reached the time-out time T$_{OUT6}$ (step S555). When it judges that the count value T of the time-measuring counter has not reached the time-out time T$_{OUT6}$ (step S555: NO), the AGC unit 111d counts up the count value T of the time-measuring counter by "1" (step S556), and goes to step S552. On the other hand, when it judges that the count value T has reached the time-out time T$_{OUT6}$ (step S555: YES), the AGC unit 111d goes to step S106 shown in FIG. 6.

As described above, in the STS detection start gain control process whose procedure is shown in FIG. 23, the AGC unit 111d performs the gain control of the variable gain amplifying unit 102 repeatedly during time period T$_{OUT6}$.

As understood from FIGS. 22 and 23, the time period (T$_{OUT5}$+T$_{OUT6}$) for the gain control in the bit saturation gain control process is longer than the time period (T$_{OUT6}$) for the gain control in the STS detection start gain control process.

<Operation of Wireless Communication Device>

Figure 24:
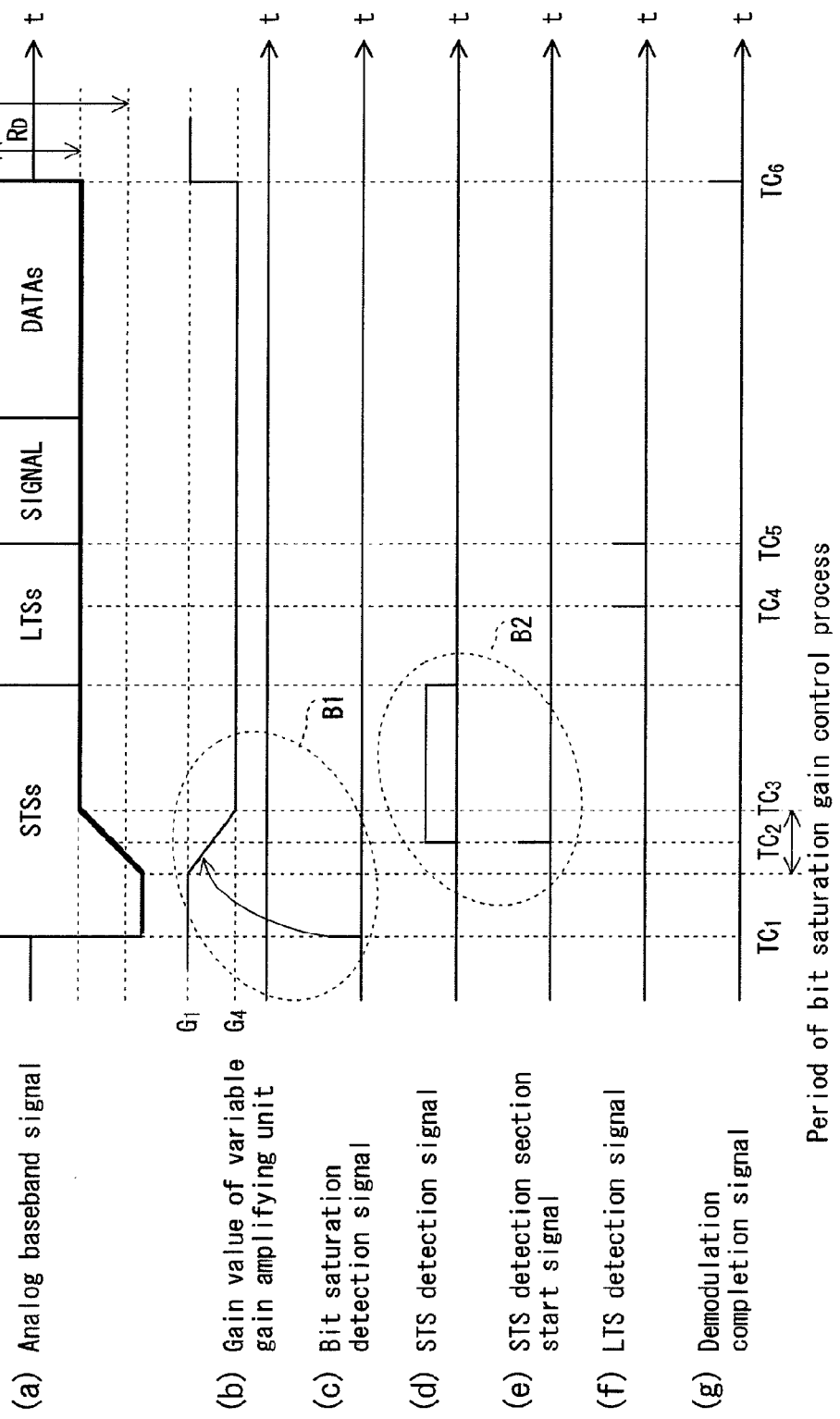
FIG. 24 schematically shows one example of the reception operation performed by the wireless communication device shown in FIG. 21 when a bit saturation occurs.
Figure 25:
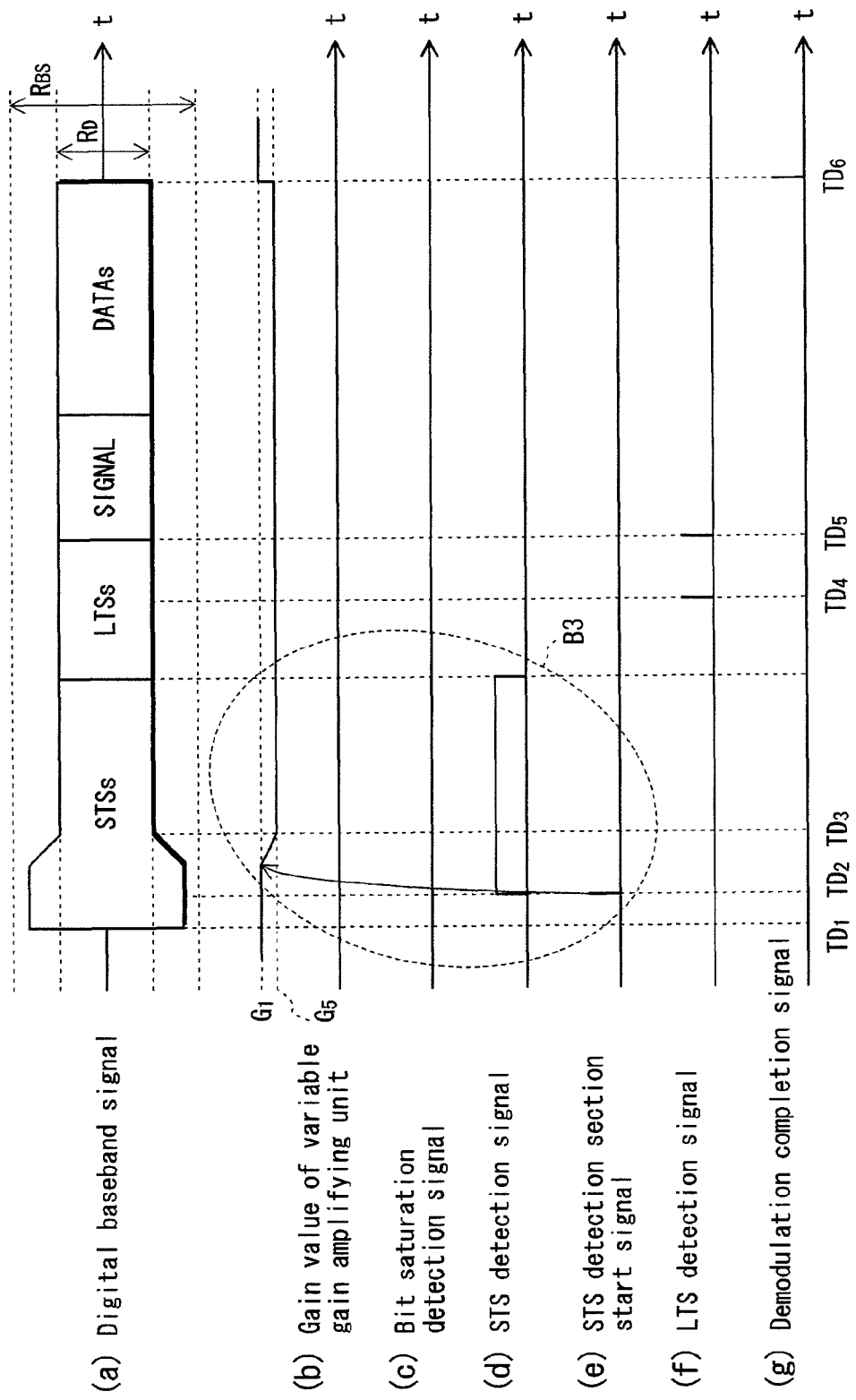
FIG. 25 schematically shows one example of the reception operation performed by the wireless communication device shown in FIG. 21 when it starts the STS detection.

The following describes one example of the reception operation performed by the wireless communication device 100d when a bit saturation occurs, and one example of the reception operation performed by the wireless communication device 100d when the STS detection starts, with reference to FIGS. 24 and 25. Note that, in part (a) of FIGS. 24 and 25, the "STSs" represents the short preamble signal shown in FIG. 2, the "LTSs" represents the long preamble signal shown in FIG. 2, and "DATAs" represents one or more DATA symbols.

Note however that in part (a) of FIGS. 24 and 25, the range R$_{BS}$ indicates the level of the analog baseband signal input into the A/D converting unit 104 by which the digital baseband signal output from the A/D converting unit 104 is not bit-saturated. In other words, when an analog baseband signal that is outside the range R$_{BS}$ is input into the A/D converting unit 104, a digital baseband signal output from the A/D converting unit 104 is bit-saturated.

Also, in part (a) of FIGS. 24 and 25, the both ends of the range R$_D$ indicate the levels of analog baseband signals that are input into the A/D converting unit 104 when the values of power of the digital baseband signals are the reference digital power value.

[Operation when Bit Saturation Occurs]

As shown in part (b) of FIG. 24, the AGC unit 111d sets an initial gain value G$_1$ in the variable gain amplifying unit 102.

An analog signal in the RF band received by the antenna 101 (a received analog signal) is performed with the processes performed by the variable gain amplifying unit 102, the frequency converting unit 103, and the A/D converting unit 104, and a digital baseband signal is output from the A/D converting unit 104.

The bit saturation detecting unit 106 performs a detection process for detecting a bit saturation of the digital baseband signal output from the A/D converting unit 104, and outputs a bit saturation detection signal reflecting the detection result to the AGC unit 111d.

The STS detecting unit 107 performs a detection process for detecting an STS from the digital baseband signal output from the A/D converting unit 104, and outputs an STS detection signal reflecting the detection result to the STS start detecting unit 108. The STS section detecting unit 133 of the STS start detecting unit 108 performs a detection process for detecting an STS detection section based on the STS detection signal input from the STS detecting unit 107, and outputs an STS section signal reflecting the detection result to the STS section start detecting unit 134. The STS section start detecting unit 134 performs a detection process for detecting the start of an STS detection section based on the STS section signal, and outputs an STS detection section start signal reflecting the detection result to the AGC unit 111d.

Suppose here that, as shown in part (a) of FIG. 24, at time TC$_1$, the analog baseband signal input into the A/D converting unit 104 exceeds the range R$_{BS}$. With this, the digital baseband signal output from the A/D converting unit 104 is bit-saturated, and the bit saturation detecting unit 106 detects a bit saturation of the digital baseband signal, and keeps on outputting a high-level bit-saturation detection signal for the pulse period (refer to a portion encircled by a dotted line B1 in FIG. 24).

The AGC unit 111d, upon detecting a change of the bit-saturation detection signal from a low level to a high level, starts the bit saturation gain control process whose procedures are shown in FIG. 22, and performs the gain control of the variable gain amplifying unit 102 for the time period T$_{OUT5}$ by performing the process of steps S531 through S536. The AGC unit 111d further performs the gain control of the variable gain amplifying unit 102 for the time period T$_{OUT6}$ by performing the process of steps S537 through S542. That is to say, the AGC unit 111d performs the gain control of the variable gain amplifying unit 102 for the time period "T$_{OUT5}$+T$_{OUT6}$". With this, at time TC$_3$, the gain value of the variable gain amplifying unit 102 reduces from the initial gain value G$_1$ to a gain value G$_4$ (refer to a portion encircled by a dotted line B1 in FIG. 24). Here, since the gain control time in the bit saturation gain control process is "T$_{OUT5}$+T$_{OUT6}$", the AGC unit 111d ends the bit saturation gain control process.

In the example shown in FIG. 24, the analog baseband signal input into the A/D converting unit 104 becomes within the range R$_{BS}$ in the bit saturation gain control process performed by the AGC unit 111d. The STS detecting unit 107 starts detecting the STS from the digital baseband signal output from the A/D converting unit 104, and keeps on outputting a high-level STS detection signal for the pulse period continuously in sequence at the interval of symbol time T$_{STS}$. Following this, at time TC$_2$, the STS section detecting unit 133 changes the STS section signal from a low level to a high level. After the STS section signal changes from a low level to a high level, the STS section start detecting unit 134 keeps on outputting a high-level STS detection section start signal to the AGC unit 111d for the pulse period. Since the current time is in the bit saturation gain control process, the AGC unit 111d does not perform the gain control of the variable gain amplifying unit 102 triggered by the detection of the start of the STS detection section (refer to a portion encircled by a dotted line B2 in FIG. 24).

Note that, even after the execution of the bit saturation gain control process is ended, the AGC unit 111d judges, based on the bit saturation detection signal input from the bit saturation detecting unit 106, whether or not the digital baseband signal output from the A/D converting unit 104 has been bit-saturated, and judges, based on the STS detection section start signal input from the STS section start detecting unit 134 of the STS start detecting unit 108, whether or not the start of a new STS detection section has been detected (refer to steps S106 to S111 shown in FIG. 6).

The LTS detecting unit 109 performs the process for detecting the LTS from the digital baseband signal input from the A/D converting unit 104, and outputs an LTS detection signal reflecting the detection result to the AGC unit 111d. The wireless communication device 100d performs a channel estimation based on (i) the digital baseband signal output from the A/D converting unit 104 in correspondence with the LTS and (ii) the reference signal based on the LTS.

At time $TC_4$, when the LTS detection signal input from the LTS detecting unit 109 has changed from a low level to a high level, the AGC unit 111d fixes the gain value of the variable gain amplifying unit 102 to a gain value $G_4$. Note that since there are two LTSs, even at time $TC_5$, the LTS detection signal is at a high level for the pulse period.

The demodulation unit 110 equalizes digital baseband signals output from the A/D converting unit 104 in correspondence with the SIGNAL symbol and the DATA symbol based on the channel estimation result, and demaps the equalized digital baseband signals. The demodulation unit 110 judges whether or not demodulation of wireless packet signal is completed, based on the data length included in the SIGNAL symbol, and outputs a demodulation completion signal reflecting the judgment result to the AGC unit 111d.

At time $TC_6$, the demodulation unit 110 completes the demodulation of the wireless packet signal, and starts outputting a high-level demodulation completion signal to the AGC unit 111d for the pulse period. On recognizing that the demodulation completion signal has changed from a low level to a high level, the AGC unit 111d sets the gain value of the variable gain amplifying unit 102 to the initial gain value $G_1$.

[Operation Example of STS Detection Start]

As shown in part (b) of FIG. 25, the AGC unit 111d sets the initial gain value $G_1$ in the variable gain amplifying unit 102.

The analog signal (received analog signal) in the RF band received by the antenna 101 is performed with the processes performed by the variable gain amplifying unit 102, the frequency converting unit 103 and the A/D converting unit 104, and a digital baseband signal is output from the A/D converting unit 104.

The bit saturation detecting unit 106 performs a detection process for detecting a bit saturation of the digital baseband signal output from the A/D converting unit 104, and outputs a bit saturation detection signal reflecting the detection result to the AGC unit 111d.

The STS detecting unit 107 performs a detection process for detecting an STS from the digital baseband signal output from the A/D converting unit 104, and outputs an STS detection signal reflecting the detection result to the STS start detecting unit 108. The STS section detecting unit 133 of the STS start detecting unit 108 performs a detection process for detecting an STS detection section based on the STS detection signal input from the STS detecting unit 107, and outputs an STS section signal reflecting the detection result to the STS section start detecting unit 134. The STS section start detecting unit 134 performs a detection process for detecting the start of an STS detection section based on the STS section signal, and outputs an STS detection section start signal reflecting the detection result to the AGC unit 111d.

Suppose here that, as shown in part (a) of FIG. 25, at time $TD_1$, a wireless packet signal is received such that the analog baseband signal input into the A/D converting unit 104 is within the range $R_{BS}$. The STS detecting unit 107 starts detecting an STS from the digital baseband signal output from the A/D converting unit 104, and keeps on outputting a high-level STS detection signal for the pulse period continuously in sequence at the interval of symbol time $T_{STS}$. With this, at time $TD_2$, the STS section detecting unit 133 changes the STS section signal from a low level to a high level. Upon recognizing this, the STS section start detecting unit 134 outputs a high-level STS detection section start signal to the AGC unit 111d for the pulse period (refer to a portion encircled by a dotted line B3 in FIG. 25).

The AGC unit 111d, when the STS detection section start signal has changed from a high level to a low level, starts the STS detection start gain control process whose procedures are shown in FIG. 23, and performs the gain control of the variable gain amplifying unit 102 for the time period $T_{OUT6}$ by performing the process of steps S551 through S556. With this, at time $TD_3$, the gain value of the variable gain amplifying unit 102 reduces from the initial gain value $G_1$ to a gain value $G_5$ (refer to a portion encircled by a dotted line B3 in FIG. 25). Here, since the gain control time in the STS detection start gain control process is $T_{OUT6}$, the AGC unit 111d ends the STS detection start gain control process.

Note that, even after the execution of the STS detection start gain control process is ended, the AGC unit 111d judges, based on the bit saturation detection signal input from the bit saturation detecting unit 106, whether or not the digital baseband signal output from the A/D converting unit 104 has been bit-saturated, and judges, based on the STS detection section start signal input from the STS section start detecting unit 134 of the STS start detecting unit 108, whether or not the start of a new STS detection section has been detected (refer to steps S106 to S111 shown in FIG. 6).

The LTS detecting unit 109 performs the process for detecting the LTS from the digital baseband signal input from the A/D converting unit 104, and outputs an LTS detection signal reflecting the detection result to the AGC unit 111d. The wireless communication device 100d performs a channel estimation based on (i) the digital baseband signal output from the A/D converting unit 104 in correspondence with the LTS and (ii) the reference signal based on the LTS.

At time $TD_4$, when the LTS detection signal input from the LTS detecting unit 109 has changed from a low level to a high level, the AGC unit 111d fixes the gain value of the variable gain amplifying unit 102 to a gain value $G_5$. Note that since there are two LTSs, even at time $TD_5$, the LTS detection signal is at a high level for the pulse period.

The demodulation unit 110 equalizes digital baseband signals output from the A/D converting unit 104 in correspondence with the SIGNAL symbol and the DATA symbol based on the channel estimation result, and demaps the equalized digital baseband signals. The demodulation unit 110 judges whether or not demodulation of wireless packet signal is completed, based on the data length included in the SIGNAL symbol, and outputs a demodulation completion signal reflecting the judgment result to the AGC unit 111d.

At time $TD_6$, the demodulation unit 110 completes the demodulation of the wireless packet signal, and starts to output a high-level demodulation completion signal to the AGC unit 111d for the pulse period. On recognizing that the demodulation completion signal input from the demodulation unit 110 has changed from a low level to a high level, the AGC unit 111d sets the gain value of the variable gain amplifying unit 102 to the initial gain value $G_1$.

<<Embodiment 6>>

In the wireless communication system, when a wireless communication device detects an STS in a frequency channel that is used in a wireless communication performed by the wireless communication device, the wireless packet signal to which the detected STS is attached may not necessarily be a desired packet signal.

With respect to a wireless packet signal that is not destined to the wireless communication device itself, it is preferable for the wireless communication device to refrain from performing the demodulation process or stop the demodulation process being performed, to prevent wasteful consumption of power.

A judgment method is thus proposed here. The judgment method, to prevent wasteful consumption of power, makes it possible to judge at an early time whether or not a wireless packet signal is destined to the wireless communication device itself (hereinafter, the wireless packet signal other than the desired packet signal is referred to as an "interference packet signal").

Note that the method of judging at an early time whether a wireless packet signal is a desired packet signal or an interference packet signal is explained in Embodiments 6 and 7, and in Embodiment 8, the wireless communication device of Embodiment 1 incorporated with the judgment method of Embodiment 6 will be explained.

Figure 41:
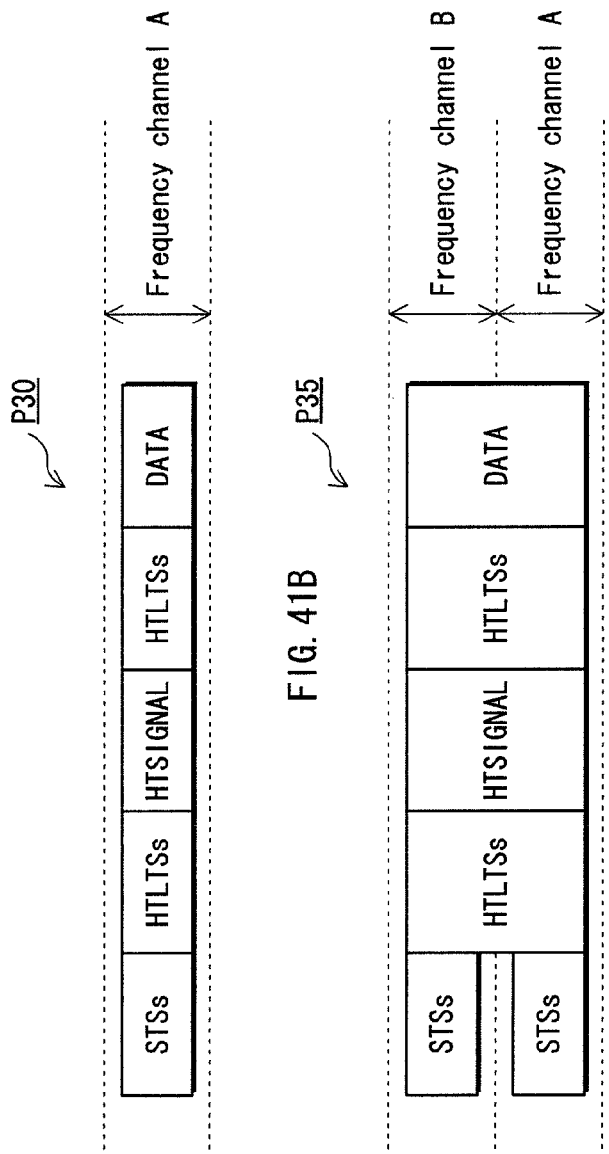
FIGS. 41A and 41B show other frame formats of the wireless packet signal transferred in the wireless communication system.
Figure 42:
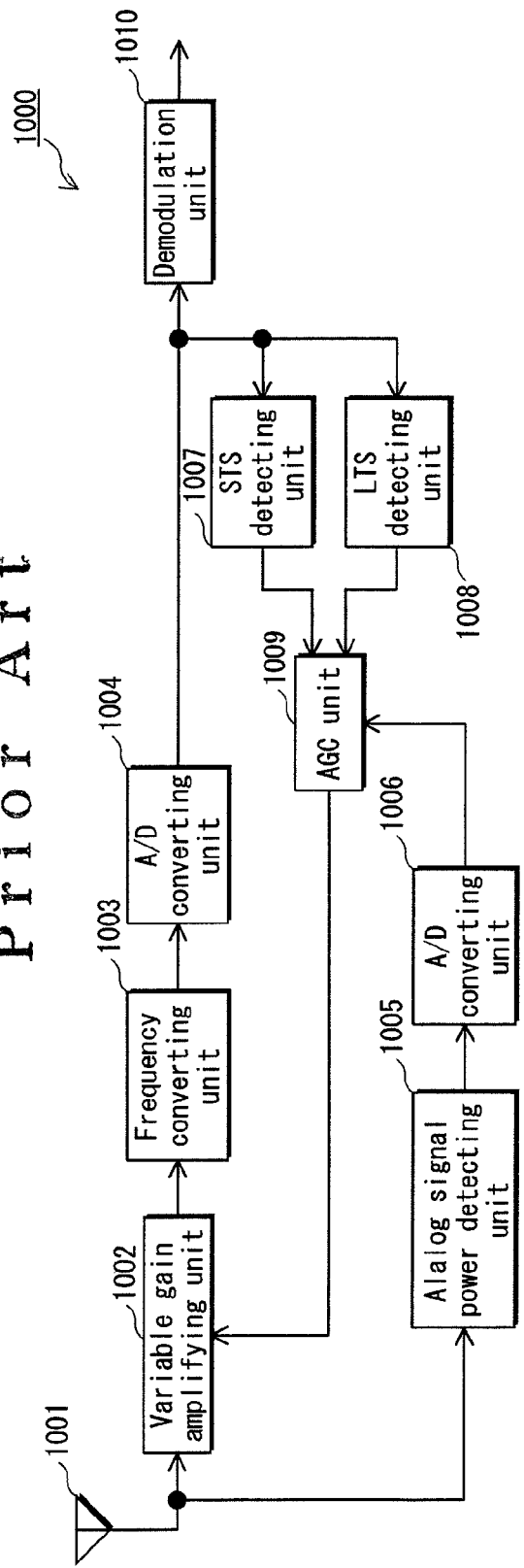
FIG. 42 shows the structure of a conventional wireless communication device.

The following describes Embodiment 6, the sixth embodiment of the present invention, with reference to the attached drawings. It is presumed that the wireless communication systems recited in the present embodiment and onwards conform to the IEEE 802.11n standard. It is also presumed that, in the present embodiment and onwards, the frame format used in wireless communications is a frame format in the mixed mode (a mode in which a wireless communication device conforming to the IEEE 802.11a standard and a wireless communication device conforming to the IEEE 802.11n coexist) that is defined as usable in the IEEE 802.11n standard. Note that the frame formats that are defined as usable in the IEEE 802.11n include a frame format of the legacy mode (see FIG. 2) and a frame format of the green field mode (see FIG. 41) other than the frame format of the mixed mode, where the legacy mode is a mode corresponding to wireless communication devices conforming to the existing IEEE 802.11a standard, and the green field mode is a high-efficiency mode dedicated to wireless communication devices conforming to the IEEE 802.11n standard.

<Frame Format of Wireless Packet Signal>

Figure 26A:
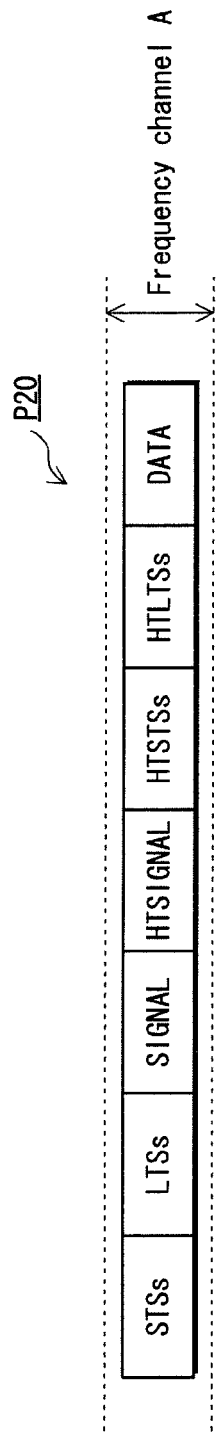
FIGS. 26A and 26B show the frame format of the wireless packet signal transferred in the wireless communication system in Embodiment 6.
Figure 26B:
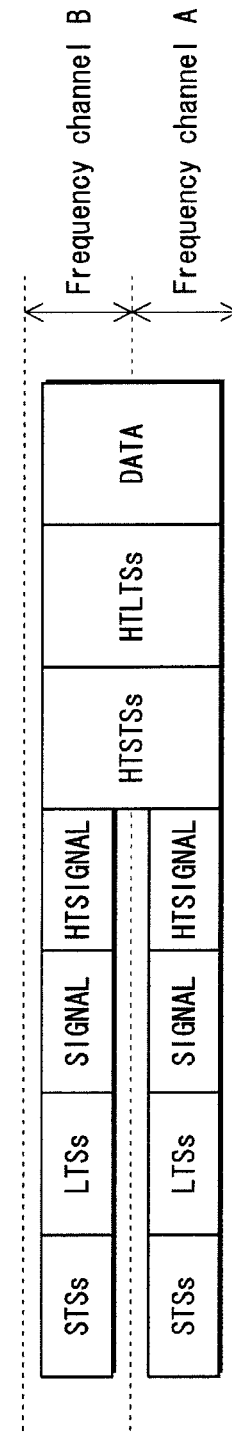

FIGS. 26A and 26B show the frame format of the mixed mode.

The frame format of the mixed mode falls in the frame format shown in FIG. 26A and the frame format shown in FIG. 26B. The frame format shown in FIG. 26A is used for the wireless packet signal that is transmitted over one frequency channel (the frequency channel A in this example), and the frame format shown in FIG. 26B is used for the wireless packet signal that is transmitted over a wideband frequency channel that has been made wideband by bonding two frequency channels (the frequency channels A and B in this example).

A wireless packet signal P20 having the frame format shown in FIG. 26A includes, at the head thereof, a short preamble signal STSs that is composed of STSs $11_1$ to $11_{10}$ shown in FIG. 2. In the wireless packet signal P20, the short preamble signal STSs is followed by a long preamble signal LTSs that is composed of GI $12_1$ and LTSs $12_2$ and $12_3$ shown in FIG. 2. In the wireless packet signal P20, the long preamble signal LTSs is followed by a SIGNAL symbol. Note that the short preamble signal STSs, the long preamble signal LTSs, and the SIGNAL symbol constitute a signal portion for the wireless communication device conforming to the IEEE 802.11a standard.

In the wireless packet signal P20, the SIGNAL symbol is followed by an HTSIGNAL symbol which stands for "High Throughput SIGNAL symbol" that is a control symbol having control information such as the number of MIMO-multiplexed streams, the data length, and the transfer speed.

In the wireless packet signal P20, the HTSIGNAL symbol is followed by an HT short preamble signal HTSTSs which includes a plurality of HTSTSs (High Throughput Short Training Symbols), and an HT long preamble signal HTLTSs which includes a plurality of HTLTSs (High Throughput Long Training Symbols). Note that the HTSIGNAL symbol, the HT short preamble signal HTSTSs, and the HT long preamble signal HTLTSs constitute a signal portion for the wireless communication device conforming to the IEEE 802.11n standard. The HTSTS is used for an automatic gain control, a rough adjustment of the carrier frequency error, a detection of the symbol timing and the like. The HTLTS is used for a rough adjustment of the carrier frequency error, a channel estimation (estimation of reference amplitude and reference phase) and the like. Note that there are as many HT long preamble signals HTLTSs as MIMO channels.

In the wireless packet signal P20, the HT long preamble signal HTLTSs is followed by DATA symbol which has information concerning the transmission data. Note that there are a plurality of DATA symbols, and the destination information and the source information are transferred by the DATA symbols.

A wireless packet signal P25 having the frame format shown in FIG. 26B includes, in each of the frequency channels A and B, the short preamble signal STSs, the long preamble signal LTSs, the SIGNAL symbol, and the HTSIGNAL symbol. Following these, the wireless packet signal P25 includes, in a wideband frequency channel that has been made wideband by bonding the two frequency channels A and B, the HT short preamble signal HTSTSs, the HT long preamble signal HTLTSs, and the DATA symbol. Note that there are one or more DATA symbols, and the destination information and the source information are transferred by the DATA symbols.

The HT short preamble signal HTSTSs and onwards in the wireless packet signal P25 are intended to achieve a high-speed process, by the MIMO multiplexing and bonding channels together. The wireless communication devices conforming to the IEEE 802.11n standard can demodulate the HT short preamble signal HTSTSs and onwards of the wireless packet signal P25, but not the wireless communication devices conforming to the IEEE 802.11a standard. However, when a wireless communication device conforming to the IEEE 802.11a standard receives the wireless packet signal P20 or P25 having the frame format of the mixed mode, the wireless communication device starts demodulation of the signal by detecting the STSs and LTSs, and identifies the data length by demodulating the SIGNAL symbol. Therefore, although the wireless communication device conforming to the IEEE 802.11a cannot demodulate the HT short preamble signal HTSTSs and onwards of the signal, the wireless communication device can handle the signal as a signal that caused a demodulation error. In this way, the communication protocol of the IEEE 802.11a and the communication protocol of the IEEE 802.11n can coexist.

Hereinafter, the wireless packet signal having the frame format shown in FIG. 26A for being transmitted over one frequency channel is referred to as a "narrowband packet signal". Also, the wireless packet signal having the frame format shown in FIG. 26B for being transmitted over a wideband frequency channel that has been made wideband by bonding two adjacent frequency channels is referred to as a "wideband packet signal".

<Relationships Between Wireless Packet Signals and Frequency Channels>

Now, a description is given of the relationships between the frequency channels and wireless packet signals being an object of the judgment performed by the wireless communication device in the present embodiment, with reference to FIG. 27. FIG. 27 shows in schematic form the relationships between the frequency channels and the wireless packet signals being an object of the judgment performed by the wireless communication device in the present embodiment.

FIG. 27 shows four frequency channels CH1 to CH4 which have the same bandwidth. It is presumed here that the wireless communication device performs a wireless communication using the frequency channel CH2 as the primary channel, and the frequency channel CH3 as the secondary channel. Note that in the following description, the frequency channel CH2 may be referred to as the "primary channel CH2" as necessary, and the frequency channel CH3 may be referred to as the "secondary channel CH3" as necessary.

A wireless packet signal 601 that is transmitted over the primary channel CH2 and a wireless packet signal 603 that is transmitted over the secondary channel CH3 are narrowband packet signals having the frame format shown in FIG. 26A. Note that the wireless packet signal 601 may be a desired packet signal in some cases and may be an interference packet signal in other cases, and that the wireless packet signal 603 is an interference packet signal in the present embodiment.

Wireless packet signals 602, 604 and 605 are wideband packet signals having the frame format shown in FIG. 26B. Note that the wireless packet signal 602 may be a desired packet signal in some cases and may be an interference packet signal in other cases, and that the wireless packet signals 604 and 605 are interference packet signals.

<Structure of Wireless Communication Device>

Figure 28:
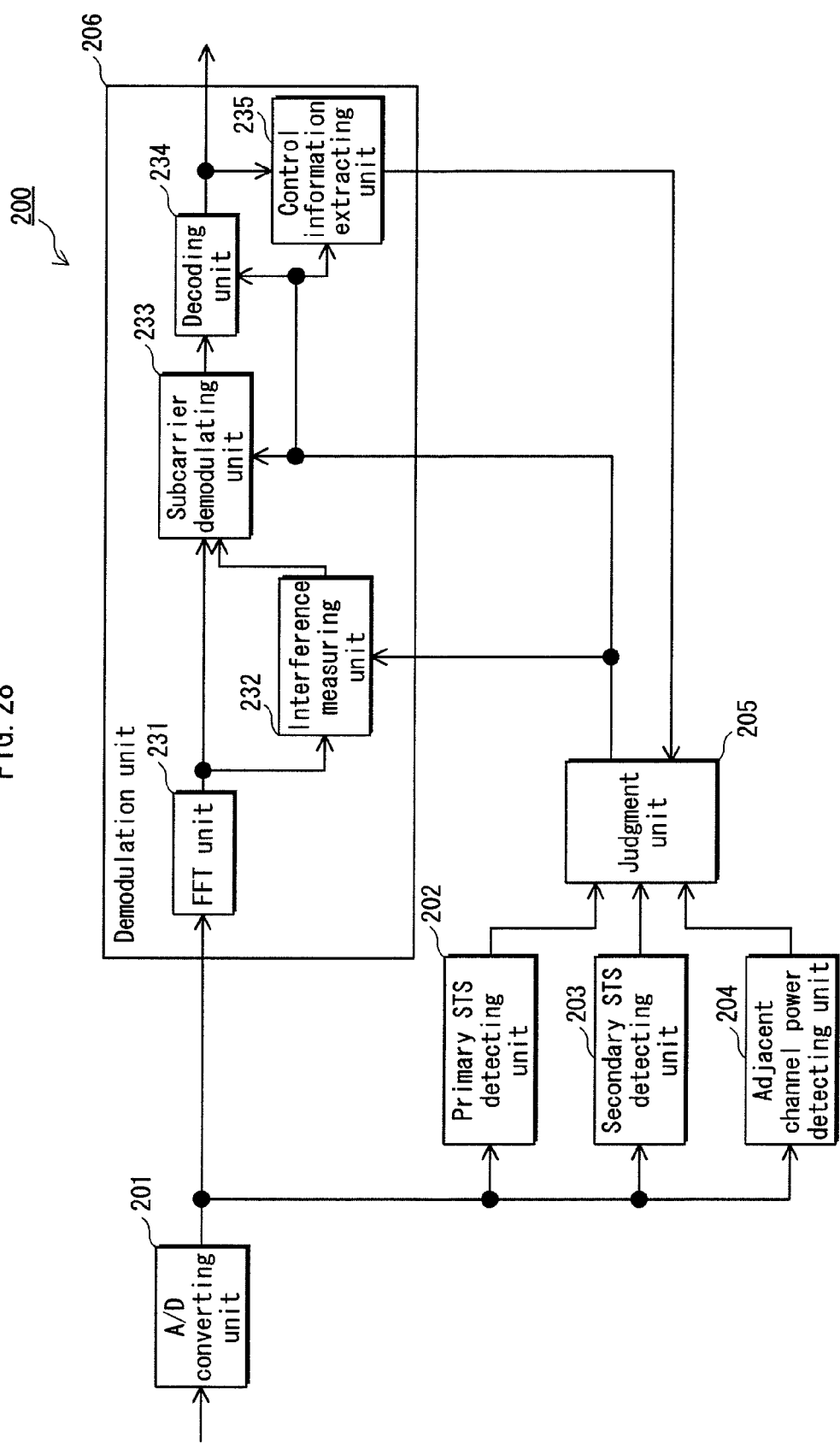
FIG. 28 shows the structure of the wireless communication device in Embodiment 6.

The following explains the structure of the wireless communication device in the present embodiment with reference to FIG. 28. FIG. 28 shows the structure of the wireless communication device in the present embodiment.

A wireless communication device 200 includes an A/D converting unit 201, a primary STS detecting unit 202, a secondary STS detecting unit 203, an adjacent channel power detecting unit 204, a judgment unit 205, and a demodulation unit 206.

In the following description, STSs that are transmitted over the primary channel CH2 are referred to as "primary STSs", and STSs that are transmitted over the secondary channel CH3 are referred to as "secondary STSs".

[A/D Converting Unit 201]

The A/D converting unit 201 converts an input analog baseband signal into a digital baseband signal, and outputs the digital baseband signal to the primary STS detecting unit 202, the secondary STS detecting unit 203, the adjacent channel power detecting unit 204, and the demodulation unit 206.

[Primary STS Detecting Unit 202]

The primary STS detecting unit 202 performs a detection process for observing the band of the primary channel CH2 and detecting a primary STS from the digital baseband signal output from the A/D converting unit 201. Upon detecting a primary STS, the primary STS detecting unit 202 outputs a high-level primary STS detection signal to the judgment unit 205 for the pulse period.

[Secondary STS Detecting Unit 203]

The secondary STS detecting unit 203 performs a detection process for observing the band of the secondary channel CH3 and detecting a secondary STS from the digital baseband signal output from the A/D converting unit 201. Upon detecting a secondary STS, the secondary STS detecting unit 203 outputs a high-level primary STS detection signal to the judgment unit 205 for the pulse period. Note that the primary STS detecting unit 202 and the secondary STS detecting unit 203 respectively perform the detection processes for detecting the primary STS and the secondary STS, where the detection processes are similar to the process performed by the STS detecting unit 107.

[Adjacent Channel Power Detecting Unit 204]

In the following description, the frequency channel CH1, namely, a frequency channel that is adjacent to a side of the primary channel CH2 opposite to the secondary channel CH3, is referred to as a "primary adjacent channel CH1".

The adjacent channel power detecting unit 204 observes the bands of the primary adjacent channel CH1 to detect a value of power of a signal component (hereinafter referred to as "primary adjacent channel component") of the digital baseband signal in the bands of the primary adjacent channel CH1. The adjacent channel power detecting unit 204 then compares the power value of the primary adjacent channel component with a predetermined component power threshold value (a threshold value used to judge whether a signal exists). When the power value of the primary adjacent channel component is equal to or larger than the component power threshold value, the adjacent channel power detecting unit 204 outputs a high-level primary adjacent channel detection signal to the judgment unit 205 for the pulse period, indicating that a signal component of the primary adjacent channel CH1 was detected.

The adjacent channel power detecting unit 204, using the BPF (Band Pass Filter), extracts the primary adjacent channel component from the digital baseband signal output from the A/D converting unit 201, and detects the power value of the primary adjacent channel component. Instead of the BPF, the adjacent channel power detecting unit 204 may use the Fourier transform, the wavelet transform, or the filter bank to extract the primary adjacent channel component from the digital baseband signal output from the A/D converting unit 201.

[Judgment Unit 205]

The judgment unit 205 receives the primary STS detection signal from the primary STS detecting unit 202, receives the secondary STS detection signal from the secondary STS detecting unit 203, receives the primary adjacent channel detection signal from the adjacent channel power detecting unit 204, and receives control information notification signal from a control information extracting unit 235, which will be described later, of the demodulation unit 206.

The judgment unit 205 judges which of the wireless packet signals 601 to 605 shown in FIG. 27 corresponds to the received wireless packet signal, based on the primary STS detection signal, the secondary STS detection signal, and the primary adjacent channel detection signal. When a wireless packet signal is received, this judgment can be performed in the period in which STSs of the wireless packet signal are received. Accordingly, it is possible to complete the process of judging which of the wireless packet signals 601 to 605 corresponds to the received wireless packet signal, in a short time period after the wireless packet signal is received.

When it judges that the received wireless packet signal corresponds to the wireless packet signal 601 or 602 that may be the desired packet signal or the interference packet signal, the judgment unit 205 further judges whether or not the received wireless packet signal 601 or 602 is destined to the wireless communication device itself, based on the destination information included in the control information notification signal.

[Demodulation Unit 206]

The demodulation unit 206 demodulates the digital baseband signal input from the A/D converting unit 201. The demodulation unit 206 includes an FFT unit 231, an interference measuring unit 232, a subcarrier demodulating unit 233, a decoding unit 234, and a control information extracting unit 235. Note that the activation and stop of the FFT unit 231, interference measuring unit 232, subcarrier demodulating unit 233, decoding unit 234, and control information extracting unit 235 are controlled by the judgment unit 205.

(FFT Unit 231)

The FFT (Fast Fourier Transform) unit 231 separates the digital baseband signal input from the A/D converting unit 201 into a plurality of subcarriers by performing a fast Fourier transform onto the digital baseband signal, and outputs digital signals corresponding to the plurality of subcarriers (hereinafter, the digital signals are referred to as "digital subcarrier signals") to the interference measuring unit 232 and the subcarrier demodulating unit 233. As the means for separating the digital baseband signal into subcarriers, the wavelet transform or the filter bank may be used in stead of the fast Fourier transform.

(Interference Measuring Unit 232)

The interference measuring unit 232 measures the amount of characteristics of the interference packet signals corresponding to the subcarriers, based on the digital subcarrier signals output from the FFT unit 231, and holds the measured amount of characteristics of the interference packet signal for each subcarrier. Note however that the interference measuring unit 232 measures the amount of characteristics of the interference packet signals by, for example, calculating, for each subcarrier, the covariance matrix of the interference signal matrix whose matrix elements are the interference packet signals.

(Subcarrier Demodulating Unit 233)

The subcarrier demodulating unit 233 performs, for each subcarrier, a channel estimation (estimation of reference amplitude and reference phase) based on the digital subcarrier signals corresponding to the subcarriers output from the FFT unit 231 in relation to the LTS or the HTLTS.

The subcarrier demodulating unit 233 demodulates each digital subcarrier signal output from the FFT unit 231 in relation to the SIGNAL symbol, the HTSIGNAL symbol, and the DATA symbol. Note however that the subcarrier demodulating unit 233 performs the demodulation process using the estimated reference amplitude and reference phase until it is judged that the wireless packet signal being received is a desired packet signal. Also, the subcarrier demodulating unit 233 performs the demodulation process using the estimated reference amplitude and reference phase and the amount of characteristics held by the interference measuring unit 232 after it is judged that the wireless packet signal being received is a desired packet signal.

(Decoding Unit 234)

The decoding unit 234 performs the demapping process using the digital signal obtained as a result of demodulation by the subcarrier demodulating unit 233, and outputs a digital signal (hereinafter referred to as "decoded data") that was obtained as a result of the demapping process.

(Control Information Extracting Unit 235)

The control information extracting unit 235 extract information including the data length, the transfer speed, indication of either the narrowband packet signal or the braodband packet signal, from the decoded data output from the decoding unit 234 in relation to the SIGNAL symbol or the HTSIGNAL symbol. Also, the control information extracting unit 235 extracts the destination information and the source information from the decoded data output from the decoding unit 234 in relation to the DATA symbol. The control information extracting unit 235 sequentially outputs control information notification signals including the extracted information to the judgment unit 205.

<Operation of Wireless Communication Device>

Figure 29:
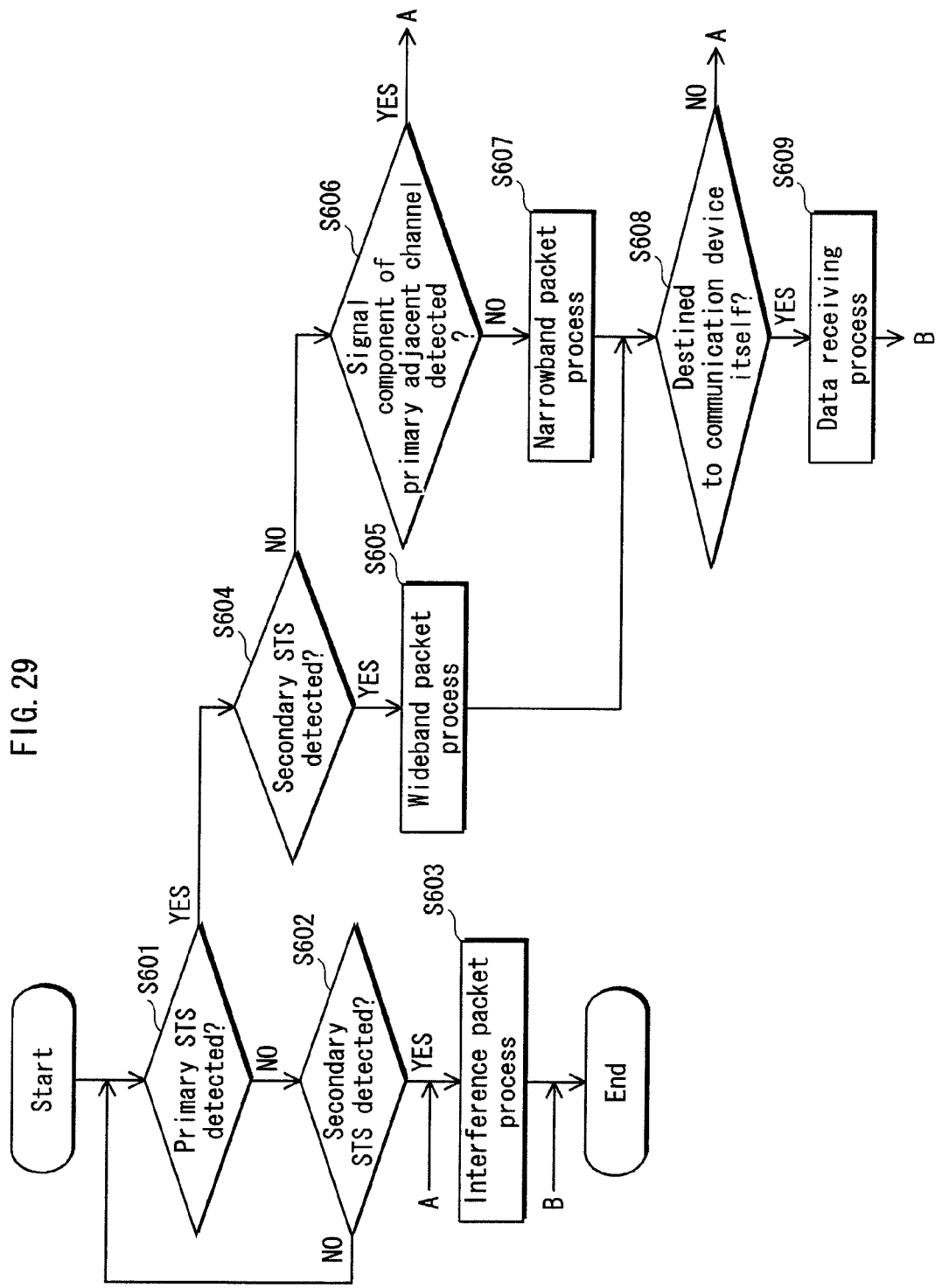
FIG. 29 is a flowchart showing the procedure for the judgment process on the wireless packet signal performed by the judgment unit shown in FIG. 28.

The following describes the judgment process on the wireless packet signal performed by the judgment unit 205 shown in FIG. 28, with reference to FIG. 29. FIG. 29 is a flowchart showing the procedure for the judgment process on the wireless packet signal performed by the judgment unit 205 shown in FIG. 28.

Note the following. An analog baseband signal is input into the A/D converting unit 201. The analog baseband signal is converted into a digital baseband signal by the A/D converting unit 201, and the digital baseband signal is output from the A/D converting unit 201.

The primary STS detecting unit 202, the secondary STS detecting unit 203, and the adjacent channel power detecting unit 204 respectively perform predetermined processes and output the primary STS detection signal, the secondary STS detection signal, and the primary adjacent channel detection signal, to the judgment unit 205.

The judgment unit 205 judges based on the primary STS detection signal whether or not a primary STS has been detected in the primary channel CH2 (step S601). Note that, when the primary STS detection signal has changed from a low level to a high level, the judgment unit 205 judges that a primary STS has been detected.

When it judges that a primary STS has not been detected (step S601: NO), the judgment unit 205 judges based on the secondary STS detection signal whether or not a secondary STS has been detected in the secondary channel CH3 (step S602). Note that, when the secondary STS detection signal has changed from a low level to a high level, the judgment unit 205 judges that a secondary STS has been detected.

When it judges that a secondary STS has not been detected (step S602: NO), the judgment unit 205 returns to step S601.

When it judges that a secondary STS has been detected (step S602: YES), the judgment unit 205 judges that the wireless packet signal being received is an interference packet signal (the wireless packet signal 603, 604), and instructs the demodulation unit 206 to execute the interference packet process (step S603). Note that, upon receiving the instruction, the demodulation unit 206 activates the FFT unit 231 and the interference measuring unit 232. The interference measuring unit 232 measures the amount of characteristics of interference packet signals, and holds the measured amount of characteristics (the interference packet process). Note that, during the interference packet process, the subcarrier demodulating unit 233, the decoding unit 234, and the control information extracting unit 235 stop operating.

When it judges that a primary STS has been detected (step S601: YES), the judgment unit 205 judges based on the secondary STS detection signal whether or not a secondary STS has been detected in the secondary channel CH3 at substantially the same time as the primary STS has been detected (step S604). Note that, when the secondary STS detection signal has changed from a low level to a high level at substantially the same time as the primary STS detection signal has changed from a low level to a high level, the judgment unit 205 judges that the secondary STS has been detected at substantially the same time as the primary STS has been detected.

Note that when the primary STS and the secondary STS have the same waveform, the primary STS and the secondary STS corresponding to the same packet signal are detected at the same time. However, due to, for example, a delay on the transmission path or a predetermined delay given by the transmission side, the primary STS and the secondary STS may be detected at slightly different times. In view of this, a time width is preliminarily set such that it can be assumed that the primary STS and the secondary STS have been transmitted at the same time, and when the primary STS and the secondary STS are detected within the time width, it is judged that the secondary STS has been detected at substantially the same time as the primary STS has been detected.

When it judges that the secondary STS has been detected at substantially the same time as the primary STS has been detected (step S604: YES), the judgment unit 205 judges that the wireless packet signal being received is a wideband packet signal (the wireless packet signal 602) that may be a desired packet signal or an interference packet signal. And the judgment unit 205 instructs the demodulation unit 206 to execute the wideband packet process (step S605). Note that, upon receiving the instruction, the demodulation unit 206 activates the FFT unit 231, the subcarrier demodulating unit 233, the decoding unit 234, and the control information extracting unit 235, and executes the wideband packet process in relation to the primary channel CH2 and the secondary channel CH3. During the execution of the wideband packet process, a control information notification signal including the destination information is output from the control information extracting unit 235 to the judgment unit 205.

When it judges that the secondary STS has not been detected at substantially the same time as the primary STS has been detected (step S604: NO), the judgment unit 205 judges whether or not a signal component of the primary adjacent channel CH1 has been detected at substantially the same time as the primary STS has been detected (step S606). Note that, when the primary adjacent channel detection signal has changed from a low level to a high level at substantially the same time as the primary STS detection signal has changed from a low level to a high level, the judgment unit 205 judges that the signal component of the primary adjacent channel CH1 has been detected at substantially the same time as the primary STS has been detected.

Note that when the primary STS and the STS that is transmitted over the primary adjacent channel CH1 (hereinafter, the STS is referred to as "primary adjacent STS") have the same waveform, the primary STS and the primary adjacent STS corresponding to the same packet signal are detected at the same time. However, due to, for example, a delay on the transmission path or a predetermined delay given by the transmission side, the primary STS and the primary adjacent STS may be detected at slightly different times. In view of this, a time width is preliminarily set such that it can be assumed that the primary STS and the primary adjacent STS have been transmitted at the same time, and when the primary STS and the signal component of the primary adjacent channel CH1 are detected within the time width, it is judged that the signal component of the primary adjacent channel CH1 has been detected at substantially the same time as the primary STS has been detected.

When it judges that the signal component of the primary adjacent channel CH1 has been detected at substantially the same time as the primary STS has been detected (step S606: YES), the judgment unit 205 judges that the wireless packet signal being received is an interference packet signal (the wireless packet signal 605), and instructs the demodulation unit 206 to execute the interference packet process (step S603). Upon receiving the instruction, the demodulation unit 206 activates the FFT unit 231 and the interference measuring unit 232, and performs the interference packet process.

When it judges that the signal component of the primary adjacent channel CH1 has not been detected at substantially the same time as the primary STS has been detected (step S606: NO), the judgment unit 205 judges that the wireless packet signal being received is a narrowband packet signal (the wireless packet signal 601) that may be a desired packet signal or an interference packet signal, and instructs the demodulation unit 206 to execute the narrowband packet process (step S607). Upon receiving the instruction, the demodulation unit 206 activates the FFT unit 231, the subcarrier demodulating unit 233, the decoding unit 234, and the control information extracting unit 235, and performs the narrowband packet process in relation to the primary channel CH2. During the execution of the narrowband packet process, a control information notification signal including the destination information is output from the control information extracting unit 235 to the judgment unit 205.

When the destination information is extracted from the decoded data by the control information extracting unit 235, the judgment unit 205 judges, based on the destination information included in the control information notification signal input from the control information extracting unit 235, whether or not the wireless packet signal being received is a desired packet signal (step S608).

When it judges that the wireless packet signal being received is not a desired packet signal, that is, it is an interference packet signal (step S608: NO), the judgment unit 205 instructs the demodulation unit 206 to execute the interference packet process (step S603). Upon receiving the instruction, the demodulation unit 206 stops the operation of the subcarrier demodulating unit 233, the decoding unit 234, and the control information extracting unit 235, activates the interference measuring unit 232, and performs the interference packet process.

When it judges that the wireless packet signal being received is a desired packet signal (step S608: YES), the judgment unit 205 instructs the demodulation unit 206 to execute the data receiving process (step S609). Note that, upon receiving the instruction, the demodulation unit 206 further activates the interference measuring unit 232, and performs the data receiving process using the amount of characteristics of previously received interference packet signals held by the interference measuring unit 232.

Note that, when the process of the demodulation unit 206 is performed by the hardware logic, it is possible to stop the operation of each unit that should be stopped operating, by stopping the supply of a clock signal or power to each unit that should be stopped operating. Note also that, when the process of the demodulation unit 206 is performed by programming with use of a general-purpose processor, it is possible to stop the operation of each unit that should be stopped operating, by preventing processing routines concerning each unit that should be stopped operating, from being called.

When a wireless packet signal is being received, the above-described judgment processes in steps S601, S602, S604, and S606 are performed in a signal section corresponding to the STSs (the primary and secondary STSs) attached to the head of the wireless packet signal. Accordingly, it is possible to complete the judgment on whether the wireless packet signal being received is an interference packet signal (the wireless packet signal 603, 604, 605) or the wireless packet signal 601 or 602 that may be a desired packet signal or an interference packet signal, in a short time period after the wireless packet signal is received.

With the above-described structure, the activation and stop of the constituent units of the demodulation unit 206 are controlled in accordance with the results of the judgment processes in steps S601, S602, S604, and S608. This prevents the power from being consumed wastefully due to unnecessary operation of the constituent units of the demodulation unit 206.

<<Embodiment 7>>

The following describes Embodiment 7, the seventh embodiment of the present invention, with reference to the attached drawings.

The wireless communication device of the present embodiment operates as follows, as one example. When the wireless communication device is to notify another wireless communication device of the use of a wideband frequency channel that has been made wideband by bonding two adjacent frequency channels, the wireless communication device transmits a pair of narrowband packet signals having the frame format shown in FIG. 26A, over the two adjacent frequency channels at substantially the same time, respectively. Note that, in the following, the pair of narrowband packet signals that are transmitted over the two adjacent frequency channels at substantially the same time is referred to as a "paired narrowband packet signal".

In Embodiment 7, the paired narrowband packet signals are an object of judgment performed by the wireless communication device of Embodiment 7, as well as the wireless packet signals that are an object of judgment performed by the wireless communication device of Embodiment 6.

<Relationships Between Wireless Packet Signals and Frequency Channels>

Now, a description is given of the relationships between the frequency channels and wireless packet signals being an object of the judgment performed by the wireless communication device in the present embodiment, With reference to FIGS. 30 and 31. FIGS. 30 and 31 show in schematic form the relationships between the frequency channels and the wireless packet signals being an object of the judgment performed by the wireless communication device in the present embodiment.

FIGS. 30 and 31 each show four frequency channels CH1 to CH4 which have the same bandwidth. It is presumed here that the wireless communication device performs a wireless communication using the frequency channel CH2 as the primary channel, and the frequency channel CH3 as the secondary channel.

A wireless packet signal 701 that is transmitted over the primary channel CH2 and a wireless packet signal 706 that is transmitted over the secondary channel CH3 are narrowband packet signals having the frame format shown in FIG. 26A. Note that the wireless packet signal 701 may be a desired packet signal in some cases and may be an interference packet signal in other cases, and different from Embodiment 6, the wireless packet signal 706 may be a desired packet signal in some cases and may be an interference packet signal in other cases. This has been set in view of the fact that the wireless communication device may notify another wireless communication device of the use of a frequency channel, by using a narrowband packet signal having the frame format shown in FIG. 26A.

Wireless packet signals 702, 707, and 708 are wideband packet signals having the frame format shown in FIG. 26B. Note that the wireless packet signal 702 may be a desired packet signal in some cases and may be an interference packet signal in other cases, and that the wireless packet signals 707 and 708 are interference packet signals.

Wireless packet signals 703a, 703b, 704a, 704b, 705a, and 705b are narrowband packet signals having the frame format shown in FIG. 26A. Note that the wireless packet signals 703a and 703b constitute a paired narrowband packet signal 703, the wireless packet signals 704a and 704b constitute a paired narrowband packet signal 704, and the wireless packet signals 705a and 705b constitute a paired narrowband packet signal 705. Note that each of the paired narrowband packet signals 703 to 705 may be a desired packet signal in some cases and may be an interference packet signal in other cases.

<Power Spectrum of Wireless Packet Signal>

Each narrowband packet signal having the frame format shown in FIG. 26A has subcarriers only in the bands other than the guard band of the frequency channel over which the signal itself is transmitted so that the subcarriers do not influence the wireless packet signals transmitted over the adjacent frequency channels. In other words, each narrowband packet signal does not have subcarriers in the guard band of the frequency channel over which the signal itself is transmitted.

The wideband packet signal having the frame format shown in FIG. 26B is transmitted over a wideband frequency channel that has been made wideband by bonding two adjacent frequency channels. For this reason, with respect to the wideband packet signal, subcarriers can be disposed as well in the guard bands of two adjacent frequency channels on the sides of the center of the two adjacent frequency channels. Note that, in the following, the subcarriers disposed in the guard bands are referred to as "out-of-band subcarriers".

The following describes the power spectrum of the subcarriers of the wireless packet signals shown in FIGS. 30 and 31, with reference to FIGS. 32A to 32C, 33A to 33B, and 34A to 34C. FIGS. 32A to 32C, 33A to 33B, and 34A to 34C show in schematic form the power spectrum of the subcarriers of the wireless packet signals shown in FIGS. 30 and 31.

FIGS. 32A to 32C show the power spectrums of the subcarriers constituting the HTLTS and DATA symbols of the frame format shown in FIG. 26B related to the wideband packet signals.

The power spectrum shown in FIG. 32A relates to a wideband packet signal 708 shown in FIG. 31. The wireless packet signal 708 includes out-of-band subcarriers in the guard bands of the frequency channel CH1 and the primary channel CH2 that are adjacent to each other, the guard bands being on the sides of the center of the two adjacent frequency channels. The power spectrum shown in FIG. 32B relates to a wideband packet signal 702 shown in FIG. 30. The wireless packet signal 702 includes out-of-band subcarriers in the guard bands of the primary channel CH2 and the secondary channel CH3 that are adjacent to each other, the guard bands being on the sides of the center of the two adjacent frequency channels. The power spectrum shown in FIG. 32C relates to a wideband packet signal 707 shown in FIG. 31. The wideband packet signal 707 includes out-of-band subcarriers in the guard bands of the secondary channel CH3 and the frequency channel CH4 that are adjacent to each other, the guard bands being on the sides of the center of the two adjacent frequency channels.

FIGS. 33A and 33B show the power spectrums of the subcarriers constituting the HTLTS and DATA symbols of the frame format shown in FIG. 26A related to the narrowband packet signals.

The power spectrum shown in FIG. 33A relates to a narrowband packet signal 701 shown in FIG. 30. The narrowband packet signal 701 does not include out-of-band subcarriers in the guard bands of the primary channel CH2. The power spectrum shown in FIG. 33B relates to a narrowband packet signal 706 shown in FIG. 30. The narrowband packet signal 706 does not include out-of-band subcarriers in the guard bands of the secondary channel CH3.

FIGS. 34A to 34C show the power spectrums of the subcarriers constituting the HTLTS and DATA symbols of the narrowband packet signals having the frame format shown in FIG. 26A.

The power spectrum shown in FIG. 34A relates to a paired narrowband packet signal 704 shown in FIG. 31. The paired narrowband packet signal 704 does not include out-of-band subcarriers in the guard bands of the frequency channel CH1 and the primary channel CH2. The power spectrum shown in FIG. 34B relates to a paired narrowband packet signal 703 shown in FIG. 30. The paired narrowband packet signal 703 does not include out-of-band subcarriers in the guard bands of the primary channel CH2 and the secondary channel CH3. The power spectrum shown in FIG. 34C relates to a paired narrowband packet signal 705 shown in FIG. 31. The paired narrowband packet signal 705 does not include out-of-band subcarriers in the guard bands of the secondary channel CH3 and the frequency channel CH4.

As understood from the above recitation, the out-of-band subcarriers exist only in the HTLTS and DATA symbols of the wideband packet signals. Therefore, it is possible to judge whether a wireless packet signal is the wideband packet signal or other than the wideband packet signal (the narrowband packet signal, the paired narrowband packet signal) based on whether or not the wireless packet signal has the out-of-band subcarriers.

<Structure of Wireless Communication Device>

Figure 35:
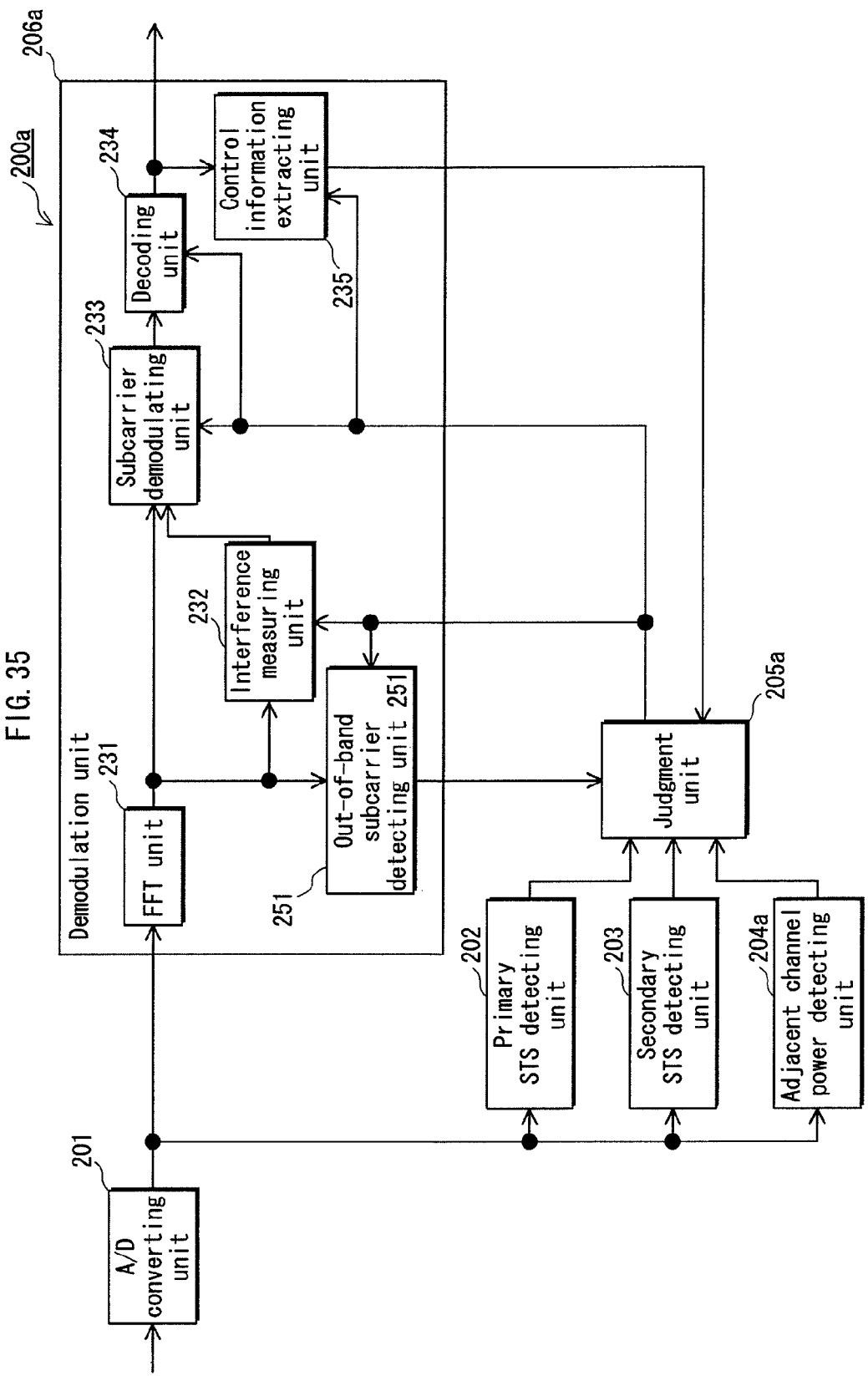
FIG. 35 shows the structure of the wireless communication device of Embodiment 7.

The following explains the structure of the wireless communication device of Embodiment 7, with reference to FIG. 35. FIG. 35 shows the structure of the wireless communication device of Embodiment 7. Note that the structural elements of Embodiment 7 that are substantially the same as the corresponding ones in Embodiment 6 are assigned the same reference numbers as the corresponding ones in Embodiment 6, and description thereof is omitted since description of the corresponding ones in Embodiment 6 is applicable thereto.

A wireless communication device 200a includes the A/D converting unit 201, the primary STS detecting unit 202, the secondary STS detecting unit 203, an adjacent channel power detecting unit 204a, a judgment unit 205a, and a demodulation unit 206a.

[Adjacent Channel Power Detecting Unit 204a]

In the following description, a frequency channel that is adjacent to a side of the secondary channel CH3 opposite to the primary channel CH2, namely, the frequency channel CH4, is referred to as a "secondary adjacent channel CH4".

The adjacent channel power detecting unit 204a performs the following process, in addition to the process related to the primary adjacent channel CH1 performed by the adjacent channel power detecting unit 204.

The adjacent channel power detecting unit 204a observes the bands of the secondary adjacent channel CH4 to detect a value of power of a signal component (hereinafter referred to as "secondary adjacent channel component") of the digital baseband signal in the bands of the secondary adjacent channel CH4. The adjacent channel power detecting unit 204a then compares the power value of the secondary adjacent channel component with a component power threshold value. When the power value of the secondary adjacent channel component is equal to or larger than the component power threshold value, the adjacent channel power detecting unit 204a outputs a high-level secondary adjacent channel detection signal to the judgment unit 205a for the pulse period, indicating that a signal component of the secondary adjacent channel CH4 was detected. Note that the BPF, the Fourier transform, the wavelet transform, or the filter bank may be used as the means for extracting the secondary adjacent channel component from the digital baseband signal.

[Judgment Unit 205a]

The judgment unit 205a receives, in addition to the signals received by the judgment unit 205, the secondary adjacent channel detection signal from the adjacent channel power detecting unit 204a, and a primary out-of-band subcarrier detection signal and a secondary out-of-band subcarrier detection signal from an out-of-band subcarrier detecting unit 251 (which will be described later) of the demodulation unit 206a.

The judgment unit 205a judges which of the wireless packet signals 701 to 708 shown in FIGS. 30 and 31 corresponds to the received wireless packet signal, based on the primary STS detection signal, the secondary STS detection signal, the primary adjacent channel detection signal, and the secondary adjacent channel detection signal.

The primary STS detection signal, the secondary STS detection signal, the primary adjacent channel detection signal, and the secondary adjacent channel detection signal are not sufficient enough to judge which of the wireless packet signal 704 and the wireless packet signal 708 corresponds to the received wireless packet signal, and are not sufficient enough to judge which of the wireless packet signal 705 and the wireless packet signal 707 corresponds to the received wireless packet signal.

In view of the above, based on the primary out-of-band subcarrier detection signal or the secondary out-of-band subcarrier detection signal, the judgment unit 205a judges which of the wireless packet signal 704 and the wireless packet signal 708 corresponds to the received wireless packet signal, or judges which of the wireless packet signal 705 and the wireless packet signal 707 corresponds to the received wireless packet signal. Accordingly, it is possible to complete the above-described judgment before the DATA symbol is received, since the judgment can be performed during the period during which the HTLTS is received.

When it judges that the received wireless packet signal corresponds to any of the wireless packet signals 701 to 706 that may be the desired packet signal or the interference packet signal, the judgment unit 205 further judges whether or not the received wireless packet signal corresponding to any of the wireless packet signals 701 to 706 is destined to the wireless communication device itself, based on the destination information included in the control information notification signal.

[Demodulation Unit 206a]

The demodulation unit 206a demodulates the digital baseband signal input from the A/D converting unit 201. The demodulation unit 206a includes an out-of-band subcarrier detecting unit 251, as well as the constituent elements of the demodulation unit 206. Note that the activation and stop of the FFT unit 231, interference measuring unit 232, subcarrier demodulating unit 233, decoding unit 234, and control information extracting unit 235 are controlled by the judgment unit 205a.

(Out-of-Band Subcarrier Detecting Unit 251)

The out-of-band subcarrier detecting unit 251 performs a detection process for detecting presence or nonpresence of an out-of-band subcarrier in the primary channel CH2 based on the digital subcarrier signal output from the FFT unit 231 in relation to the HTLTSs. The out-of-band subcarrier detecting unit 251 keeps on outputting a high-level primary out-of-band subcarrier detection signal to the judgment unit 205a while it detects presence of an out-of-band subcarrier in the primary channel CH2.

The out-of-band subcarrier detecting unit 251 also performs a detection process for detecting presence or nonpresence of an out-of-band subcarrier in the secondary channel CH3 based on the digital subcarrier signal output from the FFT unit 231 in relation to the HTLTSs. The out-of-band subcarrier detecting unit 251 keeps on outputting a high-level secondary out-of-band subcarrier detection signal to the judgment unit 205a while it detects presence of an out-of-band subcarrier in the secondary channel CH3.

<Operation of Wireless Communication Device>

Figure 36:
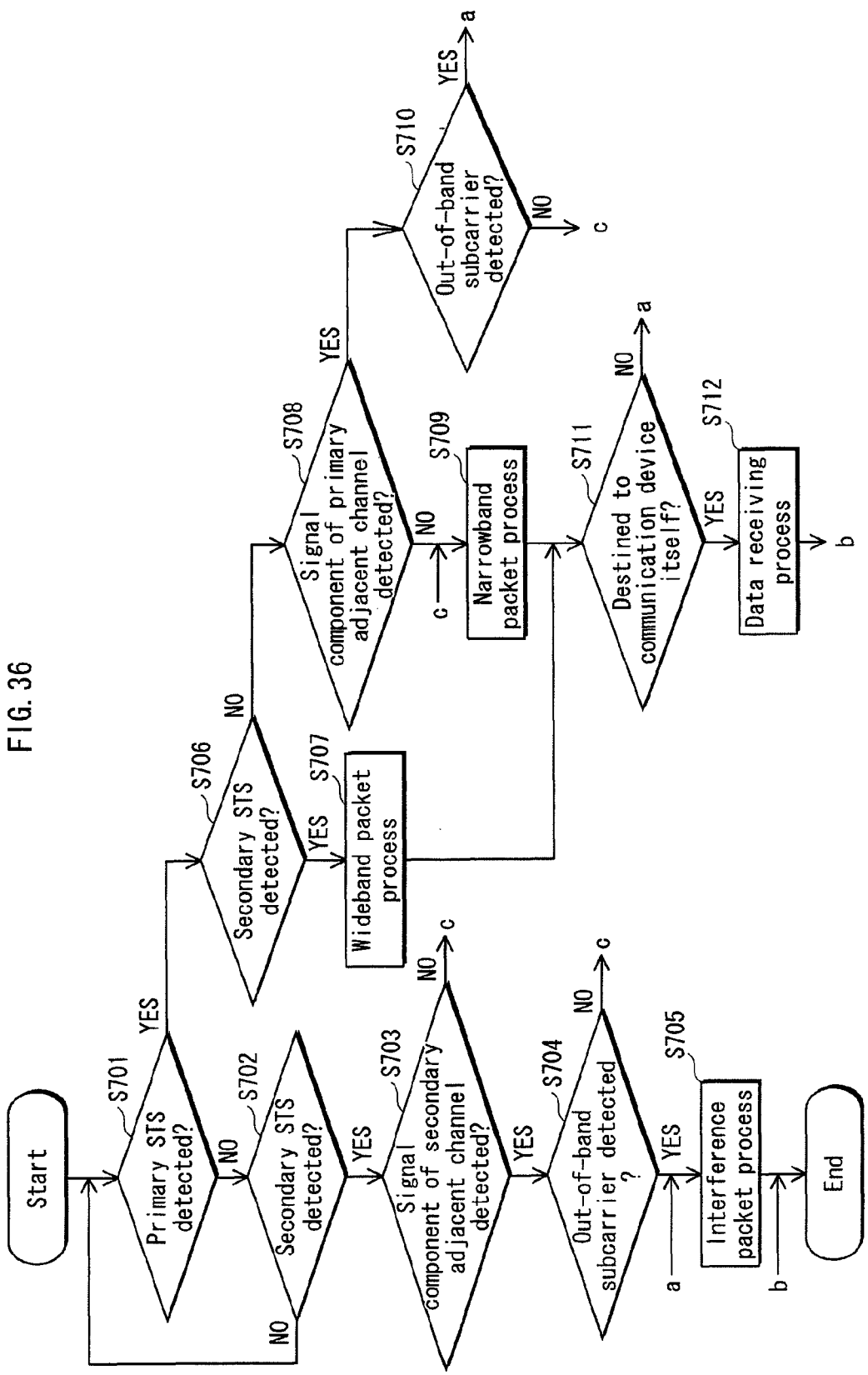
FIG. 36 is a flowchart showing the procedure for the judgment process on the wireless packet signal performed by the judgment unit shown in FIG. 36.

The following describes the judgment process on the wireless packet signal performed by the judgment unit 205a shown in FIG. 35, with reference to FIG. 36. FIG. 36 is a flowchart showing the procedure for the judgment process on the wireless packet signal performed by the judgment unit 205a shown in FIG. 36.

Note the following. An analog baseband signal is input into the A/D converting unit 201. The analog baseband signal is converted into a digital baseband signal by the A/D converting unit 201, and the digital baseband signal is output from the A/D converting unit 201.

The primary STS detecting unit 202, the secondary STS detecting unit 203, and the adjacent channel power detecting unit 204 respectively perform predetermined processes and output the primary STS detection signal, the secondary STS detection signal, the primary adjacent channel detection signal, and the secondary adjacent channel detection signal, to the judgment unit 205a.

The judgment unit 205a judges based on the primary STS detection signal whether or not a primary STS has been detected in the primary channel CH2 (step S701).

When it judges that a primary STS has not been detected (step S701: NO), the judgment unit 205a judges based on the secondary STS detection signal whether or not a secondary STS has been detected in the secondary channel CH3 (step S702). When it judges that a secondary STS has not been detected (step S702: NO), the judgment unit 205a returns to step S701.

When it judges that a secondary STS has been detected (step S702: YES), the judgment unit 205a judges based on the secondary adjacent channel detection signal whether or not a signal component of the secondary adjacent channel CH4 has been detected at substantially the same time as the secondary STS has been detected (step S703). Note that, when the secondary adjacent channel detection signal has changed from a low level to a high level at substantially the same time as the secondary STS detection signal has changed from a low level to a high level, the judgment unit 205a judges that the signal component of the secondary adjacent channel CH4 has been detected at substantially the same time as the secondary STS has been detected.

Note that when the secondary STS and the STS that is transmitted over the secondary adjacent channel CH4 (hereinafter, the STS is referred to as "secondary adjacent STS") have the same waveform, the secondary STS and the secondary adjacent STS corresponding to the same packet signal are detected at the same time. However, due to, for example, a delay on the transmission path or a predetermined delay given by the transmission side, the secondary STS and the secondary adjacent STS may be detected at slightly different times. In view of this, a time width is preliminarily set such that it can be assumed that the secondary STS and the secondary adjacent STS have been transmitted at the same time, and when the secondary STS and the signal component of the secondary adjacent channel CH4 are detected within the time width, it is judged that the signal component of the secondary adjacent channel CH4 has been detected at substantially the same time as the secondary STS has been detected.

When it judges that the signal component of the secondary adjacent channel CH4 has not been detected at substantially the same time as the secondary STS has been detected (step S703: NO), the judgment unit 205a judges that the wireless packet signal being received is a narrowband packet signal (the wireless packet signal 706) which may be a desired packet signal or an interference packet signal, and instructs the demodulation unit 206a to execute the narrowband packet process (step S709). Note that, upon receiving the instruction, the demodulation unit 206a activates the FFT unit 231, the subcarrier demodulating unit 233, the decoding unit 234, and the control information extracting unit 235, and executes the narrowband packet process in relation to the secondary channel CH3. During the execution of the narrowband packet process, a control information notification signal including the destination information is output from the control information extracting unit 235 to the judgment unit 205a.

When it judges that the signal component of the secondary adjacent channel CH4 has been detected at substantially the same time as the secondary STS has been detected (step S703: YES), the judgment unit 205a judges, based on the secondary out-of-band subcarrier detection signal input from the out-of-band subcarrier detecting unit 251, whether or not an out-of-band subcarrier has been detected in the secondary channel CH3 (step S704). Note that, when the secondary out-of-band subcarrier detection signal is at a high level, the judgment unit 205a judges that an out-of-band subcarrier has been detected in the secondary channel CH3.

Note that, when the signal component of the secondary adjacent channel CH4 is detected at substantially the same time as the secondary STS has been detected, the FFT unit 231, the subcarrier demodulating unit 233, the decoding unit 234, and the out-of-band subcarrier detecting unit 251 of the demodulation unit 206a are activated. And they execute processes for the long preamble signal LTSs, the SIGNAL symbol, the HTSIGNAL symbol, the HT short preamble signal HTSTSs, and the HT long preamble signal HTLTSs.

When it judges that an out-of-band subcarrier has not been detected (step S704: NO), the judgment unit 205a judges that the wireless packet signal being received is the narrowband packet signal 705a that constitutes the paired narrowband packet signal 705, and instructs the demodulation unit 206a to execute the narrowband packet process (step S709). Note that, upon receiving the instruction, the demodulation unit 206a maintains the operation of the FFT unit 231, the subcarrier demodulating unit 233, and the decoding unit 234, but stops the operation of the out-of-band subcarrier detecting unit 251, activates the control information extracting unit 235, and executes the narrowband packet process in relation to the secondary channel CH3. During the execution of the narrowband packet process, a control information notification signal including the destination information is output from the control information extracting unit 235 to the judgment unit 205a.

When it judges that an out-of-band subcarrier has been detected (step S704: YES), the judgment unit 205a judges that the wireless packet signal being received is an interference packet signal (the wideband packet signal 707) and instructs the demodulation unit 206a to execute the interference packet process (step S705). Note that, upon receiving the instruction, the demodulation unit 206a maintains the operation of the FFT unit 231, but stops the operation of the other currently operating units, activates the interference measuring unit 232, and executes the interference packet process.

When it judges in the judgment process in step S701 that a primary STS has been detected (step S701: YES), the judgment unit 205a judges based on the secondary STS detection signal whether or not a secondary STS has been detected in the secondary channel CH3 at substantially the same time as the primary STS has been detected (step S706).

When it judges that a secondary STS has been detected at substantially the same time as the primary STS has been detected (step S706: YES), the judgment unit 205a judges that the wireless packet signal being received is a wideband packet signal (the wireless packet signal 702, 703) which may be a desired packet signal or an interference packet signal, and instructs the demodulation unit 206a to execute the wideband packet process (step S707). Note that, upon receiving the instruction, the demodulation unit 206a activates the FFT unit 231, the subcarrier demodulating unit 233, the decoding unit 234, and the control information extracting unit 235, and executes the wideband packet process in relation to the primary channel CH2 and the secondary channel CH3. During the execution of the wideband packet process, a control information notification signal including the destination information is output from the control information extracting unit 235 to the judgment unit 205a.

When it judges that a secondary STS has not been detected at substantially the same time as the primary STS has been detected (step S706: NO), the judgment unit 205a judges based on the primary adjacent channel detection signal whether or not a signal component of the primary adjacent channel CH1 has been detected at substantially the same time as the primary STS has been detected (step S708).

When it judges that a signal component of the primary adjacent channel CH1 has not been detected at substantially the same time as the primary STS has been detected (step S708: NO), the judgment unit 205a judges that the wireless packet signal being received is a narrowband packet signal (the wireless packet signal 701) which may be a desired packet signal or an interference packet signal, and instructs the demodulation unit 206a to execute the narrowband packet process (step S709). Note that, upon receiving the instruction, the demodulation unit 206a activates the FFT unit 231, the subcarrier demodulating unit 233, the decoding unit 234, and the control information extracting unit 235, and executes the narrowband packet process in relation to the primary channel CH2. During the execution of the narrowband packet process, a control information notification signal including the destination information is output from the control information extracting unit 235 to the judgment unit 205a.

When it judges that a signal component of the primary adjacent channel CH1 has been detected at substantially the same time as the primary STS has been detected (step S708: YES), the judgment unit 205a judges, based on the primary out-of-band subcarrier detection signal input from the out-of-band subcarrier detecting unit 251, whether or not an out-of-band subcarrier has been detected in the primary channel CH2 (step S710). Note that, when the primary out-of-band subcarrier detection signal is at a high level, the judgment unit 205a judges that an out-of-band subcarrier has been detected in the primary channel CH2.

Note that, when the signal component of the primary adjacent channel CH4 is detected at substantially the same time as the secondary STS has been detected, the FFT unit 231, the subcarrier demodulating unit 233, the decoding unit 234, and the out-of-band subcarrier detecting unit 251 of the demodulation unit 206a are activated. And they execute processes for the long preamble signal LTSs, the SIGNAL symbol, the HTSIGNAL symbol, the HT short preamble signal HTSTSs, and the HT long preamble signal HTLTSs.

When it judges that an out-of-band subcarrier has not been detected (step S710: NO), the judgment unit 205a judges that the wireless packet signal being received is the narrowband packet signal 704a that constitutes the paired narrowband packet signal 704, and instructs the demodulation unit 206a to execute the narrowband packet process (step S709). Note that, upon receiving the instruction, the demodulation unit 206a maintains the operation of the FFT unit 231, the subcarrier demodulating unit 233, and the decoding unit 234, but stops the operation of the out-of-band subcarrier detecting unit 251, activates the control information extracting unit 235, and executes the narrowband packet process in relation to the primary channel CH2. During the execution of the narrowband packet process, a control information notification signal including the destination information is output from the control information extracting unit 235 to the judgment unit 205a.

When it judges that an out-of-band subcarrier has been detected (step S710: YES), the judgment unit 205a judges that the wireless packet signal being received is an interference packet signal (the wideband packet signal 708), and instructs the demodulation unit 206a to execute the interference packet process (step S705). Upon receiving the instruction, the demodulation unit 206a maintains the operation of the FFT unit 231, but stops the operation of the other currently operating units, activates the interference measuring unit 232, and executes the interference packet process.

When the destination information is extracted from the decoded data by the control information extracting unit 235, the judgment unit 205a judges, based on the destination information included in the control information notification signal input from the control information extracting unit 235, whether or not the wireless packet signal being received is a desired packet signal (step S711).

When it judges that the wireless packet signal being received is not a desired packet signal, that is, it is an interference packet signal (step S711: NO), the judgment unit 205a instructs the demodulation unit 206a to execute the interference packet process (step S705). Note that, upon receiving the instruction, the demodulation unit 206a maintains the operation of the FFT unit 231, but stops the operation of the other currently operating units, activates the interference measuring unit 232, and executes the interference packet process.

When it judges that the wireless packet signal being received is a desired packet signal (step S711: YES), the judgment unit 205a instructs the demodulation unit 206a to execute the data receiving process (step S712). Note that, upon receiving the instruction, the demodulation unit 206a further activates the interference measuring unit 232, and performs the data receiving process using the amount of characteristics of previously received interference packet signals.

When a wireless packet signal is being received, the above-described judgment processes in steps S701 to S703, S706, and S708 are performed in a signal section corresponding to the STSs (the primary and secondary STSs) attached to the head of the wireless packet signal. Also, the processes in steps S704 and S710 are performed in a signal section corresponding to the HT long preamble signal HTLTSs that is placed before the DATA symbol in the wireless packet signal. Accordingly, it is possible to complete in a short time period the judgment on which of the wireless packet signals 701 to 708 shown in FIGS. 30 and 31 corresponds to the wireless packet signal being received. This restricts unnecessary operation of the constituent units of the demodulation unit 206a, and prevents the power from being consumed wastefully due to unnecessary operation of the constituent units of the demodulation unit 206a.

Embodiment 8

The following describes Embodiment 8, the eighth embodiment of the present invention, with reference to the attached drawings.

The wireless communication device of Embodiment 8 is obtained by incorporating the method of judging the wireless packet signal of Embodiment 6 into Embodiment 1. Note that, in Embodiment 6, the wireless communication device makes a judgment on a wireless packet signal being received, by using the STS that is attached to the head of the wireless packet signal, while in Embodiment 8, the wireless communication device makes a judgment on a wireless packet signal being received, by using the LTS that follows the STS in the wireless packet signal. Note that, in the following description, LTSs that are transmitted over the primary channel CH2 are referred to as "primary LTSs", and LTSs that are transmitted over the secondary channel CH3 are referred to as "secondary LTSs".

<Structure of Wireless Communication Device>

Figure 37:
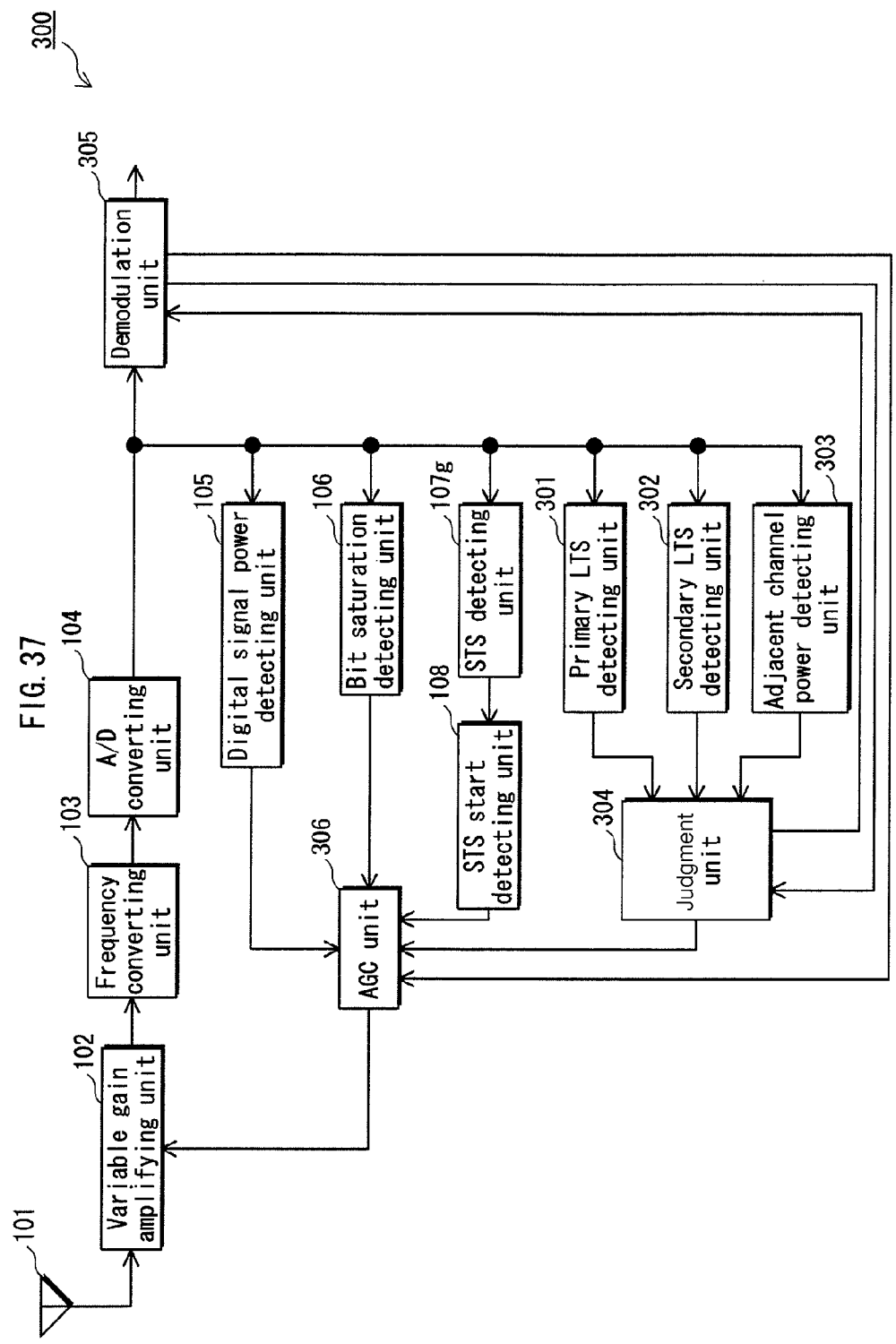
FIG. 37 shows the structure of the wireless communication device in Embodiment 8.

The following explains the structure of a wireless communication device 300 of Embodiment 8 with reference to FIG. 37. FIG. 37 shows the structure of the wireless communication device 300. Note that the structural elements of Embodiment 8 that are substantially the same as the corresponding ones in Embodiment 1 are assigned the same reference numbers as the corresponding ones in Embodiment 1, and description thereof is omitted since description of the corresponding ones in Embodiment 1 is applicable thereto.

The wireless communication device 300 includes the antenna 101, the variable gain amplifying unit 102, the frequency converting unit 103, the A/D converting unit 104, the digital signal power detecting unit 105, the bit saturation detecting unit 106, an STS detecting unit 107g, the STS start detecting unit 108, a primary LTS detecting unit 301, a secondary LTS detecting unit 302, an adjacent channel power detecting unit 303, a judgment unit 304, a demodulation unit 305, and an AGC unit 306.

[STS Detecting Unit 107g]

The STS detecting unit 107g performs a detection process for detecting a primary STS and a secondary STS from the primary channel CH2 and the secondary channel CH3, respectively. Upon detecting at least one of a primary STS and a secondary STS, the STS detecting unit 107a outputs a high-level STS detection signal to the STS start detecting unit 108 for the pulse period.

[Primary LTS Detecting Unit 301]

The primary LTS detecting unit 301 performs a detection process for observing the band of the primary channel CH2 and detecting a primary LTS from the digital baseband signal output from the A/D converting unit 104. Upon detecting a primary LTS, the primary LTS detecting unit 301 outputs a high-level primary LTS detection signal to the judgment unit 304 for the pulse period.

[Secondary LTS Detecting Unit 302]

The secondary LTS detecting unit 302 performs a detection process for observing the band of the secondary channel CH3 and detecting a secondary LTS from the digital baseband signal output from the A/D converting unit 104. Upon detecting a secondary LTS, the secondary LTS detecting unit 302 outputs a high-level primary LTS detection signal to the judgment unit 304 for the pulse period. Note that the primary LTS detecting unit 301 and the secondary LTS detecting unit 302 respectively perform the detection processes for detecting the primary LTS and the secondary LTS, where the detection processes are similar to the process performed by the LTS detecting unit 109.

[Adjacent Channel Power Detecting Unit 303]

The adjacent channel power detecting unit 303 observes the bands of the primary adjacent channel CH1 to detect a value of power of a signal component (primary adjacent channel component) of the digital baseband signal in the bands of the primary adjacent channel CH1. The adjacent channel power detecting unit 303 then compares the power value of the primary adjacent channel component with a component power threshold value. When the power value of the primary adjacent channel component is equal to or larger than the component power threshold value, assuming, that a signal component of the primary adjacent channel CH1 was detected, the adjacent channel power detecting unit 303 outputs a high-level primary adjacent channel detection signal to the judgment unit 304 for the pulse period. Note that the BPF, the Fourier transform, the wavelet transform, or the filter bank may be used as the means for extracting the primary adjacent channel component from the digital baseband signal.

[Judgment Unit 304]

The judgment unit 304 receives the primary LTS detection signal from the primary LTS detecting unit 301, receives the secondary LTS detection signal from the secondary LTS detecting unit 302, receives the primary adjacent channel detection signal from the adjacent channel power detecting unit 303, and receives control information notification signal from the demodulation unit 305.

The judgment unit 304 judges which of the wireless packet signals 601 to 605 shown in FIG. 27 corresponds to the received wireless packet signal, based on the primary LTS detection signal, the secondary LTS detection signal, and the primary adjacent channel detection signal. When it judges that the received wireless packet signal corresponds to the wireless packet signal 601 or 602 that may be the desired packet signal or the interference packet signal, the judgment unit 304 outputs a high-level packet judgment signal to the AGC unit 306 for the pulse period.

When it judges that the received wireless packet signal corresponds to the wireless packet signal 601 or 602 that may be the desired packet signal or the interference packet signal, the judgment unit 304 further judges whether or not the received wireless packet signal 601 or 602 is destined to the wireless communication device itself, based on the destination information included in the control information notification signal.

[Demodulation Unit 305]

The demodulation unit 305 has the function of the demodulation unit 206, and further outputs, for example, the control information notification signal including the destination information to the judgment unit 304. Also, the demodulation unit 305, upon completing demodulation of the wireless packet signal being received, outputs a high-level demodulation completion signal to the AGC unit 306 for the pulse period, and stops operating.

[AGC Unit 306]

The AGC unit 306 sets a predetermined gain value (initial gain value) in the variable gain amplifying unit 102, and performs the gain control of the variable gain amplifying unit 102 based on the digital power value signal input from the digital signal power detecting unit 105. The AGC unit 306 judges whether or not to start the gain control of the variable gain amplifying unit 102, based on the bit saturation detection signal input from the bit saturation detecting unit 106, the STS detection section start signal input from the STS start detecting unit 108, the packet judgment signal input from the judgment unit 304, and the demodulation completion signal input from the demodulation unit 305.

<Operation of Wireless Communication Device>

Figure 38:
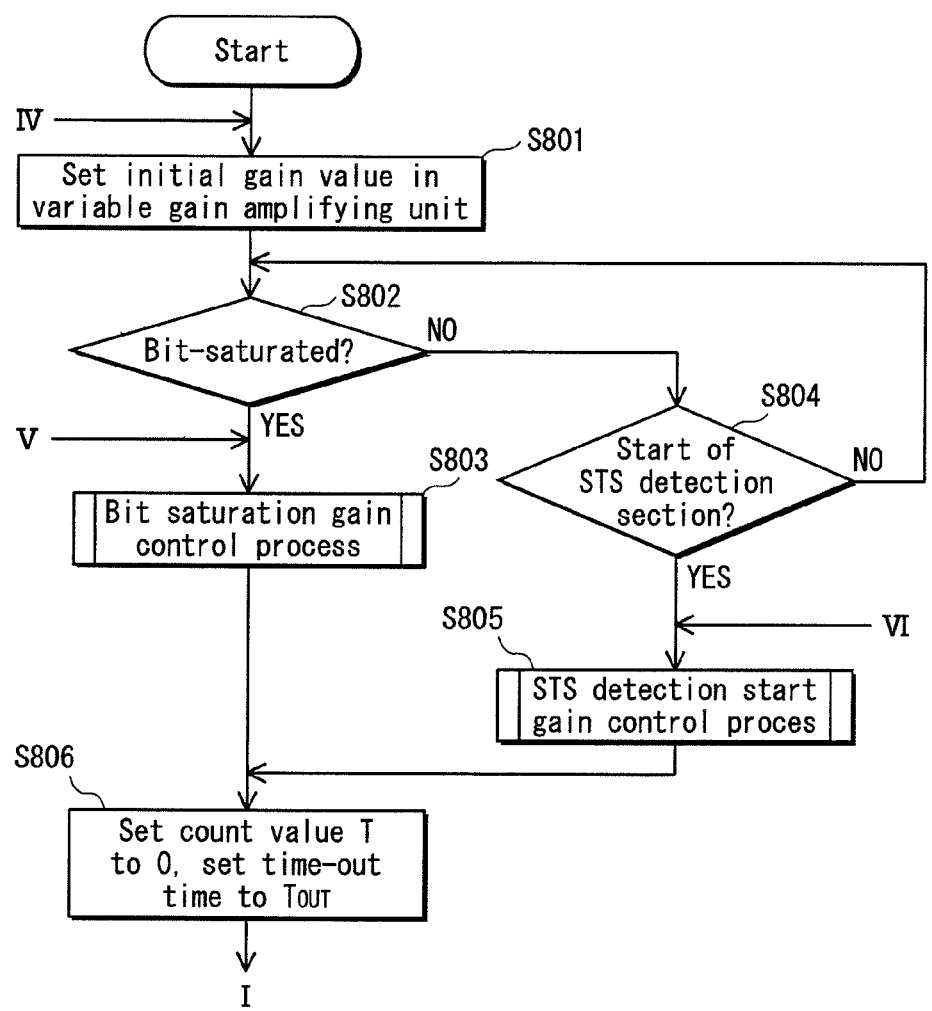
FIG. 38 is a flowchart showing the procedure for the process of judging the wireless packet signal and the gain control process performed by the judgment unit and the AGC unit shown in FIG. 37.
Figure 39:
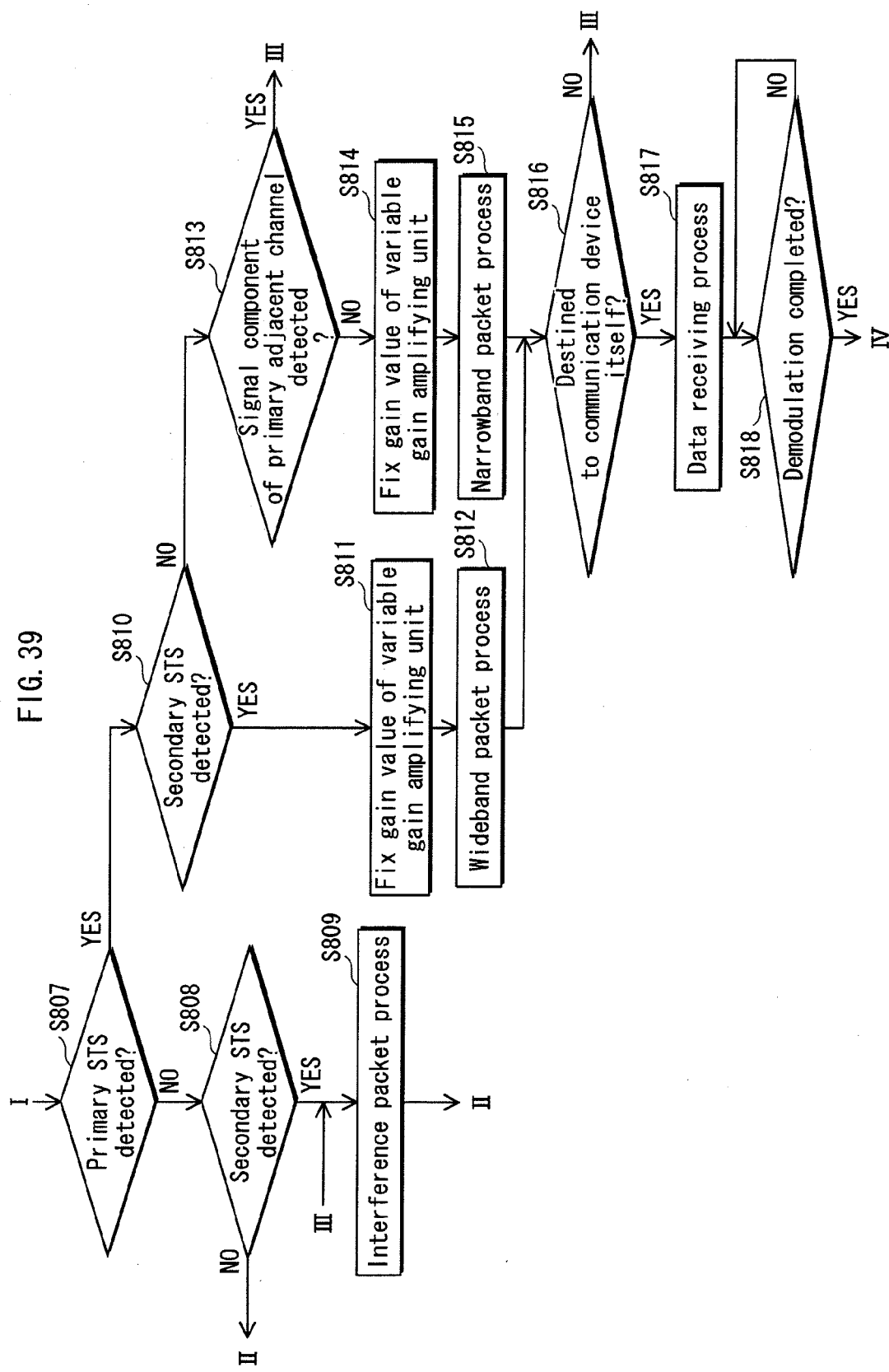
FIG. 39 is a flowchart showing the procedure for the process of judging the wireless packet signal and the gain control process performed by the judgment unit and the AGC unit shown in FIG. 37.
Figure 40:
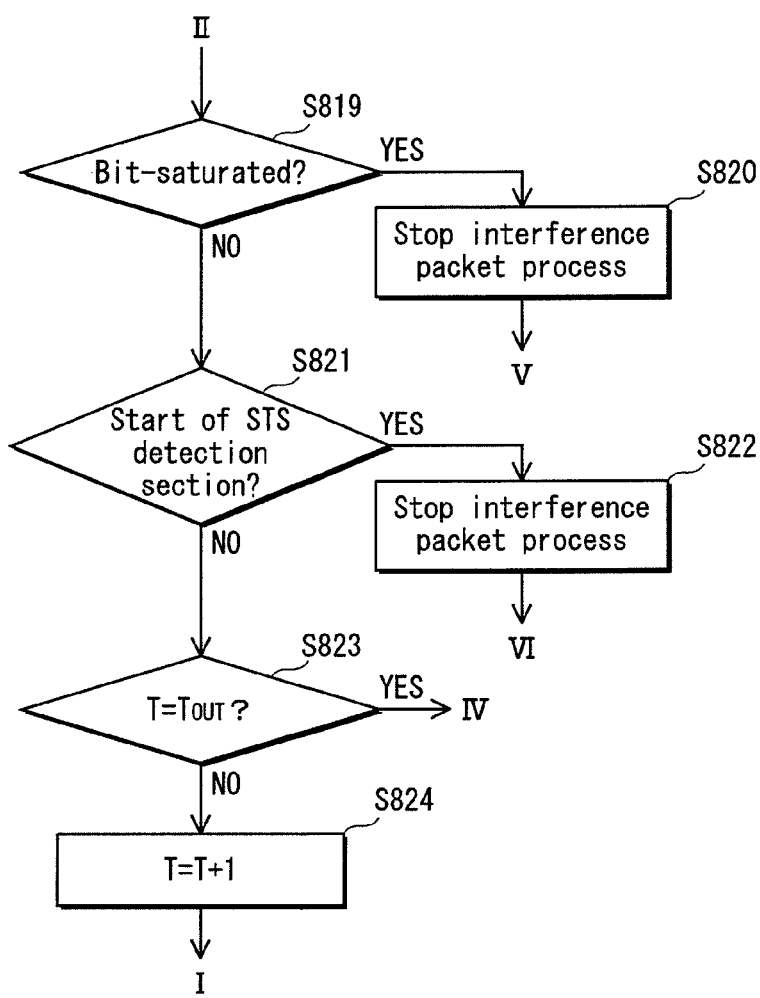
FIG. 40 is a flowchart showing the procedure for the process of judging the wireless packet signal and the gain control process performed by the judgment unit and the AGC unit shown in FIG. 37.

The following describes the process of judging the wireless packet signal and the gain control process performed by the judgment unit 304 and the AGC unit 306 shown in FIG. 37, with reference to FIGS. 38 to 40. FIGS. 38 to 40 are flowcharts showing the procedures of the process of judging the wireless packet signal and the gain control process performed by the judgment unit 304 and the AGC unit 306 shown in FIG. 37.

The AGC unit 306, in steps S801 to S806, performs substantially the same process as in steps S101 to S106 shown in FIG. 6. Note that the bit saturation gain control process performed in step S803 is substantially the same process whose procedures are shown in FIG. 7. The STS detection start gain control process performed in step S805 is substantially the same process whose procedures are shown in FIG. 8.

The judgment unit 304 judges based on the primary LTS detection signal whether or not a primary LTS has been detected in the primary channel CH2 (step S807). Note that, when the primary LTS detection signal has changed from a low level to a high level, the judgment unit 304 judges that a primary LTS has been detected.

When it judges that a primary LTS has not been detected (step S807: NO), the judgment unit 304 judges based on the secondary LTS detection signal whether or not a secondary LTS has been detected in the secondary channel CH3 (step S808). Note that, when the secondary LTS detection signal has changed from a low level to a high level, the judgment unit 304 judges that a secondary LTS has been detected.

When it judges that a secondary LTS has not been detected (step S808: NO), the control goes to step S819.

When it judges that a secondary LTS has been detected (step S808: YES), the judgment unit 304 judges that the wireless packet signal being received is an interference packet signal (the wireless packet signal 603, 604), and instructs the demodulation unit 305 to execute the interference packet process (step S809). Note that, upon receiving the instruction, the demodulation unit 305 executes the interference packet process.

When it judges that a primary LTS has been detected (step S807: YES), the judgment unit 304 judges based on the secondary LTS detection signal whether or not a secondary LTS has been detected in the secondary channel CH3 at substantially the same time as the primary LTS has been detected (step S810). Note that, when the secondary LTS detection signal has changed from a low level to a high level at substantially the same time as the primary LTS detection signal has changed from a low level to a high level, the judgment unit 304 judges that the secondary LTS has been detected at substantially the same time as the primary LTS has been detected.

Note that when the primary LTS and the secondary LTS have the same waveform, the primary LTS and the secondary LTS corresponding to the same packet signal are detected at the same time. However, due to, for example, a delay on the transmission path or a predetermined delay given by the transmission side, the primary LTS and the secondary LTS may be detected at slightly different times. In view of this, a time width is preliminarily set such that it can be assumed that the primary LTS and the secondary LTS have been transmitted at the same time, and when the primary LTS and the secondary LTS are detected within the time width, it is judged that the secondary LTS has been detected at substantially the same time as the primary LTS has been detected.

When it judges that the secondary LTS has been detected at substantially the same time as the primary LTS has been detected (step S810: YES), the judgment unit 304 judges that the wireless packet signal being received is a wideband packet signal (the wireless packet signal 602) that may be a desired packet signal or an interference packet signal, and outputs a high-level packet judgment signal to the AGC unit 306 for the pulse period. The AGC unit 306, when the packet judgment signal it is receiving changes from a low level to a high level, fixes the gain value of the variable gain amplifying unit 102 (step S811). The judgment unit 304 instructs the demodulation unit 305 to execute the wideband packet process (step S812). Note that, upon receiving the instruction, the demodulation unit 305 executes the wideband packet process. During the execution of the wideband packet process, a control information notification signal including the destination information is output from the demodulation unit 305 to the judgment unit 304.

When it judges that the secondary LTS has not been detected at substantially the same time as the primary LTS has been detected (step S810: NO), the judgment unit 304 judges, based on the primary adjacent channel detection signal, whether or not a signal component of the primary adjacent channel CH1 had been detected in a predetermined period before the primary LTS was detected (step S813). Note that, when the primary adjacent channel detection signal had changed from a low level to a high level in a predetermined period before the primary LTS detection signal changed from a low level to a high level, the judgment unit 304 judges that the signal component of the primary adjacent channel CH1 had been detected in a predetermined period before the primary LTS was detected.

Note that, when the STS attached at the head of the wireless packet signal reaches the wireless communication device itself, a signal component of the primary adjacent channel CH1 is detected. Therefore, in the same wireless packet signal, a signal component of the primary adjacent channel CH1 is detected earlier than the LTS by the amount of time of the signal section corresponding to the plurality of STSs. Note that the predetermined period used as described above may be set by taking in consideration the amount of time of the signal section corresponding to the plurality of STSs, the delay on the transmission path and the like.

When it judges that the signal component of the primary adjacent channel CH1 had been detected in the predetermined period before the primary LTS was detected (step S813: YES), the judgment unit 304 judges that the wireless packet signal being received is an interference packet signal (the wireless packet signal 605), and instructs the demodulation unit 305 to execute the interference packet process (step S809). Note that, upon receiving the instruction, the demodulation unit 305 performs the interference packet process.

When it judges that the signal component of the primary adjacent channel CH1 had not been detected in the predetermined period before the primary LTS was detected (step S813: NO), the judgment unit 304 judges that the wireless packet signal being received is a narrowband packet signal (the wireless packet signal 601) that may be a desired packet signal or an interference packet signal, and outputs a high-level packet judgment signal to the AGC unit 306. The AGC unit 306, when the packet judgment signal it is receiving changes from a low level to a high level, fixes the gain value of the variable gain amplifying unit 102 (step S814). The judgment unit 304 instructs the demodulation unit 305 to execute the narrowband packet process (step S815). Upon receiving the instruction, the demodulation unit 305 performs the narrowband packet process. During the execution of the narrowband packet process, a control information notification signal including the destination information is output from the demodulation unit 305 to the judgment unit 304.

When the destination information is extracted from the decoded data by the demodulation unit 305, the judgment unit 304 judges, based on the destination information included in the control information notification signal input from the demodulation unit 305, whether or not the wireless packet signal being received is a desired packet signal (step S816).

When it judges that the wireless packet signal being received is not a desired packet signal, that is, it is an interference packet signal (step S816: NO), the judgment unit 304 instructs the demodulation unit 305 to execute the interference packet process (step S809). Note that, upon receiving the instruction, the demodulation unit 305 performs the interference packet process.

When it judges that the wireless packet signal being received is a desired packet signal (step S816: YES), the judgment unit 304 instructs the demodulation unit 305 to execute the data receiving process (step S817). Note that, upon receiving the instruction, the demodulation unit 305 performs the data receiving process. During the execution of the data receiving process, a demodulation completion signal is output from the demodulation unit 305 to the AGC unit 306.

The AGC unit 306 judges based on the demodulation completion signal whether or not the demodulation of the wireless packet signal is completed (step S818). Note that when the demodulation completion signal has changed from a low level to a high level, the AGC unit 306 judges that the demodulation of the wireless packet signal is completed.

The AGC unit 306 continues to perform the process of step S818 while it judges that the demodulation of the wireless packet signal is not completed (step S818: NO). On the other hand, when it judges that the demodulation of the wireless packet signal is completed (step S818: YES), the AGC unit 306 goes to step S801.

The AGC unit 306 judges based on the bit saturation detection signal whether or not the digital baseband signal output from the A/D converting unit 104 has been bit-saturated (step S819). When it judges that the digital baseband signal has been bit-saturated (step S819: YES), the AGC unit 306 instructs the demodulation unit 305 to stop the interference packet process (step S820), and goes to step S803. Note that, if the demodulation unit 305 receives the instruction to stop the interference packet process while it is executing the interference packet process, the demodulation unit 305 stops executing the interference packet process.

When it judges that the digital baseband signal has not been bit-saturated (step S819: NO), the AGC unit 306 judges based on the STS detection section start signal whether or not the start of the STS detection section has been detected (step S821). When it judges that the start of the STS detection section has been detected (step S821: YES), the AGC unit 306 instructs the demodulation unit 305 to stop the interference packet process (step S822), and goes to step S805. Note that, if the demodulation unit 305 receives the instruction to stop the interference packet process while it is executing the interference packet process, the demodulation unit 305 stops executing the interference packet process.

When it judges that the start of the STS detection section has not been detected (step S821: NO), the AGC unit 306 judges whether or not the count value T of the time-measuring counter has reached the time-out time $T_{OUT}$ (step S823). When it judges that the count value T has not reached the time-out time $T_{OUT}$ (step S823: NO), the AGC unit 306 counts up the count value T of the time-measuring counter by "1" (step S824), and goes to step S807. On the other hand, when the AGC unit 306 judges that the count value T has reached the time-out time $T_{OUT}$ (step S823: YES), the control goes to step S801.

<<Supplementary Notes>>

The present invention is not limited to the above-described embodiments, but may be modified as follows, for example.

(1) In the wireless communication device of Embodiments 1 and 8, the gain control times number is "1" in the STS detection start gain control process, and is "2" in the bit saturation gain control process. However, not limited to this, for example, the gain control times number may be "M" (M is an integer of 1 or more) in the STS detection start gain control process, and may be "N" (N is an integer larger than M) in the bit saturation gain control process.

Also, in the wireless communication device of Embodiments 2 to 4, the gain control times number is "1" in the STS detection start gain control process, is "2" in the bit saturation gain control process, and is "2" in the strong input gain control process. However, not limited to this, for example, the gain control times number may be "P" (P is an integer of 1 or more) in the STS detection start gain control process, may be "Q" (Q is an integer larger than P) in the bit saturation gain control process, and may be "R" (R is an integer larger than P) in the strong input gain control process.

Furthermore, in the wireless communication device of Embodiment 5, the gain control time in the STS detection start gain control process "$T_{OUT5}$", and is "$T_{OUT5}+T_{OUT6}$" in the bit saturation gain control process. However, not limited to this, for example, the gain control time in the bit saturation gain control process may be set to any value which is longer than the gain control time in the STS detection start gain control process.

In Embodiments 2 to 4, the gain of the low noise amplifying unit 131 is controlled to either of two gain values. However, not limited to this, the gain of the low noise amplifying unit 131 may be controlled to one of "N" (N being an integer of 3 or more) gain values. In this case, the comparison unit 136 may have (N−1) threshold values, and may determine the gain value to be set in the low noise amplifying unit 131 by comparing the power value of the analog signal indicated by the analog power value signal input from the analog signal power detecting unit 135, with the (N−1) threshold values.

(3) In Embodiments 1 to 5 and 8, the frequency converting units 103 and 132 convert an analog signal in the RF band into an analog baseband signal. However, not limited to this, the frequency converting units 103 and 132 may convert an analog signal in the RF band into an analog signal in a frequency band suited for the signal processing, such as an analog signal in the IF (Intermediate Frequency) band. Note that in Embodiments 6 and 7, analog signals input to the A/D converting unit 201 may not necessary be analog baseband signal, but may be analog signals in any frequency bands that are suited for the signal processing.

(4) The HPF function unit 151 described in Embodiment 4 may be applied to the wireless communication device 100b described in Embodiment 3.

(5) The gain control of the low noise amplifying unit 131 and the variable gain amplifying unit 133 and the control for switching the operation mode of the HPF function unit 151 that are performed by the AGC unit 111c in Embodiment 4 may be performed as follows.

When it is judged affirmatively in step S414 (step S414: YES), the AGC unit 111c switches the operation mode of the HPF function unit 151 to the HPF function valid mode, and then goes to step S405. When it is judged affirmatively in step S415 (step S415: YES), the AGC unit 111c switches the operation mode of the HPF function unit 151 to the HPF function valid mode, and then goes to step S408. When it is judged affirmatively in step S416 (step S416: YES), the AGC unit 111c switches the operation mode of the HPF function unit 151 to the HPF function valid mode, and then goes to step S410.

(6) The gain control of the variable gain amplifying unit 133 performed by the AGC units 111a, 111b, and 111c in the STS detection start gain control process, the bit saturation gain control process, and the strong input gain control process in Embodiments 2 to 4 may be realized by the process of repeating, during the gain control time, calculating a gain value to be set in the variable gain amplifying unit 133 and setting the calculated gain value in the variable gain amplifying unit 133 (see steps S551 to S556 shown in FIG. 23). Note that, in this case, it is preferable that the gain control times in the bit saturation gain control process and the strong input gain control process are respectively longer than the gain control time in the STS detection start gain control process.

Also, the gain control of the variable gain amplifying unit 102 performed by the AGC unit 306 in the STS detection start gain control process and the bit saturation gain control process in Embodiment 8 may be realized by the process of repeating, during the gain control time, calculating a gain value to be set in the variable gain amplifying unit 102 and setting the calculated gain value in the variable gain amplifying unit 102 (see steps S551 to S556 shown in FIG. 23). Note that, in this case, it is preferable that the gain control time in the bit saturation gain control process is longer than the gain control time in the STS detection start gain control process.

(7) The STS detecting unit 107 described in Embodiments 1 to 5 realizes the detection of STS by performing a cross-correlation calculation between the digital baseband signal and the reference signal based on the STS. However, the present invention is not limited to this. For example, the STS detecting unit 107 may realize the detection of STS by performing an autocorrelation calculation between the digital baseband signal input from the A/D converting unit 104 and the digital baseband signal having been delayed by the symbol time $T_{STS}$.

Also, the LTS detecting unit 109 described in Embodiments 1 to 5 realizes the detection of LTS by performing a cross-correlation calculation between the digital baseband signal and the reference signal based on the LTS. However, the present invention is not limited to this. For example, the LTS detecting unit 109 may realize the detection of LTS by performing an autocorrelation calculation between the digital baseband signal input from the A/D converting unit 104 and the digital baseband signal having been delayed by the symbol time of the LTS.

The above-described modification is also applicable to the STS detection process and the LTS detection process in the other embodiments.

The wireless communication devices 200 and 200a in Embodiments 6 and 7 judge the wireless packet signal by using the primary STS and the secondary STS. However, not limited to this, for example, the primary LTS and the secondary LTS may be used to judge the wireless packet signal.

(9) In Embodiments 6 and 7, it is presumed that each wireless packet signal has any of the frame formats in the mixed mode shown in FIGS. 26A and 26B, and it is judged which of the frame formats in the mixed mode is the frame format of the judgment-target wireless packet signal. However, the present invention is not limited to this. A wireless packet signal may have a frame format in the legacy mode shown in FIG. 2, or a frame format in the green field mode shown in FIGS. 41A and 41B. Thus, it may be judged which of the frame formats in the mixed mode and the legacy mode is the frame format of the judgment-target wireless packet signal, or which of the frame formats in the mixed mode and the green field mode is the frame format of the judgment-target wireless packet signal. This also applies to Embodiment 8.

Here, a brief description is given of the frame formats in the green field mode.

The frame format of the green field falls in the frame format shown in FIG. 41A and the frame format shown in FIG. 41B. The frame format shown in FIG. 41A is used for the wireless packet signal that is transmitted over one frequency channel (the frequency channel A in this example), and the frame format shown in FIG. 41B is used for the wireless packet signal that is transmitted over a wideband frequency channel that has been made wideband by bonding two frequency channels (the frequency channels A and B in this example).

A wireless packet signal P30 having the frame format shown in FIG. 41A includes, at the head thereof, a short preamble signal STSs, which is followed by an HT long preamble signal HTLTSs. In the wireless packet signal P30, the HT long preamble signal HTLTSs is followed by an HTSIGNAL symbol, an HT long preamble signal HTLTSs, and a DATA symbol. Note that the number of HTLTSs in the HT long preamble signal HTLTSs that follows the HTSIGNAL symbol is smaller by one than the number of MIMO channels. Note that there are one or more DATA symbols, and the destination information and the source information are transferred by the DATA symbols.

A wireless packet signal P35 having the frame format shown in FIG. 41B includes, in each of the frequency channels A and B, the short preamble signal STSs. Following this, the wireless packet signal P35 includes, in a wideband frequency channel that has been made wideband by bonding the two frequency channels A and B, the HT long preamble signal HTLTSs, the HTSIGNAL symbol, the HT long preamble signal HTLTSs, and the DATA symbol. Note that the number of HTLTSs in the HT long preamble signal HTLTSs that follows the HTSIGNAL symbol is smaller by one than the number of MIMO channels. Note that there are one or more DATA symbols, and the destination information and the source information are transferred by the DATA symbols.

(10) The procedure of the wireless packet signal judgment process described in Embodiment 8 (steps S807 to S817) may be applied to Embodiments 2 to 4. The following shows one example of such.

In Embodiment 2, the wireless communication device may go to step S807 after performing step S210. In Embodiment 3, the wireless communication device may go to step S807 after performing step S310. In Embodiment 4, the wireless communication device may go to step S807 after performing step S412. Also, when the judgment in step S808 results in the negative (step S808: NO), the wireless communication device may go to step S212 in Embodiment 2, go to step S312 in Embodiment 3, and go to step S414 in Embodiment 4. Also, after step S809, the wireless communication device may go to step S212 in Embodiment 2, go to step S312 in Embodiment 3, and go to step S414 in Embodiment 4. Between step S811 and S812, and between step S814 and S815, the wireless communication device performs the process of fixing the gain value of the low noise amplifying unit 131.

In Embodiment 8, the processing flow of the wireless packet signal judgment process may be replaced with the processing flow of the wireless packet signal judgment process of Embodiment 7. The following describes one example of such.

After step S806, the wireless communication device may go to step S701. Also, when the judgment in step S702 results in the negative (step S702: NO), the wireless communication device may go to step S819. Further, after step S705, the wireless communication device may go to step S801. Further, after step S712, the wireless communication device may go to step S818.

Furthermore, when the judgment in step S706 results in the affirmative (step S706: YES), the wireless communication device fixes the gain value of the variable gain amplifying unit, and goes to step S707. Also, when the judgment in step S708 results in the negative (step S708: NO), the wireless communication device fixes the gain value of the variable gain amplifying unit, and goes to step S709.

Note that in this modification, the target of the judgment in step S701 is set to the primary LTS in place of the primary STS, and the target of the judgment in steps S706 and S708 is set to the secondary LTS in place of the secondary STS.

Also, in a similar manner as in step S813, it is judged in step S703 whether or not a signal component of the secondary adjacent channel had been detected in a predetermined period before the secondary LTS was detected, and it is judged in step S708 whether or not a signal component of the primary adjacent channel had been detected in a predetermined period before the primary LTS was detected.

The processing flow of the wireless packet signal judgment process described in Embodiment 7 may be applied to Embodiments 2 to 5. The following describes one example of such.

For Embodiment 5, the processing flow of the wireless packet signal judgment process of Embodiment 7 is replaced with the processing flow of the wireless packet signal judgment process described in Embodiment 8 (steps S807 to S817), as described above, and then the bit saturation gain control process and the STS detection start gain control process are performed according to the procedures shown in FIGS. 22 and 23.

For Embodiment 2, the process of steps S211, S217, and S218 is replaces with the judgment process shown in FIG. 36. The wireless communication device goes to step S212 when the judgment in step S702 results in the negative (step S702: NO), or after performing the process of step S705. Also, the wireless communication device fixes the gain value of the low noise amplifying unit 131 and fixes the gain value of the variable gain amplifying unit 133 before the wideband packet process is performed; and the narrowband packet process is performed. Further, the wireless communication device goes to step S219 after step S712. Further, the wireless communication device stops the interference packet process and goes to the next process when the judgment in step S212 results in the affirmative (step S212: YES), or when the judgment in step S213 results in the affirmative (step S213: YES), or when the judgment in step S214 results in the affirmative (step S214: YES).

For Embodiment 3, the process of steps S311, S316, and S317 is replaces with the judgment process shown in FIG. 36. The wireless communication device goes to step S312 when the judgment in step S702 results in the negative (step S702: NO), or after performing the process of step S705. Also, the wireless communication device fixes the gain value of the low noise amplifying unit 131 and fixes the gain value of the variable gain amplifying unit 133 before the wideband packet process is performed; and the narrowband packet process is performed. Further, the wireless communication device goes to step S318 after step S712. Further, the wireless communication device stops the interference packet process and goes to the next process when the judgment in step S312 results in the affirmative (step S312: YES), or when the judgment in step S313 results in the affirmative (step S313: YES).

For Embodiment 4, the process of steps S413, S419, and S420 is replaces with the judgment process shown in FIG. 36. The wireless communication device goes to step S414 when the judgment in step S702 results in the negative (step S702: NO), or after performing the process of step S705. Also, the wireless communication device fixes the gain value of the low noise amplifying unit 131 and fixes the gain value of the variable gain amplifying unit 133 before the wideband packet process is performed; and the narrowband packet process is performed. Further, the wireless communication device goes to step S421 after step S712. Further, the wireless communication device stops the interference packet process and goes to the next process when the judgment in step S414 results in the affirmative (step S414: YES), or when the judgment in step S415 results in the affirmative (step S415: YES), or when the judgment in step S416 results in the affirmative (step S416: YES).

Note that in the application of the wireless packet signal judgment process of Embodiment 7 to Embodiments 2 to 4, the target of the judgment in step S701 is set to the primary LTS in place of the primary STS, and the target of the judgment in steps S706 and S708 is set to the secondary LTS in place of the secondary STS. Also, in a similar manner as in step S813, it is judged in step S703 whether or not a signal component of the secondary adjacent channel had been detected in a predetermined period before the secondary LTS was detected, and it is judged in step S708 whether or not a signal component of the primary adjacent channel had been detected in a predetermined period before the primary LTS was detected.

The wireless packet signal judgment process described in Embodiment 6 or 7 may be used to judge which of a plurality of wireless packet signals (in Embodiment 6, wireless packet signals 601-605, and in Embodiment 7, wireless packet signals 701-708) corresponds to a wireless packet signal being received.

(13) In Embodiments 6 to 8, the demodulation units 206, 206a, and 305 have the function of measuring the amount of characteristics of interference signals. However, the present invention is not limited to this. The demodulation units 206, 206a, and 305 may not have the function of measuring the amount of characteristics of interference signals. In this case, when it is judged that a wireless packet signal is an interference signal, the operation of all functional units constituting the demodulation units 206, 206a, and 305 may be stopped.

(14) In Embodiments 6 and 7, the wireless communication devices 200 and 200a perform the wireless packet signal judgment process, by using the digital baseband signal output from the A/D converting unit 201. However, not limited to this, the wireless communication devices may perform the wireless packet signal judgment process by using an analog signal that is suited for processing signals in the RF band or the IF band, for example.

(15) In Embodiment 8, when the judgment in step S808 results in the negative (step S808: NO), the control goes to step S819. However, not limited to this, even when the judgment in step S808 results in the negative (step S808: NO), the demodulation unit 305 may be caused to perform the interference packet process, and then the control may go to step S819. With this structure, after the gain control is performed in steps S803 and S805, it is possible to measure the amount of characteristics of interference signals that derive from other wireless communication systems and for which the LTS is not detected in the primary channel and the secondary channel, and suppress the interference signals later when a desired signal is received. Note that this modification is also applicable to the modification described in (11) above and Embodiments 6 and 7.

(16) The wireless communication devices described in Embodiments 1 to 8 are applicable to the frame format that includes a known preamble signal on the receiving side, or to the frame format that includes a known first preamble signal a known second preamble signal on the receiving side.

(17) The wireless communication devices described in Embodiments 1 to 8 are applicable to various types of wireless communication systems such as wireless communication systems conforming to the IEEE 802.11a standard or the IEEE 802.11n standard.

Also, the wireless communication devices described in Embodiments 1 to 8 are applicable to various types of access methods such as the CSMA (Carrier Sense Multiple Access), the TDMA (Time Division Multiple Access), the CDMA (Code Division Multiple Access), and the SDMA (Space Division Multiple Access).

(18) Each wireless communication device described in the embodiments above may be achieved, typically, in an LSI (Large Scale Integration) being an integrated circuit. Each circuit may be achieved separately as one chip. Alternatively, all or part of the circuits may be achieved as one chip.

Note that, although the term LSI is used here, it may be called IC (Integrated Circuit), system LSI, super LSI, ultra LSI or the like, depending on the level of integration.

Also, the integrated circuit may not necessarily be achieved by the LSI, but may be achieved by the dedicated circuit or the general-purpose processor. It is also possible to use the FPGA (Field Programmable Gate Array), with which a programming is available after the LSI is manufactured, or the reconfigurable processor that can re-configure the connection or setting of the circuit cells within the LSI.

Furthermore, a technology for an integrated circuit that replaces the LSI may appear in the near future as the semiconductor technology improves or branches into other technologies. In that case, the new technology may be incorporated into the integration of the functional blocks constituting the present invention as described above. Such possible technologies include biotechnology.

Industrial Applicability

The present invention can be used as a wireless communication device that receives a wireless packet signal whose head is attached with a preamble signal.

The invention claimed is:

1. A receiving device comprising: a variable gain amplifying unit operable to vary a gain based on a gain control value and operable to amplify an input analog signal; an analog-to-digital converting unit operable to convert an amplified analog signal output from the variable gain amplifying unit into a digital signal; a digital signal judging unit operable to judge whether or not the digital signal output from the analog-to-digital converting unit is outside a predetermined range; a preamble start detecting unit operable to detect, from the digital signal output from the analog-to-digital converting unit, a start of a section as a preamble signal which is attached to a head of a wireless packet signal; and a gain control unit operable to control the gain of the variable gain amplifying unit by calculating a gain value to be set in the variable gain amplifying unit and by setting the calculated gain value in the variable gain amplifying unit in accordance with the digital signal output from the analog-to-digital converting unit, wherein the gain control unit controls the gain of the variable gain amplifying unit by performing a first gain control process in which the gain control unit, during a first predetermined time period, repeatedly performs the calculating of the gain value to be set and the setting of the calculated gain value, when the digital signal judging unit judges that the digital signal output from the analog-to-digital converting unit is outside the predetermined range, wherein the gain control unit controls the gain of the variable gain amplifying unit by performing a second gain control process in which the gain control unit, during a second predetermined time period which is shorter than the first predetermined time period, repeatedly performs the calculating of the gain value to be set and the setting of the calculated gain value, when the digital signal judging unit judges that the digital signal output from the analog-to-digital converting unit is not outside the predetermine range and the preamble start detecting unit detects the start of the section as the preamble signal, and wherein the first gain control process and the second gain control process are performed for each packet in the wireless packet signal.

2. The receiving device of claim 1, wherein in the second gain control process, the gain control unit performs the calculating of the gain value to be set and the setting of the calculated gain value M times during the second predetermined time period, M being an integer of 1 or more, and in the first gain control process, the gain control unit performs the calculating of the gain value to be set and the setting of the calculated gain value N times during the first predetermined time period, N being an integer larger than M.

3. The receiving device of claim 1, further comprising a preamble detecting unit operable to detect, from the digital signal output from the analog-to-digital converting unit, a first preamble signal which is attached to the wireless packet signal at a position after the preamble signal, wherein the gain control unit controls the gain of the variable gain amplifying unit again when, during an interval after performing either the first gain control process or the second gain control process before the preamble detecting unit detects the first preamble signal, (i) the digital signal judging unit judges that the digital signal output from the analog-to-digital converting unit is outside the predetermined range, or (ii) the preamble start detecting unit detects the start of the section as the preamble signal.

4. The receiving device of claim 1, further comprising a preamble detecting unit operable to detect, from the digital signal output from the analog-to-digital converting unit, a first preamble signal which is attached to the wireless packet signal at a position after the preamble signal, wherein the gain control unit sets a predetermined gain value in the variable gain amplifying unit when the preamble detecting unit has not detected the first preamble signal during a predetermined time period after the gain control unit performs the first gain control process or the second gain control process.

5. The receiving device of claim 1, further comprising: a first variable gain amplifying unit varying a first gain depending on a first gain control value and operable to amplify an input first analog signal having a variable gain value and to output the amplified input first analog signal as the analog signal to the variable gain amplifying unit; and a strong input judging unit operable to judge whether or not the input first analog signal is a strong input having a value of power that exceeds a predetermined power value, wherein the gain control unit further controls the first gain of the first variable gain amplifying unit in accordance with the first analog signal, when the strong input judging unit judges that the input first analog signal is the strong input, the gain control unit controls the first gain of the first variable gain amplifying unit so that the gain value of the first variable gain amplifying unit becomes smaller, and the gain control unit controls the gain of the variable gain amplifying unit by performing a third gain control process, which is different from the second gain control process and in which the gain control unit, during a third predetermined time period, repeatedly performs the calculating of the gain value to be set and the setting of the calculated gain value, when the strong input judging unit judges that the input first analog signal is the strong input.

6. The receiving device of claim 5, wherein in the second gain control process, the gain control unit performs the calculating of the gain value to be set and the setting of the calculated gain value P times during the second predetermined time period, P being an integer of 1 or more, in the first gain control process, the gain control unit performs the calculating of the gain value to be set and the setting of the calculated gain value Q times during the first predetermined time period, Q being an integer larger than P, and in the third gain control process, the gain control unit performs the calculating of the gain value to be set and the setting of the calculated gain value R times during the third predetermined time period, R being an integer larger than P.

7. The receiving device of claim 5, further comprising
a preamble detecting unit operable to detect, from the digital signal output from the analog-to-digital converting unit, a first preamble signal which is attached to the wireless packet signal at a position after the preamble signal, wherein
the gain control unit controls the gain of the variable gain amplifying unit again when, during an interval after performing any of the first gain control process, the second gain control process, and the third gain control process before the preamble detecting unit detects the first preamble signal, (i) the digital signal judging unit judges that the digital signal output from the analog-to-digital converting unit is outside the predetermined range, (ii) the preamble start detecting unit detects the start of the section as the preamble signal, or (iii) the strong input judging unit judges that the input first analog signal is the strong input.

8. The receiving device of claim 5, further comprising
a preamble detecting unit operable to detect, from the digital signal output from the analog-to-digital converting unit, a first preamble signal which is attached to the wireless packet signal at a position after the preamble signal, wherein
the gain control unit sets a predetermined gain value in the variable gain amplifying unit when the preamble detecting unit has not detected the first preamble signal during a predetermined time period after the gain control unit performs any of the first gain control process, the second gain control process, and the third gain control process.

9. The receiving device of claim 5, further comprising
a filter unit operable to be switched by the gain control unit between: (i) a first operation mode in which the filter unit removes a low-frequency component including a direct current component from the amplified first analog signal output from the first variable gain amplifying unit to obtain a first analog signal after the removal of the low-frequency component, and outputs the first analog signal after the removal as the analog signal to the variable gain amplifying unit; and (ii) a second operation mode in which the filter unit outputs the amplified first analog signal output from the first variable gain amplifying unit as the analog signal to the variable gain amplifying unit, wherein the gain control unit sets an operation mode of the filter unit to the first operation mode, and after the gain control unit performs any of the first gain control process, the second gain control process, and the third gain control process, switches the operation mode of the filter unit from the first operation mode to the second operation mode.

10. The receiving device of claim 1, further comprising:
a first preamble detecting unit operable to detect, in a first frequency channel among a plurality of frequency channels, from the digital signal output from the analog-to-digital converting unit, a first preamble signal which is attached to the wireless packet signal at a position after the preamble signal;
a second preamble detecting unit operable to detect, in a second frequency channel which is one of two frequency channels adjacent to the first frequency channel, the first preamble signal from the digital signal output from the analog-to-digital converting unit;
an adjacent power value detecting unit operable to detect a power value of a signal component in a third frequency channel which is another of the two frequency channels adjacent to the first frequency channel, in accordance with the digital signal output from the analog-to-digital converting unit; and
a judging unit operable to judge whether or not the digital signal output from the analog-to-digital converting unit is a digital signal of an interference signal, in accordance with a detection result of the first preamble detecting unit, a detection result of the second preamble detecting unit, and a detection result of the adjacent power value detecting unit.

11. The receiving device of claim 10, wherein the gain control unit fixes the gain value of the variable gain amplifying unit when the judging unit judges that the digital signal output from the analog-to-digital converting unit is not the digital signal of the interference signal.

12. The receiving device of claim 10, further comprising
a destination information extracting unit operable to extract destination information indicating a destination, from the digital signal output from the analog-to-digital converting unit, wherein
the judging unit further judges whether or not the digital signal output from the analog-to-digital converting unit is the digital signal of the interference signal, in accordance with the destination information extracted by the destination information extracting unit.

13. The receiving device of claim 10, wherein
the adjacent power value detecting unit further detects a power value of a signal component in a fourth frequency channel which is one of two frequency channels adjacent to the second frequency channel and is not the first frequency channel, in accordance with the digital signal output from the analog-to-digital converting unit,
the receiving device further comprises an out-of-band subcarrier detecting unit operable to detect, in accordance with the digital signal output from the analog-to-digital converting unit, whether or not a subcarrier is present in a guard band of the first frequency channel, and whether or not a subcarrier is present in a guard band of the second frequency channel, and
the judging unit makes the judgment on whether or not the digital signal output from the analog-to-digital converting unit is the digital signal of the interference signal, in accordance with a detection result of the first preamble detecting unit, a detection result of the second preamble detecting unit, a detection result of the adjacent power value detecting unit, and a detection result of the out-of-band subcarrier detecting unit.

14. A receiving method for use in a receiving device that includes a variable gain amplifying unit varying a gain based on a gain control value and amplifying an input analog signal, an analog-to-digital converting unit converting an amplified analog signal output from the variable gain amplifying unit into a digital signal, and a gain control unit controlling the gain of the variable gain amplifying unit by calculating a gain value to be set in the variable gain amplifying unit and by setting the calculated gain value in the variable gain amplifying unit in accordance with the digital signal output from the analog-to-digital converting unit, the receiving method comprising: judging whether or not the digital signal output from the analog-to-digital converting unit is outside a predetermined range; detecting, from the digital signal output from the analog-to-digital converting unit, a start of a section as a preamble signal which is attached to a head of a wireless packet signal; causing the gain control unit to control the gain of the variable gain amplifying unit by performing a first gain control process in which the gain control unit, during a first predetermined time period, repeatedly performs the calculating of the gain value to be set and the setting of the calculated gain value when the judging judges that the digital signal output from the analog-to-digital converting unit is outside the predetermined range; and causing the gain control unit to control the gain of the variable gain amplifying unit by performing a second gain control process in which the gain control unit, during a second predetermined time period which is shorter than the first predetermined time period, repeatedly performs the calculating of the gain value to be set and the setting of the calculated gain value, when the judging judges that the digital signal output from the analog-to-digital converting unit is not outside the predetermined range and the detecting of the start of the section detects the start of the section as the preamble signal, wherein the first gain control process and the second gain control process are performed for each packet in the wireless packet signal.

* * * * *